(12) United States Patent
Tahira et al.

(10) Patent No.: US 8,932,666 B2
(45) Date of Patent: Jan. 13, 2015

(54) METHOD AND APPARATUS FOR MANUFACTURING ACTIVE-MATRIX ORGANIC EL DISPLAY, ACTIVE MATRIX ORGANIC EL DISPLAY, METHOD FOR MANUFACTURING LIQUID CRYSTAL ARRAY, LIQUID CRYSTAL ARRAY, METHOD AND APPARATUS FOR MANUFACTURING COLOR FILTER SUBSTRATE, AND COLOR FILTER SUBSTRATE

(75) Inventors: Toshio Tahira, Tenri (JP); Yasuo Nishi, Hino (JP); Kazuhiro Murata, Tsukuba (JP); Hiroshi Yokoyama, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 1683 days.

(21) Appl. No.: 10/529,076

(22) PCT Filed: Sep. 24, 2003

(86) PCT No.: PCT/JP03/12124
§ 371 (c)(1),
(2), (4) Date: Oct. 21, 2005

(87) PCT Pub. No.: WO2004/030417
PCT Pub. Date: Apr. 8, 2004

(65) Prior Publication Data
US 2006/0125363 A1 Jun. 15, 2006

(30) Foreign Application Priority Data

Sep. 24, 2002 (JP) .................. 2002-278217
Sep. 24, 2002 (JP) .................. 2002-278221
Sep. 24, 2002 (JP) .................. 2002-281828

(51) Int. Cl.
B05D 5/06 (2006.01)
H05B 33/10 (2006.01)
(Continued)

(52) U.S. Cl.
CPC . H05B 33/10 (2013.01); B41J 2/06 (2013.01); H01L 51/0005 (2013.01); B41J 2202/09 (2013.01); H01L 27/3244 (2013.01)
USPC .......................................... 427/66

(58) Field of Classification Search
CPC ............. B41J 2/035; H01J 9/22; H01J 9/225; H01J 9/227; H01J 9/2272
See application file for complete search history.

(56) References Cited

U.S. PATENT DOCUMENTS 5,473,450 A 12/1995 Yamada et al.
5,583,675 A 12/1996 Yamada et al.
(Continued)

FOREIGN PATENT DOCUMENTS

CN 1106929 A 8/1995
CN 1358626 A 7/2002
(Continued)

*Primary Examiner* — Michael Cleveland
*Assistant Examiner* — Joel Horning
(74) *Attorney, Agent, or Firm* — Edwards Wildman Palmer LLP; David G. Conlin; Steven M. Jensen

(57) ABSTRACT

A method is for producing an active matrix organic EL display element by an inkjet method to eject droplets (12) of a liquid via an ejection hole of a nozzle so as to form an organic EL layer. The liquid contains an organic EL layer material. An electrostatic attraction type inkjet apparatus (15) is used whose ejection hole (1b) has a diameter smaller than a diameter of the droplets (12). The droplets are ejected from the nozzle of the electrostatic attraction type inkjet apparatus (15) in such a manner that each of the droplets is 1 pl or less in amount. With this arrangement, the landed droplet dries quickly, and movement of the landed droplet is restricted. This makes it possible to form an organic EL layer accurately with low cost.

4 Claims, 34 Drawing Sheets

(51) Int. Cl.
*B41J 2/06* (2006.01)
*H01L 51/00* (2006.01)
*H01L 27/32* (2006.01)

(56) References Cited

U.S. PATENT DOCUMENTS

| | | | |
|---|---|---|---|
| 5,612,803 A | 3/1997 | Yamada et al. | |
| 5,627,665 A | 5/1997 | Yamada et al. | |
| 5,702,833 A * | 12/1997 | Nagai et al. | 428/690 |
| 5,706,109 A | 1/1998 | Yamada et al. | |
| 5,729,318 A | 3/1998 | Yamada et al. | |
| 5,739,889 A | 4/1998 | Yamada et al. | |
| 5,751,382 A | 5/1998 | Yamada et al. | |
| 6,029,518 A * | 2/2000 | Oeftering | 73/570.5 |
| 6,280,799 B1 | 8/2001 | Okabe et al. | |
| 6,284,147 B1 * | 9/2001 | Silverbrook | 216/27 |
| 6,322,198 B1 * | 11/2001 | Higashino et al. | 347/54 |
| 6,328,426 B1 | 12/2001 | Chahn et al. | |
| 6,394,578 B1 * | 5/2002 | Akahira et al. | 347/43 |
| 6,501,527 B1 | 12/2002 | Hirose et al. | |
| RE38,288 E | 10/2003 | Yamada et al. | |
| 2001/0009689 A1 * | 7/2001 | Himeshima et al. | 427/64 |
| 2002/0063083 A1 | 5/2002 | Yogi et al. | |
| 2002/0067123 A1 * | 6/2002 | Seki et al. | 313/504 |
| 2002/0067400 A1 | 6/2002 | Kawase et al. | |
| 2002/0109456 A1 | 8/2002 | Morii | |
| 2002/0118251 A1 * | 8/2002 | Chang et al. | 347/43 |
| 2002/0130931 A1 * | 9/2002 | Hawkins et al. | 347/74 |
| 2004/0032480 A1 | 2/2004 | Kawase et al. | |
| 2004/0100610 A1 | 5/2004 | Kawase et al. | |

FOREIGN PATENT DOCUMENTS

| | | |
|---|---|---|
| EP | 1 072 932 A | 1/2001 |
| JP | 59-075205 | 4/1984 |
| JP | 05-281562 | 10/1993 |
| JP | 08-212925 | 8/1996 |
| JP | 08-238774 | 9/1996 |
| JP | 10-012377 | 1/1998 |
| JP | 2000-127410 | 5/2000 |
| JP | 2000-208254 A | 7/2000 |
| JP | 2000-246887 | 9/2000 |
| JP | 2000-288451 | 10/2000 |
| JP | 2001-38911 | 2/2001 |
| JP | 2001-42338 | 2/2001 |
| JP | 2001-76836 | 3/2001 |
| JP | 2001-083528 | 3/2001 |
| JP | 2001-109002 | 4/2001 |
| JP | 2001-115021 | 4/2001 |
| JP | 2001-117104 | 4/2001 |
| JP | 2001-232798 | 8/2001 |
| JP | 2001-239670 | 9/2001 |
| JP | 2001-284047 | 10/2001 |
| JP | 2001-291583 | 10/2001 |
| JP | 2002-131529 | 5/2002 |
| JP | 2002-231447 A | 8/2002 |
| JP | 2002-365424 | 12/2002 |

* cited by examiner

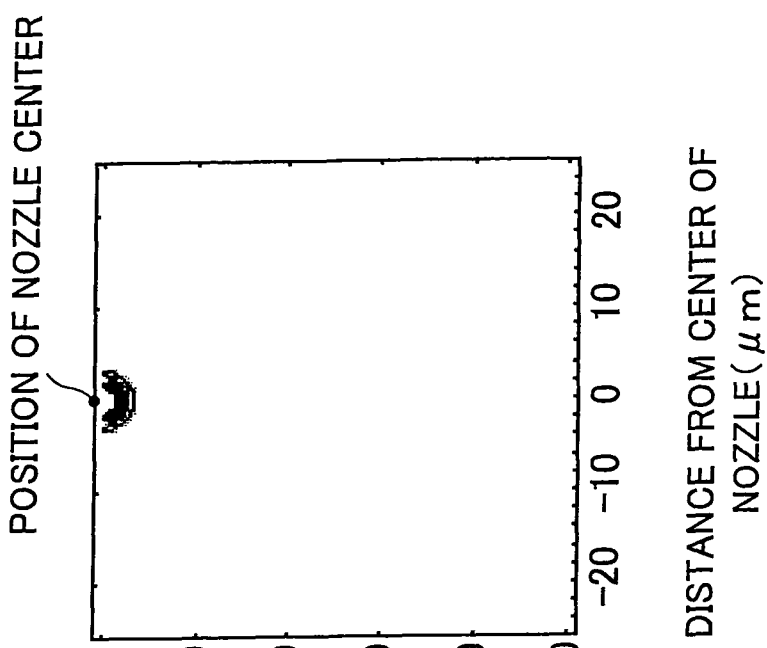
FIG. 3 (a) DISTRIBUTION OF ELECTRIC FIELD STRENGTH (NOZZLE DIAMETER = φ0.2 μm)
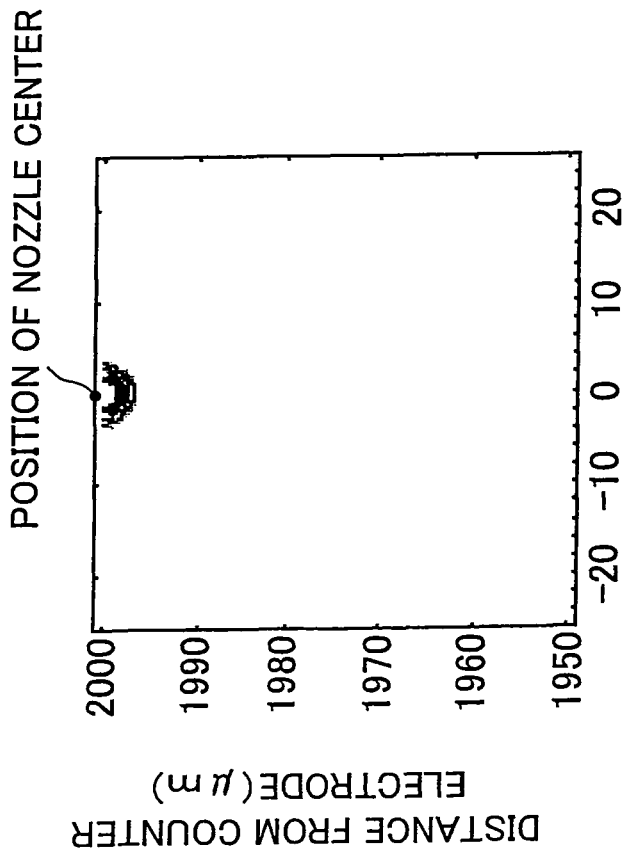
FIG. 3 (b) DISTRIBUTION OF ELECTRIC FIELD STRENGTH (NOZZLE DIAMETER = φ0.2 μm)

FIG. 4 (a)

DISTRIBUTION OF ELECTRIC FIELD STRENGTH
(NOZZLE DIAMETER = φ0.4 μm)

FIG. 4 (b)

DISTRIBUTION OF ELECTRIC FIELD STRENGTH
(NOZZLE DIAMETER = φ0.4 μm)

DISTRIBUTION OF ELECTRIC FIELD STRENGTH
(NOZZLE DIAMETER = φ8μm)

DISTRIBUTION OF ELECTRIC FIELD STRENGTH
(NOZZLE DIAMETER = φ8μm)

DISTRIBUTION OF ELECTRIC FIELD STRENGTH
(NOZZLE DIAMETER = φ20 μm)

DISTRIBUTION OF ELECTRIC FIELD STRENGTH
(NOZZLE DIAMETER = φ20 μm)

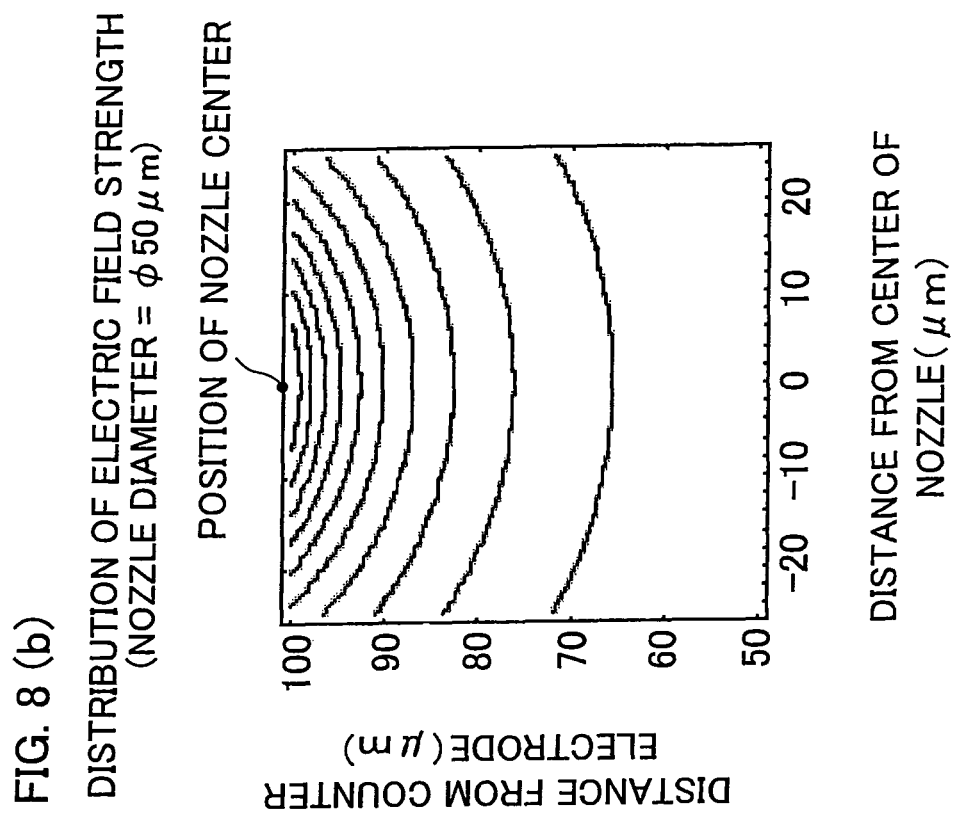
FIG. 8 (b) DISTRIBUTION OF ELECTRIC FIELD STRENGTH (NOZZLE DIAMETER = φ50 μm)
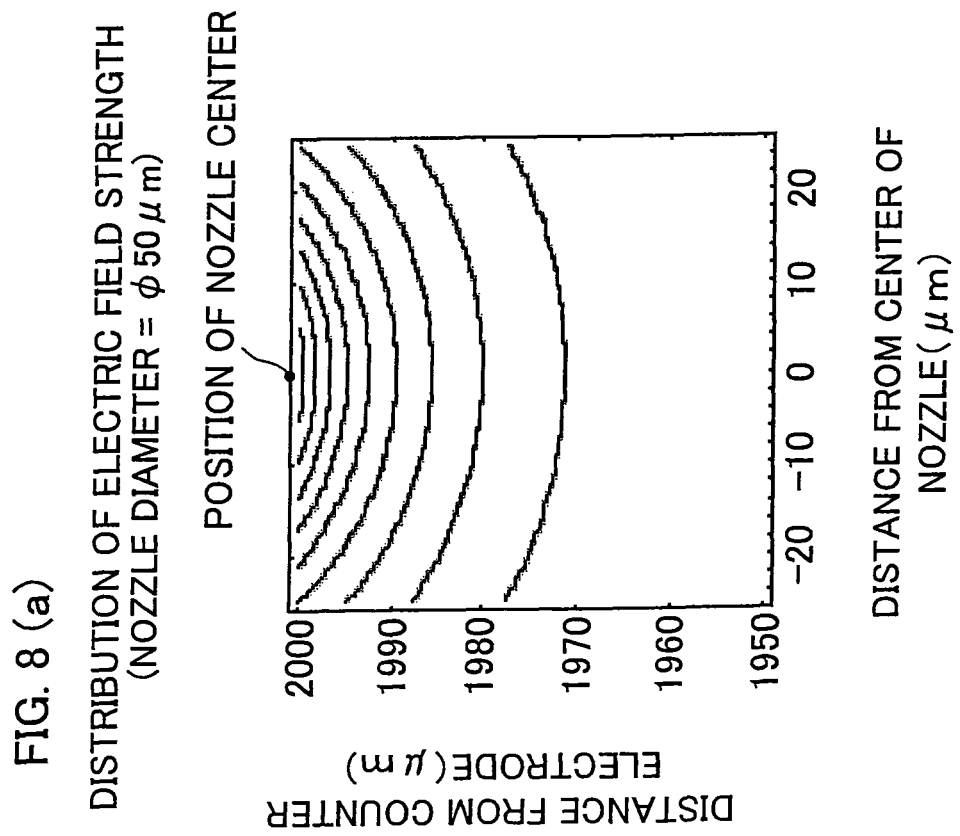
FIG. 8 (a) DISTRIBUTION OF ELECTRIC FIELD STRENGTH (NOZZLE DIAMETER = φ50 μm)

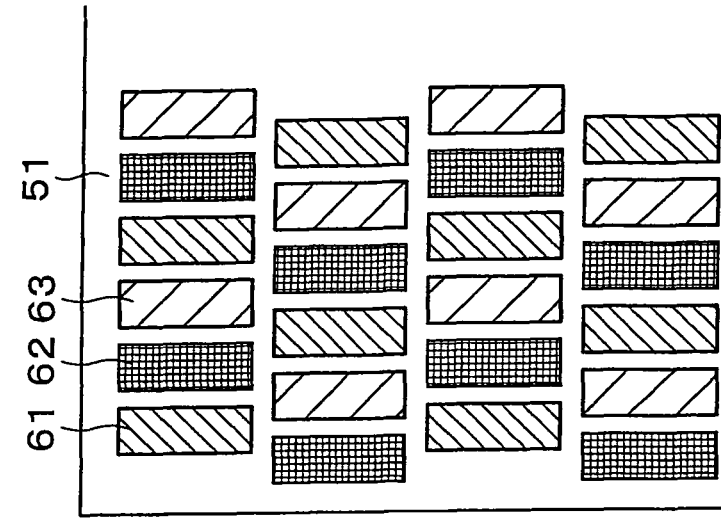
FIG. 10 (c) DELTA ARRANGEMENT
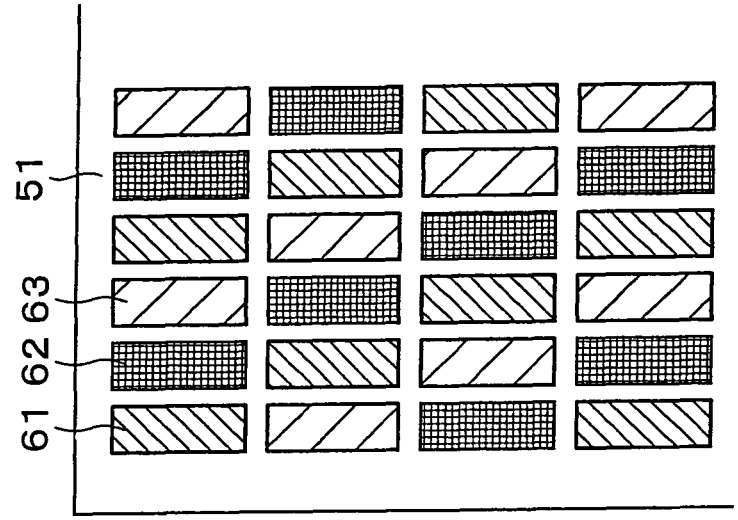
FIG. 10 (b) MOSAIC ARRANGEMENT
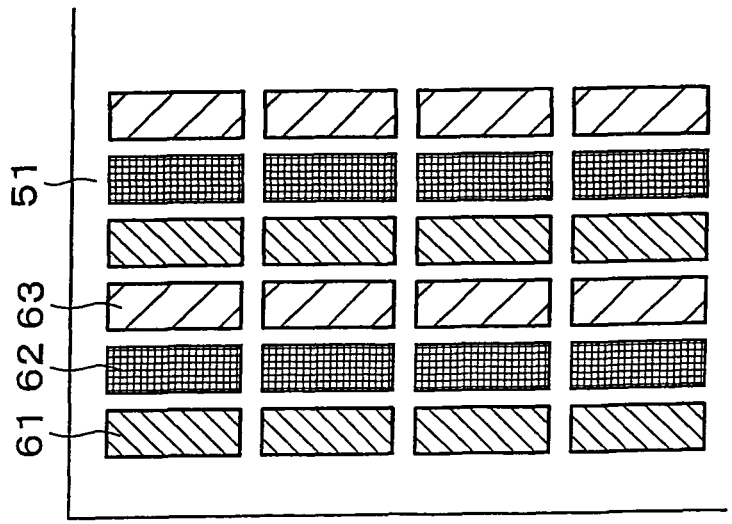
FIG. 10 (a) STRIPE ARRANGEMENT FIG. 12 (a)   FORMATION OF FIRST ELECTRODE
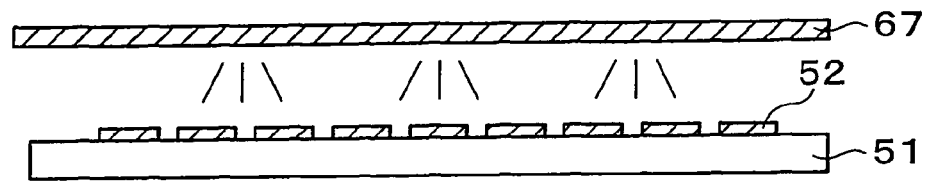
FIG. 12 (b)   FORMATION OF HOLE TRANSPORT LAYER
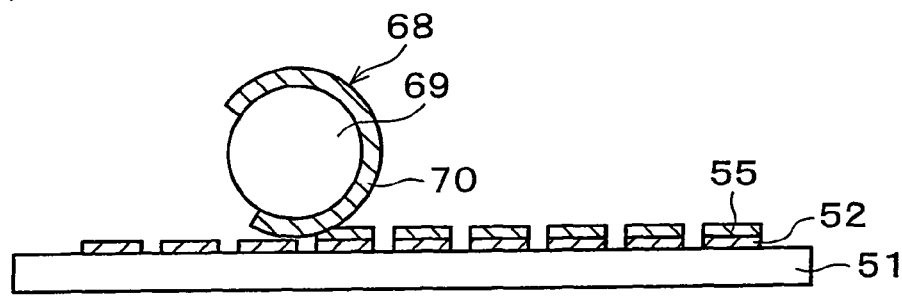
FIG. 12 (c)   FORMATION OF LIGHT EMITTING LAYER
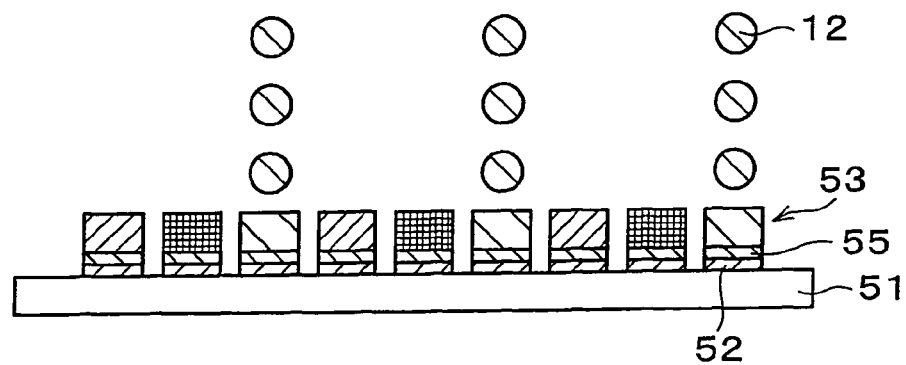

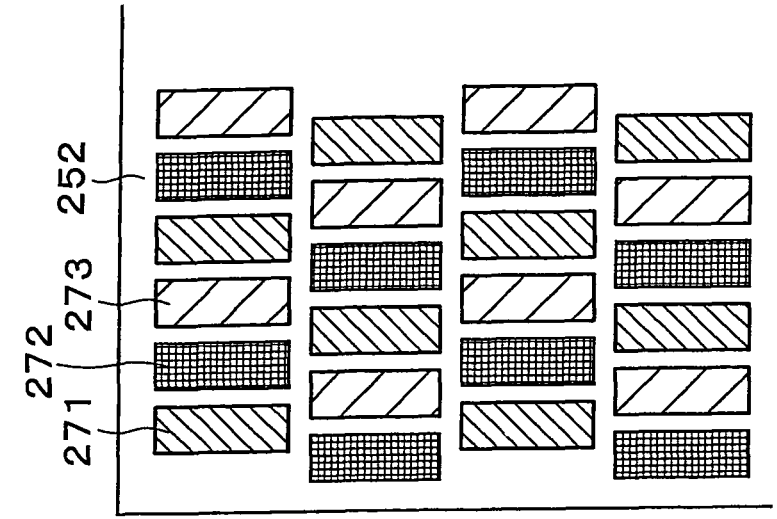
FIG. 33 (c) DELTA ARRANGEMENT
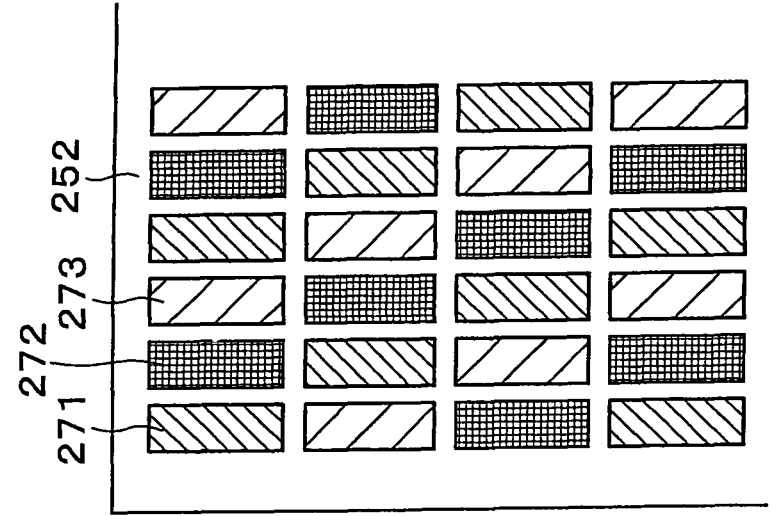
FIG. 33 (b) MOSAIC ARRANGEMENT
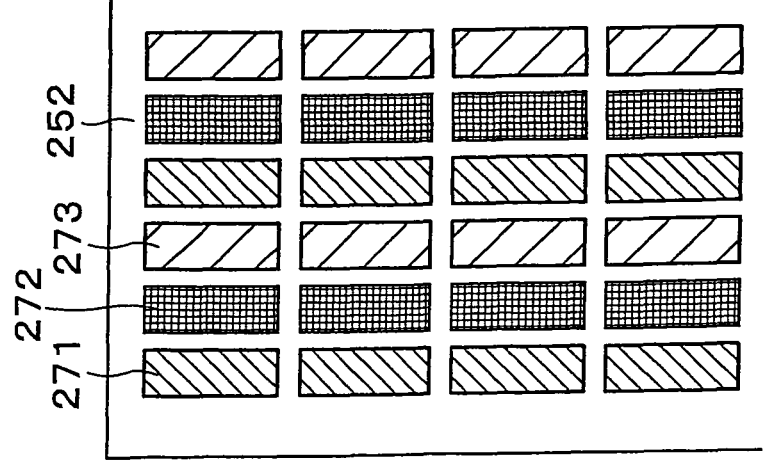
FIG. 33 (a) STRIPE ARRANGEMENT

METHOD AND APPARATUS FOR MANUFACTURING ACTIVE-MATRIX ORGANIC EL DISPLAY, ACTIVE MATRIX ORGANIC EL DISPLAY, METHOD FOR MANUFACTURING LIQUID CRYSTAL ARRAY, LIQUID CRYSTAL ARRAY, METHOD AND APPARATUS FOR MANUFACTURING COLOR FILTER SUBSTRATE, AND COLOR FILTER SUBSTRATE

REFERENCE TO PRIOR APPLICATIONS

This application is a national stage filing of international application number PCT/JP03/12124, which has an international filing date of 24 Sep. 2003 and a claimed, priority date of 24 Sep. 2002 and which is incorporated herein by reference. The claimed priority date is based on Japanese Patent Application Numbers 2002-278217 (filed 24 Sep. 2002), 2002-278221 (filed 24 Sep. 2002), 2002-281828 (filed 26 Sep. 2002), which are incorporated herein by reference.

TECHNICAL FIELD

The present invention relates to (I) an active matrix organic electroluminescent display element provided with an organic electroluminescent layer serving as a light emitting layer, (II) an apparatus and a method for manufacturing the active matrix organic electroluminescent display element, (III) a liquid crystal array for use in liquid crystal color televisions, personal computers and the like, (IV) a method for manufacturing the liquid crystal array in which a spacer is provided in a pair of substrates is formed by using an inkjet method, (V) a color filter substrate for use in color liquid crystal display devices and the like, (VI) an apparatus and a method for manufacturing the color filter substrate by using an inkjet method.

BACKGROUND ART

Recent advancement in information network leads to increasing demands for thin, lightly-weighted, and low-power-consuming display elements. Under such circumstances, a bright and low-voltage-driven organic EL (electroluminescent) display has received much attention. Particularly, research and development in recent years have remarkably improved a light emitting efficiency of an organic EL element in which an organic (high-polymer) material is used, and the organic EL display is now available for practical applications.

A hole and an electron is injected respectively from a cathode and an anode into a solid thin film containing a fluorescent organic molecule by applying an electric charge via electrodes sandwiching the solid thin film. These carriers move within the thin film due to an applied electrical field, and are recombined with each other. An energy discharged from the recombination is consumed to excite the fluorescent molecule into an singlet exited state (molecular exciton), and the organic EL element utilizes the fluorescence discharged when the singlet exciton is turned into a ground state.

In a color display, "One pixel" sometimes means a group of plural light emitting sections, such as a set of R, G, and B. However, in this specification, "one pixel" denotes one individual light emitting section.

A conventional active matrix organic EL display element (organic EL display) is described below. FIG. 36 is a longitudinal sectional view illustrating a configuration of one pixel of the conventional organic EL element. As illustrated in FIG. 36, the conventional organic EL element is provided at least with a substrate 301, a first electrode 302 provided on the substrate 301, an organic EL layer 303, and a second electrode 304.

It is preferable that barriers 305 be provided on side-edge portions of the organic EL layer 303 and the second electrode 304. Further, for the sake of contrast, it is preferable that a polarizer 307 be provided on that surface of the substrate 301 which does not face to the first electrode 302. Further, for the sake of reliability, it is preferable that a sealing film or a sealing substrate 306 be provided on the second electrode 304.

Here, the organic EL layer 303 may be a single-layered structure including only an organic light emitting layer, or a multilayered structure including a charge transport layer (electron transport layer or a hole transport layer) and the organic light emitting layer.

A photoresist method is conventionally known as a method for manufacturing the organic EL layer in the organic EL display device. In a case of using the photoresist method, a black matrix (hereinafter referred to as BM) made of a metal oxide or the like is formed on a glass substrate by photolithography and etching. Then, by using a spinner, an entire surface of the glass substrate is coated with a photosensitive resin in which a pigment of a predetermined color is dispersed. The photosensitive resin is then dried, and is subjected to exposure and development. In this way, a color pixel pattern of the predetermined color is obtained. This process is repeated three times, i.e., for each of three colors R, G, and B (Red, Blue, and Green), so as to form an organic EL pattern.

However, the foregoing method has a problem in that a previously-formed organic EL layer is easily damaged in a photolithography process for forming a successively-formed organic EL layer. Further, an organic EL material needs to be also applied to a non-desirable position. This caused a material cost to increase. Further, the photolithography process is disadvantageous in terms of production costs, because (I) production facility therefor is expensive, and (II) the photolithography process is not so flexibly adjustable to allow any change in design.

In view of that, Japanese Laid-Open Patent Application No. 10-12377/1998 (Tokukaihei 10-12377; published on Jan. 16, 1998) discloses a technique for patternizing a light emitting layer by using an inkjet method. The foregoing publication discloses a method for manufacturing an organic EL layer, in which inks of R, G, and B are respectively printed only in predetermined positions of the glass substrate, thereby forming a color pixels pattern.

With the inkjet method, it is possible to form layers for three primary colors R, G, and B simultaneously. This prevents the organic EL element from being damaged by the repeating photolithography process, and allows reduction of a production time. Further, since the ink is only applied to a position of the color pixel, an amount of the pigment used becomes less than the amount used in the photolithography method. Thus, it is possible to realize a remarkable reduction of the material cost. Further, since it is not necessary to carry out the complicate exposure and development, a developing apparatus becomes no longer necessary. Therefore, the manufacturing cost is reduced. Moreover, since it is possible to work under a normal temperature and a normal pressure, the inkjet method appears to be more promising in improving a productivity, and in simplifying the productive facility.

However, the manufacturing of the organic EL layer by using the conventional inkjet method causes the following problems.

Namely, in the conventional inkjet method, there has not been carried out a sufficient study on how to dry the droplets ejected from a nozzle. Thus, droplets do not immediately dry after landing on a substrate. This results in a greater amount of non-dried droplets on the substrate in order to obtain a desirable layer thickness of the organic EL layer. As a result, it takes long time for drying the droplets, thereby allowing the droplets to move on the substrate before the droplets dry. This deteriorate a formation accuracy of the organic EL layer.

In order to solve the foregoing problem, there is a method in which a landed droplet is positionwise restricted by forming a liquid-affinitive region and a liquid-repellent region on a top surface of the substrate. In this case where the liquid-affinitive region and liquid-repellent region are formed, the organic EL layer is formed by a formation method as described hereinbelow with reference to FIGS. 37(a) to 37(c).

First, a liquid-affinity treatment is carried out with respect to the entire surface of a substrate 311. Then, a liquid-repellent region 313 is formed by carrying out the photolithography process, the liquid-repellent region 313 having a line width of 10 μm between pixels adjacent to each other, where a size of one pixel is 120 μm×100 μm by way of example. In this way, a liquid-affinitive region 312 and the liquid-repellent region 313 are segmented from each other as illustrated in FIG. 37(a).

Next, an ink droplet 314 is ejected toward the liquid-affinitive region 312. The droplet 314 landed on the substrate 311 does not spread out in the liquid-repellent region 313, and is retained in the liquid-affinitive region 312. Then, a solvent of the droplet 314 is dried off, thereby forming the organic EL layer.

The foregoing method, however, has the following problems.

For example, in a case where a thickness of the organic EL layer is 0.05 μm and a volumetric concentration of the ink is 0.1%, a size of a single droplet is 105 μm. The droplet 314 is extended by 1.5 times of a diameter thereof due to an impact caused by landing on the substrate 311. Therefore, as illustrated in FIG. 37(b), a part of the landed droplet 314 is spread out beyond the liquid-repellent region 313 (that serves as an external frame of the pixel), and reaches the liquid-affinitive region 312 of the next pixel. If the ink which is a part of the landed droplet 314 moves to the other liquid-affinitive region 312 before the droplet 314 dries, the ink will not return to the pixel (liquid-affinitive region 312) on which the droplet 314 originally has landed. This causes the droplet 314 to split as illustrated in FIG. 37(c).

Reduction of the diameter of the single droplet is an option to avoid the foregoing problem. For example, in a case where:

(pixel width 100 μm)+(external frames on both edges 10 μm×2)=120 μm, the diameter of the droplet (ink) 314 ejected from the nozzle is determined as 120÷1.5=80 μm, in order to retain the droplet 314 within the liquid-affinitive region 312 immediately after the landing.

In this case, the thickness of the organic EL layer formed by the single droplet 314 is 0.02 μm. This is less than a half of the desirable thickness. Therefore, the droplet 314 needs to be ejected toward the same pixel twice or more. However, after a first droplet, successive droplets land on the organic EL layer formed by a previously landed droplet. Since the organic EL layer formed by the previously landed droplet is not subjected to the liquid-affinity treatment,.the successive droplets do not spread out in a desirable shape. This causes an unevenness. Further, if the successive droplets land before the previous droplet dries, the ink will spread out to the liquid-affinitive region 312 of the next pixel. Therefore, ejection of the successive droplets must be suspended until the previous droplet 314 dries. This results in a poor productivity. Further, it is necessary to carry out the photolithography process for forming the liquid-affinitive region and the liquid-repellent region. This does not allow the inkjet apparatus to contribute to simplification of the productive facility advantageously.

Further, in order to solve the foregoing problems, an option is to form a barrier around the pixel so as to prevent the ink to spread out beyond the barrier. A method for forming the organic EL layer using such a technique is described with reference to FIGS. 38 and 39.

On the substrate 311 of the organic EL display, a black matrix (Hereinafter referred to as BM) is formed for obtaining a clear contrast of the pixels. It is suggested that this BM be used as a barrier for blocking the spreading-out of the droplet 314 containing the organic EL material (FIG. 38(a)).

However, as illustrated in FIG. 38(b), the foregoing method of utilizing the barrier 315 causes the uneven thickness of the organic EL layer 316 formed after the droplet 314 dries. In this case, the organic EL layer 316 is thin at its central portion and thick at a portion along the barrier 315. This uneven thickness must be avoided, because it largely affects a color property of the organic EL display. In view of that, it is suggested that a liquid-repellency treatment be carried out with respect to the barrier 315 in order to avoid an adhesion of the ink to the barrier 315. The method, however, does not yet solve the problem of the depression at the center portion.

Further, the method using the barrier 315 also has the following problems.

In forming the organic EL layer of a desirable thickness, the droplet 314 should contain the organic EL material of a volume corresponding to (1 pixel area×thickness), the organic EL material dissolved in the droplet 314. For example, in one pixel of the organic EL display device, a size of a display region is 120 μm×100 μm, and the thickness of the substrate 311 is 0.05 μm. In order to form these dimensions with a single droplet, the diameter of the droplet is required to be 105 μm where it is supposed that the volumetric concentration of the organic EL material is 0.1%. Therefore, a height of the BM (barrier 315) needs to be 1000 times of the thickness of the organic EL layer. This not only causes waste of the BM material, but also affects an overall design of an organic EL display apparatus.

In a meanwhile, the foregoing problem is not solved by merely reducing the diameter of the droplet, if the levels of the BM and the organic EL layer is kept equal to each other. First, to arrange the size of the droplet to be so small that the droplet does not flow out of the barrier 315 as illustrated in FIG. 39(a), the size of the single droplet must be reduced to 10 μm. However, in a conventional inkjet method, the droplet of a smaller size is more largely affected by an air resistance while it is flying in the air. Therefore, a flying speed of the droplet slows down, and a landing accuracy is deteriorated. Further, a volume of an unfilled portion within the barrier 315 decreases as a solute content of the previous droplet 314 (previous-droplet-substance 317 to be cured) is deposited on a bottom portion within the barrier 315. This causes the droplet landing afterward to flow out of the barrier 315 as illustrated in FIG. 39(b).

To solve this problem, one option is to increase concentration of the droplet 314, and eject the droplets 314 at sufficiently long intervals, so that the solvent of the previous droplets is dried off by the time a final droplet is landed. However, the higher the concentration of the droplet becomes, the higher viscosity the ink has so as to be unable to be ejected by using a conventional inkjet method. Further, it is necessary to carry out the photolithography process for forming the BM. Therefore, the inkjet apparatus is not allowed to contribute to simplification of the productive facility advantageously.

Further, a liquid crystal array is conventionally manufactured by the following manufacturing process. First, on one of a pair of transparent glass substrates, a liquid crystal driving element, such as a TFT (thin film Transistor) is formed. Then, a transparent electrode and an alignment film are formed and spacers are applied on the one of the substrates. Next, this substrate is assembled together with another substrate on which a colored color filter, a transparent electrode and an alignment film are formed. Then, liquid crystal is injected into a gap formed by the spacers between the substrates, and the substrates are sealed off.

In this manufacturing method, silica or plastic particles of several micrometers are usually spread out as the foregoing spacers.

However, in this manufacturing method, the spacers are placed also in aperture areas (region for controlling transmission and reflection of light) of the liquid crystal array. Further, the spacers are placed unevenly in terms of its number and position. This causes the aperture ratio to decrease, thereby resulting in a poor displaying quality or an uneven display.

In order to avoid the decrease in the aperture ratio, it is suggested that by using an inkjet apparatus, spacers are arranged and formed on a black matrix (BM) of a color filter substrate.

For example, Japanese Laid-Open Patent Application No. 281562/1993 (Tokukaihei 5-281562; published on Oct. 29, 1993) discloses a method in which liquid crystal mixed with a spacer material is (A) heated by using a heater and stirred by using a stirring device at the same time, and (B) ejected toward a liquid crystal substrate by using an inkjet apparatus having a nozzle of 60 μm in nozzle diameter. In this method, the ejection of the liquid crystal by using the inkjet method is made possible by heating the liquid crystal so as to lower viscosity of the liquid crystal. This allows the spacer material to be evenly spread out immediately when the liquid crystal is dropped.

Further, in a method disclosed in Japanese Laid-Open Patent Application No. 2001-42338 (Tokukai 2001-42338; published on Feb. 16, 2001), the spacers are formed by (I) plotting a spacer pattern by using the inkjet method for applying, on a substrate, a spacer forming material in a form of ink, and (II) curing the spacer forming material.

However, the method for forming the spacer by using the conventional inkjet apparatus has the following problem.

In a case where the spacer pattern is plotted by drying the spacer forming material applied by using the inkjet method, a higher concentration of the spacer forming material causes a higher viscosity of the spacer forming material.

Typical inkjet methods such as a bubble-jet method or a piezo-electric method are usually arranged such that a viscosity of a substance that can be ejected is about 2 to 20 Pc and a substance having a viscosity higher than this range cannot be ejected therefrom.

Further, it is suggested that the viscosity of the ink to be ejected is decreased by heating a vicinity of the nozzle. However, in this method, the spacer forming material may be cured within the nozzle and clog the nozzle, in a case where a curable resin is used as the spacer material.

On the contrary, in order to eject the spacer material without heating the vicinity of the nozzle, it is necessary to increase an amount of the solvent so as to decrease the viscosity of the spacer forming material. This lowers the concentration of the spacer forming material. For example, in the conventional method, the spacer forming material includes 10 wt % of copolymer, 80 wt % of water, and 10 wt % of ethylene glycol. After the spacer forming material is dried, a volume of the spacer forming material becomes a fraction of an original volume thereof.

Accordingly, in order to obtain the spacer of a predetermined thickness, it is necessary to enlarge the diameter of the droplet being ejected. In this case, shapes of the spacers being formed is, for example, a flat shape of 5 μm in thickness, and 50 μm in diameter. As a result, the problem of the spacer-caused decrease in the aperture ratio is not solved. Further, due to the low concentration, it is necessary to carry out baking at 100° C. for 15 min., then at 200° C. for 30 min. Therefore, it takes longer time to form the spacer.

Further, after the droplet containing the spacer material lands on the ink substrate, the droplet moves before the solvent is dried off. Therefore, the spacers are not formed in a desirable position.

Regarding this problem, an arrangement is discussed below in which the spacers are formed on the BM so as to avoid, in particular, reduction of the aperture ratio.

For example, it is supposed that a needed thickness of the spacer for the BM of 10 μm in width is 5 μm, and that the concentration of the spacer forming material (ink) is allowed to be as high as 50%. It is further supposed that the liquid-repellency treatment is carried out with respect to a surface of the BM, and that, after the droplet of the liquid lands, the droplet is not spread out, and an area of the liquid is maintained to be within 1.5 times of the diameter of the droplet.

In this case, the droplet can be as large as φ6.7 μm. However, the thickness of the spacer material remaining after the solvent is dried off is 1 μm, and is below the targeted thickness. Accordingly, it is necessary to laminate the spacer material by carrying out repeated ejections. In this case, the solvent of the previous droplet must be completely dried off before the successive droplet is ejected, otherwise the droplet will be spread out. As a result, in repeated ejection, ejection intervals (time intervals between ejections) becomes long, and a working efficiency is deteriorated.

Therefore, the concentration of the spacer forming material (ink) needs to be even higher, and a configuration capable of ejecting a droplet of such a highly concentrated spacer forming material (ink) is required.

In view of the foregoing problem, Japanese Laid-Open Patent Application No. 2000-246887 (Tokukai 2000-246887; published on Sep. 12, 2000) discloses the following technology. Namely, the foregoing application discloses a method for ejecting a highly viscous substance by using a dispenser. In the method, an electrode is arranged entirely or partially on a container in which a highly viscous substance of 100 cps to 1,000,000 cps is filled in. This container has, at its bottom section, a polygonal or circular orifice of 50 μm to 1 mm in diameter. From the orifice, the highly viscous substance is protruded out forming a meniscus. Then, the highly viscous substance protruded forming the meniscus is pulled out by applying a voltage to the electrode. Next, a part of the substance is cut off to separate, and is adhered to a medium.

This technology utilizes a fact that the meniscus from the nozzle forms a conical shape with an application of a voltage. In this case, a larger pulse amplitude forms a higher conical-shape of the meniscus. Therefore, the larger pulse amplitude increases a volume of that portion of the meniscus which is extended toward a substrate and is to touch the substrate, and thus attains a larger dot diameter.

However, in the foregoing conventional method, in a case where a desirable dot diameter is small, it is necessary to control the meniscus so that only a leading edge portion of the meniscus cone touches the substrate side. Particularly, in a case where the spacers are formed by laminating the spacer forming material (ink), a distance between a recording-subjected side member and the nozzle gradually becomes shorter, as the spacers are being laminated. Therefore, controlling of the dot diameter becomes very difficult. Further, as to stabilizing an amount of the ink being applied, it is necessary to enlarge the pulse so that not only the leading edge of the conical-shape meniscus but also a vicinity of a middle of the meniscus is abutted against the substrate. Therefore, the diameter of the droplet should be at least a half of the diameter of the nozzle or more.

In order to reduce the dot diameter in this situation, the diameter of the nozzle must be reduced. However, in this case, the nozzle-to-substrate distance must be shortened at the same time. This causes larger influences from errors in the nozzle-to-substrate distance, caused by the uneven thickness of the substrate or a wavy shape of the substrate. Thus a stable ejection becomes difficult. Recent advancement in information network leads to increasing demands for a thin, lightly-weighted, and low-power-consuming display element. Under such circumstances, a bright and low-voltage-driven liquid crystal display has received much attention.

Among those, a color liquid crystal display is so arranged that a transmission amount of light emitted from a backlight is controlled by controlling alignment of liquid crystal by using a transparent electrode (ITO film) connected to a TFT. In such a color liquid crystal display, passing of the light through a color filter causes a color to appear.

In the color display, "one pixel" sometimes means a group of plural color filters, such as a set of R, G, and B. However, in this specification, "one pixel" denotes one color filter.

Conventionally, spin-coat method has been known as one of method for manufacturing a color filter substrate. In a case of using the spin coat method, a black matrix (Hereinafter referred to as BM) made of a metal such as chrome is formed on a glass substrate by photolithography and etching. Then, by using a spinner, an entire surface of the glass substrate is coated with a photosensitive resin in which a pigment of a predetermined color is dispersed. The photosensitive resin is then dried, and is subjected to exposure and development. In this way, a color pixel pattern of the predetermined color is obtained. This process is repeated three times, i.e., for each of three colors R, G, and B (Red, Blue, and Green), so as to form a color filter pattern.

However, a color filter material needs to be also applied to a non-desirable position. This caused a material cost to increase. Further, the photolithography process is disadvantageous in terms of production costs, because (I) productive facility therefor is expensive, and (II) the photolithography process is not so flexibly adjustable to allow any change in design.

In view of that, Japanese Laid-Open Patent Application No. 75205/1984 (Tokukaisho 59-75205; published on Apr. 27, 1984) discloses a technique for patternizing a color filter by using the inkjet method. The technology relates to a method for manufacturing the color filter substrate, in which inks of R, G, and B are respectively printed only in predetermined positions of the glass substrate, thereby forming the color pixels.

With the inkjet method, it is possible to form layers for three primary colors R, G, and B simultaneously. Therefore, it is possible to reduce the production time. Further, since the ink is only applied to a position of the color pixel, an amount of the pigment used becomes less than the amount used in the spin coat method. Thus, it is possible to realize a remarkable reduction of the material cost. Further, since it is not necessary to carry out the complicate exposure and development, a developing apparatus becomes no longer necessary. Therefore, the manufacturing cost is reduced. Moreover, since it is possible to work under a normal temperature and a normal pressure, the inkjet method appears to be more promising in improving the productivity, and in simplifying the productive facility.

Further, in the foregoing application of Tokukaisho 59-75205, a dispersion preventing pattern is formed on a substrate, by using a substance having a poor wettability. On this substrate, ink containing the pigment is applied by using the inkjet method, thereby forming the color filter.

However, the manufacturing of the color filter by using the conventional inkjet method has the following problems.

Namely, there has not been carried out a sufficient study on how to dry the droplets ejected from a nozzle. Thus, droplets do not immediately dry after landing on a substrate. Accordingly, This results in a greater amount of non-dried droplets on the substrate in order to obtain a desirable layer thickness of a color filter layer. As a result, it takes long time for drying the droplets, and the droplets move on the substrate before the droplets dry. This deteriorate a formation accuracy of the color filter.

In order to solve the foregoing problem, there is a method in which a position of a landed droplet is restricted in positionwise by forming a liquid-affinitive region and a liquid-repellent region on a top surface of the substrate. In this case where the liquid-affinitive region and liquid-repellent region are formed, the color filter layer is formed by a formation method as described hereinbelow with reference to FIGS. 37(a) to 37(c).

First, a liquid-affinity treatment is carried out with respect to the entire surface of a substrate 311. Then, a liquid-repellent region 313 is formed by carrying out the photolithography process, the liquid-repellent region 313 having a line width of 10 μm between pixels adjacent to each other, where a size of one pixel is 300 μm × 100 μm by way of example. In this way, a liquid-affinitive region 312 and the liquid-repellent region 313 are segmented from each other as illustrated in FIG. 37(a).

Next, an ink droplet 314 is ejected toward the liquid-affinitive region 312. The droplet 314 landed on the substrate 311 does not spread out in the liquid-repellent region 313, and is retained in the liquid-affinitive region 312. Then, a solvent of the droplet 314 is dried off, thereby forming the color filter layer.

However, this method has the following problems.

For example, in a case where a thickness of the color filter layer is 1 μm, and a volumetric concentration of the ink is 5%, a size of a single droplet is 105 μm. The droplet 314 is extended by 1.5 times of a diameter thereof due to an impact caused by landing on the substrate 311. Therefore, as illustrated in FIG. 37(b), a part of the landed droplet 314 is spread out beyond the liquid-repellent region 313 (that serving as an external frame of the pixel), and reaches the liquid-affinitive region 312 of the next pixel. If the ink which is a part of the landed droplet 314 moves to the other liquid-affinitive region 312 before the droplet 314 dries, the ink will not return to the pixel (liquid-affinitive region 312) on which the droplet 314 originally has landed. This causes the droplet 314 to split as illustrated in FIG. 37(c).

Reduction of the diameter of the single droplet is an option to avoid the foregoing problem. For example, in a case where:

(pixel width 100 μm)+(external frames on both edges 10 μm×2)=120 μm, the diameter of the droplet (ink) 314 ejected from the nozzle is determined as 120÷1.5=80 µm, in order to retain the droplet 314 within the liquid-affinitive region 312 immediately after the landing.

In this case, the thickness of the color filter layer formed by the single droplet 314 is 0.45 µm. This is less than a half of the desirable thickness. Therefore, the droplet 314 needs to be ejected toward the same pixel twice or more. However, after a first droplet, successive droplets land on the color filter layer formed by a previously landed droplet. Since the color filter layer formed by the previously landed droplet is not subjected to the liquid-affinity treatment, the successive droplets do not spread out in a desirable shape. This causes an uneven thickness. Further, if the successive droplets land before the previous droplet dries, the ink will spread out to the liquid-affinitive region of the next pixel. Therefore, ejection of the successive droplets must be suspended until the previous droplet 121 dries. This causes a poor productivity. Further, it is necessary to carry out the photolithography process for forming the liquid-affinitive region and the liquid-repellent region. This does not allow the inkjet apparatus to contribute to simplification of the productive facility advantageously.

Further, in order to solve the foregoing problems, an option is to form a barrier around the pixel so as to prevent the ink to spread out beyond the barrier. A method for forming the color filter layer using the technique is described with reference to FIGS. 38 and 39.

On a color filter substrate 1 of a liquid crystal element, a black matrix (Hereinafter referred to as BM) is formed for obtaining a clear contrast of the pixels. It is suggested that this BM be used as the barrier 315 for blocking the spreading-out of the droplet 314 containing the color filter material (FIG. 38(a)).

However, as illustrated in FIG. 38(b), the foregoing method of utilizing the barrier 315 causes the uneven thickness of the color filter layer 316 formed after the droplet 314 dries. In this case, the color filter layer 316 is thin at its central portion, and the color filter layer 316 is thick at a portion along the barrier 315. This uneven thickness must be avoided, because it largely affects a color developing property of the color filter layer 316. In view of that, it is suggested that a liquid-repellency treatment be carried out with respect to the barrier 315 in order to avoid an adhesion of the ink to the barrier 315. The method, however, does not yet solve the problem of the depression at the center portion.

Further, the method using the barrier 315 also has the following problems.

In forming the color filter layer of a desirable thickness, the droplet 314 should contain the color filter material of a volume corresponding to (1 pixel area×thickness), the color filter material dissolved in the droplet 314. For example, in one pixel of the color filter layer of the color filter substrate 311, a size of a display region is 300 µm×100 µm, and the thickness of the color filter layer is 1 µm. In order to form this by the single droplet, the diameter of the droplet is required to be 105 µm where the volumetric concentration of the color filter material is 5%. Therefore, a height of the BM (barrier 315) needs to be 20 times of the thickness of the color filter layer. This not only causes waste of the BM material, but also affects an overall design of a liquid crystal element.

In a meanwhile, the foregoing problem is not solved by merely reducing the diameter of the droplet, if the levels of the BM and the color filter layer is kept equal to each other. First, to arrange the size of the droplet to be so small that the droplet does not flow out of the barrier 315 as illustrated in FIG. 39(a), the size of the single droplet must be reduced to 20 µm. However, in a conventional inkjet method, the droplet of a smaller size is more largely affected by an air resistance while it is flying in the air. Therefore, a flying speed of the droplet slows down, and a landing accuracy is deteriorated. Further, as illustrated in FIG. 39(b), a volume of an unfilled portion within the barrier 315 decreases as a dissolved substance of the previous droplet 314 (previous-droplet-substance 317 to be cure) is deposited on a bottom portion within the barrier 315. This causes the droplet landing afterward to flow out of the barrier 315.

To solve this problem, one option is to increase the concentration of the droplet 314, and eject the droplet 314 at sufficiently long intervals, so that the solvent of the previous droplets dry by the time a final droplet is landed. However, the higher the concentration of the droplet becomes, the higher viscosity the ink has so as to be unable to be ejected by using a conventional inkjet method. Further, it is necessary to carry out the photolithography process for forming the BM. Therefore, the inkjet apparatus is not allowed to contribute to simplification of the productive facility advantageously.

(Patent Document 1)
Tokukaihei 10-12377; published on Jan. 16, 1998)
(Patent Document 2)
Tokukaihei 8-238774; published on Sep. 17, 1996)
(Patent Document 3)
Tokukai 2000-127410; published on May 5, 2000)
(Patent Document 4)
Tokukaihei 5-281562; published on Oct. 29, 1993)
(Patent Document 5)
Tokukai 2001-42338; published on Feb. 16, 2001)
(Patent Document 6)
Tokukai 2000-246887; published on Sep. 12, 2000)
(Patent Document 7)
Tokukaishou 59-75205; published on Apr. 27, 1984)

Accordingly, an object of the present invention is to provide an active matrix organic EL display element, and an active matrix organic EL display element manufacturing method, for forming an organic EL layer, in which a drying rate of a landed droplet is taken into account, so that the organic EL layer is formed in an accurate position, and advantages of an inkjet method is utilized, without particular needs of a barrier, a liquid-repellent region, and a liquid-affinitive region around the pixel.

Further, the present invention is made for solving the foregoing problems, and it is also an object of the present invention to provide a liquid crystal array and a liquid crystal array manufacturing method utilizing an arrangement that allows accurate application and formation of spacers, for example, boundary between aperture sections on a substrate (such as a TFT substrate, a color filter substrate, or the like) having the aperture sections per pixel. The method of the present invention prevents spacer-caused decrease in an aperture ratio and easily obtains the spacers having desirable thicknesses (heights).

Accordingly, an object of the present invention is to provide a color filter substrate, and a color filter substrate manufacturing method, for forming a color filter, in which a drying rate of a landed droplet is taken into account, so that the color filter is formed in an accurate position, and advantages of an inkjet method is utilized, without particular needs of a barrier, a liquid-repellent region, and a liquid-affinitive region around the pixel.

DISCLOSURE OF INVENTION

The inventors of the present invention made diligent studies on a technique to enable (i) control of movement amount of a droplet after the droplet ejected from a nozzle is landed and before the landed droplet is dried, (ii) accurate and easy formation of an organic EL layer having a thick thickness. In diligently studying on the technique, the inventors predicted that a certain combination of parameters such as droplet diameter of a liquid (ink) containing an organic EL layer material gives a region in which the droplet (ink) is dried immediately after landing. Further, the inventors accomplished an inkjet method that allows ejection under such condition.

By performing the ejection of the droplet according to this inkjet method, it is possible to cause the droplet to dry immediately after the landing of the droplet, thereby avoiding expansion of the droplet, and thus enabling formation of the organic EL layer by repeating droplet application.

A method of the present invention is for producing an active matrix organic EL display element by an inkjet method to eject droplets of a liquid via an ejection hole of a nozzle so as to form an organic EL layer, the liquid containing an organic EL layer material. The method of the present invention is arranged such that an electrostatic attraction type inkjet apparatus is used whose ejection hole has a diameter smaller than a diameter of the droplets; and the droplets are ejected from the nozzle of the electrostatic attraction type inkjet apparatus in such a manner that each of the droplets is 1 pl or less in amount.

Moreover, an apparatus of the present invention is for producing an active matrix organic EL display element, the apparatus adopting an inkjet method to eject droplets of a liquid via an ejection hole of a nozzle so as to form an organic EL layer, and the liquid containing an organic EL layer material. The apparatus of the present invention is arranged such that the ejection hole of the nozzle has a diameter smaller than a diameter of the droplets, the inkjet method is of electrostatic attraction type, and each of the droplets ejected via the nozzle is 1 pl or less in amount.

With these arrangement, in which the amount of the single droplet ejected from the nozzle is 1 pl or less, the droplet dries immediately after landed on an organic EL layer formation region on a substrate. This makes it difficult for the droplet to move after landing on the substrate, thereby making it possible to form the organic EL layer with accurate positioning. The same is true in a case in which a plurality of the droplets are ejected to form an organic EL layer having a predetermined thickness by forming lamination with the droplets. These arrangements prevents movement of the droplets landed on another droplet having previously landed.

With this arrangement, the method of the present invention allows the inkjet method to effectuate its advantage, and especially makes it possible to form the organic EL layer easily and with low cost without forming (i) a barrier around the organic EL layer formation region (pixel region), (ii) liquid-repelling region and liquid-affinitive region, and the like.

Moreover, the user of the electrostatic attraction type inkjet device whose nozzle has a diameter smaller than the diameter of the droplet makes it possible to eject the droplet with a minute diameter of 1 pl or less, while keeping the applied voltage for generating an electric field used for performing electrostatic attraction type. Moreover the ejection of the droplet can be stably performed because in the use of the electrostatic attraction type inkjet device the electric charge can be easily concentrated in the droplets in ejecting and thus variation of an electric field strength around the droplet becomes small. As a result, it becomes possible to repeatedly eject the droplet in high-frequency ejection operation, thereby improving production efficiency.

If the nozzle diameter is 13 μm or less, the amount of the droplet may be 1 pl or less. Moreover, it is necessary in the production of the organic EL display element that the concentration of the organic EL layer be not less than a predetermined value after the application of the droplet. Therefore, in case where a minute droplet is used as in the present invention, the ejection of the droplet is carried out with respect to a same organic EL layer formation region in plural times.

In the method for producing the active matrix organic EL display element, the liquid may be used whose volumetric concentration is determined from a number of layers formed with the droplets by repeating the ejection onto the same organic EL layer formation region.

The smaller the ejected droplet is, the thinner the organic EL layer formed with a single droplet, whereby it is required that lamination of layers be formed with a plurality of the droplets in order to attain a predetermined thickness. In this case, the increase in the number of the layer prolongs operation time. Therefore, used is a liquid (ink) having a volumetric concentration that is determined from the number of the layers formed with the droplets repeatedly ejected on the same organic EL layer formation region. In this way, the volumetric concentration of the liquid is adjusted according to the number of the layer. In this case, the number of the layers is decreased by setting the volumetric concentration of the liquid to be high. This reduces a number of times to eject and improves production efficiency.

Moreover, a method of the present invention is for producing an active matrix organic EL display element by an inkjet method to eject droplets of a liquid via an ejection hole of a nozzle so as to form an organic EL layer, the liquid containing an organic EL layer material. The method of the present invention is arranged such that an electrostatic attraction type inkjet apparatus is used, the electrostatic attraction type inkjet apparatus being for ejecting droplets via its nozzle in such a manner that, each of the droplets is 1 pl or less in amount; and the liquid has a volumetric concentration $\eta$ (%) that is substantially $\beta' t/(\alpha' D)$, where $\alpha$ is a number of layers to be formed with the droplets repeatedly ejected on a same organic EL layer formation region, $\beta$ is a value obtained from a ratio between the diameter of the droplets and a diameter of landed droplets in the organic EL layer formation region, D is the diameter of the droplets, and t is a thickness of the organic EL layer to be formed.

Moreover, an apparatus of the present invention is for producing an active matrix organic EL display element, the apparatus adopting an inkjet method to eject droplets of a liquid via an ejection hole of a nozzle so as to form an organic EL layer, and the liquid containing an organic EL layer material. The apparatus of the present invention is arranged such that the inkjet method is of an electrostatic attraction type and each of the droplets ejected is 1 pl or less in amount; and the liquid has a volumetric concentration $\eta$ (%) that is substantially $\beta t/(\alpha' D)$, where $\alpha$ is a number of layers to be formed with the droplets repeatedly ejected on a same organic EL layer formation region, $\beta$ is a value obtained from a ratio between the diameter of the droplets and a diameter of landed droplets in the organic EL layer formation region, D is the diameter of the droplets, and t is a thickness of the organic EL layer to be formed.

With these arrangement, in which the amount of the single droplet ejected from the nozzle is 1 pl or less, the droplet dries immediately after landed on an organic EL layer formation region on a substrate. This makes it difficult for the droplet to move after landing on the substrate, thereby making it possible to form the organic EL layer with accurate positioning. The same is true in a case in which a plurality of the droplets are ejected to form an organic EL layer having a predetermined thickness by forming lamination with the droplets. These arrangements prevents movement of the droplets landed on another droplet having previously landed.

With this arrangement, the method of the present invention allows the inkjet method to effectuate its advantage, and especially makes it possible to form the organic EL layer easily and with low cost without forming (i) a barrier around the organic EL layer formation region (pixel region), (ii) liquid-repelling region and liquid-affinitive region, and the like.

The smaller the ejected droplet is, the thinner the organic EL layer formed with a single droplet, whereby it is required that lamination of layers be formed with a plurality of the droplets in order to attain a predetermined thickness. In this case, the increase in the number of the layer prolongs operation time. Therefore, the volumetric concentration of the liquid (ink) is set to be high, satisfying the above equation. This reduces the number of the layers of the lamination, thereby reducing the number of the times of ejection and improving the production efficiency. The approximation range may be, for example, ±10%, taking unevenness of the amount of the droplets into consideration.

The method for producing the active matrix organic EL display element may be arranged such that the ejection hole of the electrostatic attraction type inkjet apparatus is smaller than the liquid crystal in diameter.

According to the arrangement, it is possible to eject a minute droplet of 1 pl or less, but a low applied voltage still can be used for generating the electric field for electrostatic attraction. Moreover, the electric charge can be easily concentrated in the droplet in ejecting the droplet. Thus, the variation of the ambient electric field intensity around the droplet becomes small. Thus, stable ejection is attained. As a result, it becomes possible to release the droplet continuously, with ejection driving using a high frequency. This improves productivity.

The method for producing the active matrix organic EL display element may be arranged such that the liquid has a viscosity of 20 cP or more.

With this arrangement, the use of the highly viscous ink having viscosity of 20 cP or more as the liquid (ink) reduces the number of the layers to be made with the plurality of droplets. Thus, the number of ejection is reduced, thereby improving the productivity.

The method for producing the active matrix organic EL display element may be arranged such that the organic EL layer has an organic light emitting layer.

The method for producing the active matrix organic EL display element may be arranged such that the organic EL layer has a charge transport layer.

An active matrix organic EL display element is produced any one of the methods.

A method of the present invention is for producing a liquid crystal array having a pair of substrates facing each other and having a gap in which a liquid crystal is filled, the gap formed by a spacer provided between the substrates, at least one of the substrates having an aperture section, and the method comprising the steps of (i) ejecting droplets of a spacer material via an ejection hole of the nozzle by an inkjet method, and (ii) curing the spacer material so as to form the spacer. The method is arranged such that the ejection hole of the nozzle has a diameter smaller than a diameter of the droplets, the inkjet method is of electrostatic attraction type, and each of the droplets ejected via the nozzle is 1 pl or less in amount.

The aperture section is a region used for controlling light transmission or light reflection of a display section.

With this arrangement, in which the amount of the single droplet ejected from the nozzle is 1 pl or less in amount, the droplet dries immediately after landing on a spacer formation surface of the substrate. Therefore, it is difficult for the droplet to move after it landed on the substrate. Thus, it is possible to form the space with accurate positioning. The same is true for the case where a plurality of droplets are ejected to make a lamination in order to form a spacer having a desirable thickness. In this case, it is possible to avoid a problem in that a droplet landed successively is moved due to influence from a droplet landed previously.

Because of this, the present invention allows to utilizes the advantage of the inkjet method, thereby making it possible to easily and inexpensively form the spacer having a desired thickness, but without reducing the aperture ratio of the liquid crystal array.

Moreover, because of the use of the electrostatic attraction type inkjet apparatus whose nozzle has the ejection hole having the diameter smaller than the diameter of the droplet, it is possible to eject a minute droplet of 1 pl or less, but a low applied voltage still can be used for generating the electric field for electrostatic attraction. Moreover, the electric charge can be easily concentrated in the droplet in ejecting the droplet. Thus, the variation of the ambient electric field intensity around the droplet becomes small. Thus, stable ejection is attained. As a result, it becomes possible to release the droplet continuously, with ejection driving using a high frequency. This improves productivity.

If the nozzle diameter is 13 μm or less, the amount of the liquid can be 1 pl or less. Moreover, the thickness of the spacer should not be less than a predetermined value. In cases where a minute droplet is used as in the present invention, the ejection of the droplet is repeated in plural times with respect to a same spacer formation place.

A method of the present invention is for producing a liquid crystal array having a pair of substrates facing each other and having a gap in which a liquid crystal is filled, the gap formed by a spacer provided between the substrates, at least one of the substrates having an aperture section, the method comprising the steps of (i) ejecting droplets of a spacer material via an ejection hole of the nozzle by an inkjet method, and (ii) curing the spacer material so as to form the spacer. The method of the present invention includes causing a tip portion of the nozzle to be in contact with a spacer formation surface of a substrate; applying a voltage to an electrode of the nozzle being in contact with the spacer formation surface, so as to shrink the spacer material; and release the spacer material continuously, via the nozzle under the voltage application as the nozzle is moved away from the substrate, so as to form, on the substrate, the spacer having a column-like shape.

With this arrangement, the present invention allows to utilizes the advantage of the inkjet method, thereby making it possible to easily and inexpensively form the spacer having a desired thickness, but without reducing the aperture ratio of the liquid crystal array.

The method for producing the liquid crystal array may be arranged such that the ejection hole of the nozzle has a diameter of 8 μm or less. This arrangement allows stable formation of the spacer.

A method of the present invention is for producing a liquid crystal array having a pair of substrates facing each other and having a gap in which a liquid crystal is filled, the gap formed by a spacer provided between the substrates, at least one of the substrates having an aperture section. The method of the present invention includes ejecting, by using an electrostatic attraction type inkjet apparatus, droplets of a liquid onto a spacer formation surface via a nozzle of the electrostatic attraction type inkjet apparatus so as to form the spacer, the nozzle having an ejection hole having a diameter smaller than a diameter of the droplets, the liquid comprising a solid spacer, and each of the droplets being 1 pl or less in amount.

With the arrangement, in which the amount of the single droplet ejected from the nozzle is 1 pl or less, the droplet dries, i.e., a solvent is dried off immediately after landing. Therefore, it is difficult for the solid spacer contained in the droplet to move after the droplet landed on the spacer formation surface. Thus, it is possible to form the spacer with accurate positioning. With this, it is possible to avoid the reduction of the aperture ratio in the liquid crystal array. Moreover, because the solvent dries immediately after the droplet is landed, no such problem occurs that the solvent remained on the substrate adversely affects an alignment film or the like.

Moreover, because of the use of the electrostatic attraction type inkjet apparatus whose nozzle has the ejection hole having the diameter smaller than the diameter of the droplet, it is possible to eject a minute droplet of 1 pl or less, but a low applied voltage still can be used for generating the electric field for electrostatic attraction. Moreover, the electric charge can be easily concentrated in the droplet in ejecting the droplet. Thus, the variation of the ambient electric field intensity around the droplet becomes small. Thus, stable ejection is attained. As a result, it becomes possible to perform accurate positioning control as to position in which the spacer is formed.

Because of this, the present invention allows to utilizes the advantage of the inkjet method, thereby making it possible to easily and inexpensively form the spacer having a desired thickness, but without reducing the aperture ratio of the liquid crystal array.

A method of the present invention is for producing a liquid crystal array having a pair of substrates facing each other and having a gap in which a liquid crystal is filled, the gap formed by a spacer provided between the substrates, at least one of the substrates having an aperture section. The method of the present invention is arranged such that it includes, after providing an individual spacer on a spacer providing surface, positioning the individual spacer by hitting the solid spacer with a droplet ejected via a nozzle of an electrostatic attraction type inkjet apparatus so as to move the solid spacer, the nozzle having an ejection hole having a diameter smaller than a diameter of the droplet, and the droplet being 1 pl or less in amount.

With this arrangement, after the individual space is positioned on a spacer position surface, the position of the solid spacer can be adjusted by ejecting of the droplet from the nozzle, thereby solving such conditions such as grouping of spacers in one place. Therefore, it is possible to avoid reduction of the aperture ratio.

Moreover, because the amount of the single droplet ejected from the nozzle is 1 pl or less, the droplet dries immediately after the droplet is landed. Therefore, no such problem occurs that the solvent remained on the substrate adversely affects an alignment film or the like.

Moreover, because of the use of the electrostatic attraction type inkjet apparatus whose nozzle has the ejection hole having the diameter smaller than the diameter of the droplet, it is possible to eject a minute droplet of 1 pl or less, but a low applied voltage still can be used for generating the electric field for electrostatic attraction. Moreover, the electric charge can be easily concentrated in the droplet in ejecting the droplet. Thus, the variation of the ambient electric field intensity around the droplet becomes small. Thus, stable ejection is attained. As a result, it becomes possible to perform accurate positioning control as to position in which the spacer is formed.

Because of this, the present invention allows to utilizes the advantage of the inkjet method, thereby making it possible to easily and inexpensively form the spacer having a desired thickness, but without reducing the aperture ratio of the liquid crystal array.

The method for producing the liquid crystal array maybe arranged such that a material ejected from the nozzle has a viscosity of 30 cP or more.

With this arrangement in which the viscosity of the ejected material from the nozzle is so high, i.e. 30 cP or more, it is possible to surely increase drying rate of the solvent in the ejected material after landing. This surely improves positional accuracy of the spacer. Moreover, in case where the spacer is formed with the droplet ejected from the nozzle, the number of times of ejections, i.e. the number of the layers in the lamination increase because thickness of a spacer formed with the single droplet is thin. This increase production time. However, the high concentration of the droplet (ejected material) can suppresses the increases in the number of times of ejections, i.e. the number of the layers in the lamination. As a result, productivity can be improved.

In the method for producing the liquid crystal array, that substrate on which the spacer is to be formed may be configured such that a color filter is formed on a transparent substrate, the color filter colored with at least three colors or more.

In the method for producing the liquid crystal array, that substrate on which the spacer is to be formed is an active matrix substrate in which an active element is provided per pixel.

Furthermore, the inventors of the present invention made diligent studies on a technique to enable (i) control of movement amount of a droplet after the droplet ejected from a nozzle is landed and before the landed droplet is dried, (ii) accurate and easy formation of a color filter having a thick thickness. In diligently studying on the technique, the inventors predicted that a certain combination of parameters such as droplet diameter of a liquid (ink) containing a color filter layer material gives a region in which the droplet (ink) is dried immediately after landing. Further, the inventors accomplished an inkjet method that allows ejection under such condition.

By performing the ejection of the droplet according to this inkjet method, it is possible to cause the droplet to dry immediately after the landing of the droplet, thereby avoiding expansion of the droplet, and thus enabling formation of the color filter layer by repeating droplet application.

A method of the present invention is for producing a color filter substrate, the method comprising ejecting droplets of a liquid via an ejection hole of a nozzle by an inkjet method so as to form a color filter layer, and the liquid comprising a color filter layer material. The method of the present invention is arranged such that an electrostatic attraction type inkjet apparatus is used whose ejection hole is smaller than a diameter of the droplets; and the droplets are ejected from the nozzle of the electrostatic attraction type inkjet apparatus in such a manner that each of the droplets is 1 pl or less in amount.

Moreover, an apparatus of the present invention is for producing a color filter layer substrate, the apparatus adopting an inkjet method to eject droplets of a liquid via an ejection hole of a nozzle so as to form a color filter layer, and the liquid comprising a color filter layer material. The apparatus of the present invention is arranged such that the ejection hole of the nozzle has a diameter smaller than a diameter of the droplets, the inkjet method is of electrostatic attraction type, and each of the droplets ejected via the nozzle is 1 pl or less in amount.

With these arrangement, in which the amount of the single droplet ejected from the nozzle is 1 pl or less, the droplet dries immediately after landed on a color filter layer formation region on a substrate. This makes it difficult for the droplet to move after landing on the substrate, thereby making it possible to form the color filter layer with accurate positioning. The same is true in a case in which a plurality of the droplets are ejected to form a color filter layer having a predetermined thickness by forming lamination with the droplets. These arrangements prevents movement of the droplets landed on another droplet having previously landed.

With this arrangement, the method of the present invention allows to utilize the advantage of the inkjet method and especially makes it possible to easily and inexpensively form an organic luminescent layer without requiring formation of a barrier around a color filter layer formation region (pixel region) and formation liquid-repelling region, a liquid-affinitive region and the like.

Moreover, the user of the electrostatic attraction type inkjet device whose nozzle has a diameter smaller than the diameter of the droplet makes it possible to eject the droplet with a minute diameter of 1 pl or less, while keeping the applied voltage for generating an electric field used for performing electrostatic attraction type. Moreover the ejection of the droplet can be stably performed because in the use of the electrostatic attraction type inkjet device the electric charge can be easily concentrated in the droplets in ejecting and thus variation of an electric field strength around the droplet becomes small. As a result, it becomes possible to repeatedly eject the droplet in high-frequency ejection operation, thereby improving production efficiency.

If the nozzle diameter is 13 μm or less, the amount of the droplet may be 1 pl or less. Moreover, it is necessary in the production of the color filter substrate that the concentration of the color filter layer be not less than a predetermined value after the application of the droplet. Therefore, in case where a minute droplet is used as in the present invention, the ejection of the droplet is carried out with respect to a same color filter layer formation region in plural times.

In the method for producing the color filter substrate, the liquid may be used whose volumetric concentration is determined from a number of layers formed with the droplets by repeating the ejection onto the same color filter layer formation region.

The smaller the ejected droplet is, the thinner the color filter layer formed with a single droplet, whereby it is required that lamination of layers be formed with a plurality of the droplets in order to attain a predetermined thickness. In this case, the increase in the number of the layer prolongs operation time. Therefore, used is a liquid (ink) having a volumetric concentration that is determined from the number of the layers formed with the droplets repeatedly ejected on the same color filter layer formation region. In this way, the volumetric concentration of the liquid is adjusted according to the number of the layer. In this case, the number of the layers is decreased by setting the volumetric concentration of the liquid to be high. This reduces a number of times to eject and improves production efficiency.

A method of the present invention is for producing a color filer substrate by an inkjet method to eject droplets of a liquid via an ejection hole of a nozzle so as to form a color filter layer, the liquid comprising a color filter layer material. The method of the present invention is arranged such that an electrostatic attraction type inkjet apparatus is used, the electrostatic attraction type inkjet apparatus being for ejecting droplets via its nozzle in such a manner that each of the droplets is 1 pl or less in amount; and the liquid has a volumetric concentration η (%) that is substantially $\beta' t/(\alpha' D)$, where α is a number of layers to be formed with the droplets repeatedly ejected on a same color filter layer formation region, β is a value obtained from a ratio between the diameter of the droplets and a diameter of landed droplets in the color filter layer formation region, D is the diameter of the droplets, and t is a thickness of the color filter layer to be formed.

An apparatus of the present invention is for producing a color filter substrate, the apparatus adopting an inkjet method to eject droplets of a liquid via an ejection hole of a nozzle so as to form a color filter layer, the liquid comprising a color filter layer material. The apparatus of the present invention is arranged such that the inkjet method is of an electrostatic attraction type and each of the droplets ejected is 1 pl or less in amount; and the liquid has a volumetric concentration η (%) that is substantially $\beta' t/(\alpha' D)$, where α is a number of layers to be formed with the droplets repeatedly ejected on a same color filter layer formation region, β is a value obtained from a ratio between the diameter of the droplets and a diameter of landed droplets in the color filter layer formation region, D is the diameter of the droplets, and t is a thickness of the color filter layer to be formed.

With these arrangement, in which the amount of the single droplet ejected from the nozzle is 1 pl or less, the droplet dries immediately after landed on a color filter layer formation region on a substrate. This makes it difficult for the droplet to move after landing on the substrate, thereby making it possible to form the color filter layer with accurate positioning. The same is true in a case in which a plurality of the droplets are ejected to form a color filter layer having a predetermined thickness by forming lamination with the droplets. These arrangements prevents movement of the droplets landed on another droplet having previously landed.

With this arrangement, the method of the present invention allows the inkjet method to effectuate its advantage, and especially makes it possible to form the color filter layer easily and with low cost without forming (i) a barrier around the color filter layer formation region (pixel region), (ii) liquid-repelling region and liquid-affinitive region, and the like.

The smaller the ejected droplet is, the thinner the color filter layer formed with a single droplet, whereby it is required that lamination of layers be formed with a plurality of the droplets in order to attain a predetermined thickness. In this case, the increase in the number of the layer prolongs operation time. Therefore, the volumetric concentration of the liquid (ink) is set to be high, satisfying the above equation. This reduces the number of the layers of the lamination, thereby reducing the number of the times of ejection and improving the production efficiency. The approximation range may be, for example, ±10%, taking unevenness of the amount of the droplets into consideration.

The method for producing the color filter substrate may be arranged such that the ejection hole of the electrostatic attraction type inkjet apparatus is smaller than the liquid crystal in diameter.

According to the arrangement, it is possible to eject a minute droplet of 1 pl or less, but a low applied voltage still can be used for generating the electric field for electrostatic attraction. Moreover, the electric charge can be easily concentrated in the droplet in ejecting the droplet. Thus, the variation of the ambient electric field intensity around the droplet becomes small. Thus, stable ejection is attained. As a result, it becomes possible to release the droplet continuously, with ejection driving using a high frequency. This improves productivity.

The method for producing the color filter substrate may be arranged such that the liquid has a viscosity of 20 cP or more.

With this arrangement, the use of the highly viscous ink having viscosity of 20 cP or more as the liquid (ink) reduces the number of the layers to be made with the plurality of droplets. Thus, the number of ejection is reduced, thereby improving the productivity.

A color filter substrate of the present invention is produced by any one of the methods.

Additional objects, features, and strengths of the present invention will be made clear by the description below. Further, the advantages of the present invention will be evident from the following explanation in reference to the drawings.

BRIEF DESCRIPTION OF DRAWINGS

FIG. 2(a) illustrates a state before ink is ejected, FIG. 2(b) illustrates the ink sticking out from the nozzle, and FIG. 2(c) illustrates a state immediately before a droplet is ejected.

FIGS. 3(a) and 3(b) are graphs indicating distributions of electric field strength at a leading edge of a nozzle of an electrostatic attraction type inkjet apparatus, in a case where a diameter of the nozzle is φ0.2 μm. FIG. 3(a) indicates the distribution in a case where a distance between a counter electrode and the nozzle is 2000 μm, and FIG. 3(b) indicates a case where the distance is 100 μm.

FIGS. 4(a) and 4(b) are graphs indicating distributions of the electric field strength at the leading edge of the nozzle of the electrostatic attraction type inkjet apparatus, in a case where the diameter of the nozzle is φ0.4 μm. FIG. 4(a) indicates the distribution in a case where the distance between the counter electrode and the nozzle is 2000 μm, and FIG. 4(b) indicates a case where the distance is 100 μm.

FIG. 5(a) indicates the distribution in a case where the distance between the counter electrode and the nozzle is 2000 μm, and FIG. 5(b) indicates a case where the distance is 100 μm.

FIG. 6(a) indicates the distribution in a case where the distance between the counter electrode and the nozzle is 2000 μm, and FIG. 6(b) indicates a case where the distance is 100 μm.

FIG. 7(a) indicates the distribution in a case where the distance between the counter electrode and the nozzle is 2000 μm, and FIG. 7(b) indicates a case where the distance is 100 μm.

FIGS. 8(a) and 8(b) are graphs indicating distributions of the electric field strength at the leading edge of the nozzle of the electrostatic attraction type inkjet apparatus, in a case where the diameter of the nozzle is φ50 μm. FIG. 8(a) indicates the distribution in a case where the distance between the counter electrode and the nozzle is 2000 μm, and FIG. 8(b) indicates a case where the distance is 100 μm.

FIGS. 10(a) through 10(c) show example arrangements of a light emitting layer in the organic EL display of the embodiment in accordance with the present invention. FIG. 10(a) is a plane view illustrating an example of a stripe-arrangement of pixels, FIG. 10(b) is a plane view illustrating an example of a mosaic-arrangement of the pixels, and FIG. 10(c) is a plane view illustrating an example of a delta-arrangement of the pixels.

FIGS. 12(a) through 12(c) are longitudinal sectional views illustrating manufacturing processes of the organic EL display shown in FIG. 9. FIG. 12(a) illustrates a process of forming a first electrode, FIG. 12(b) illustrates a process of forming hole transport layer, and FIG. 12(c) illustrates a process of forming an organic EL layer.

FIG. 13(a) illustrates a process of forming an R-light emitting pixel, FIG. 13(b) illustrates a process of forming a G-light emitting pixel, and FIG. 13(c) illustrates a process of forming a B-light emitting pixel.

FIG. 25(a) illustrates a process of forming a black matrix, FIG. 25(b) illustrates a process of forming a color filter for (R)luminescent pixel, FIG. 25(c) illustrates a process of forming a color filter for (G)luminescent pixel, and FIG. 25(d) illustrates a process of forming a color filter for (B)luminescent pixel.

FIG. 28(a) illustrates an initial state of the process, FIG. 28(b) illustrates an intermediate state of the process, and FIG. 28(c) illustrates a latter state of the process.

FIG. 31(a) illustrates an observation process for observing the spacers being dispersed, and FIG. 31(b) illustrates a process of dispersing aggregated spacers found in the observation process.

FIGS. 33(a) through 33(c) show example arrangements of color filter pixels in the color filter substrate of the yet another embodiment in accordance with the present invention. FIG. 33(a) is a plane view illustrating an example of a stripe-arrangement of color filter pixels, FIG. 33(b) is a plane view illustrating an example of a mosaic-arrangement of the color filter pixels, and FIG. 33(c) is a plane view illustrating an example of a delta-arrangement of the color filter pixels.

FIG. 37(a) illustrates a substrate on which a liquid-affinitive region and a liquid-repellent region are formed, FIG. 37(b) illustrates a state in which a droplet is landed on the substrate shown in FIG. 37(a), and FIG. 37(c) illustrates a state in which the droplet landed is separated.

BEST MODE FOR CARRYING OUT THE INVENTION

[Embodiment 1]

The following describes a preferred embodiment of the present invention with reference to the drawings. First described, with reference to FIG. 1, is an electrostatic attraction type inkjet apparatus for use in manufacturing an active matrix type organic EL display element of the present embodiment.

Figure 1:
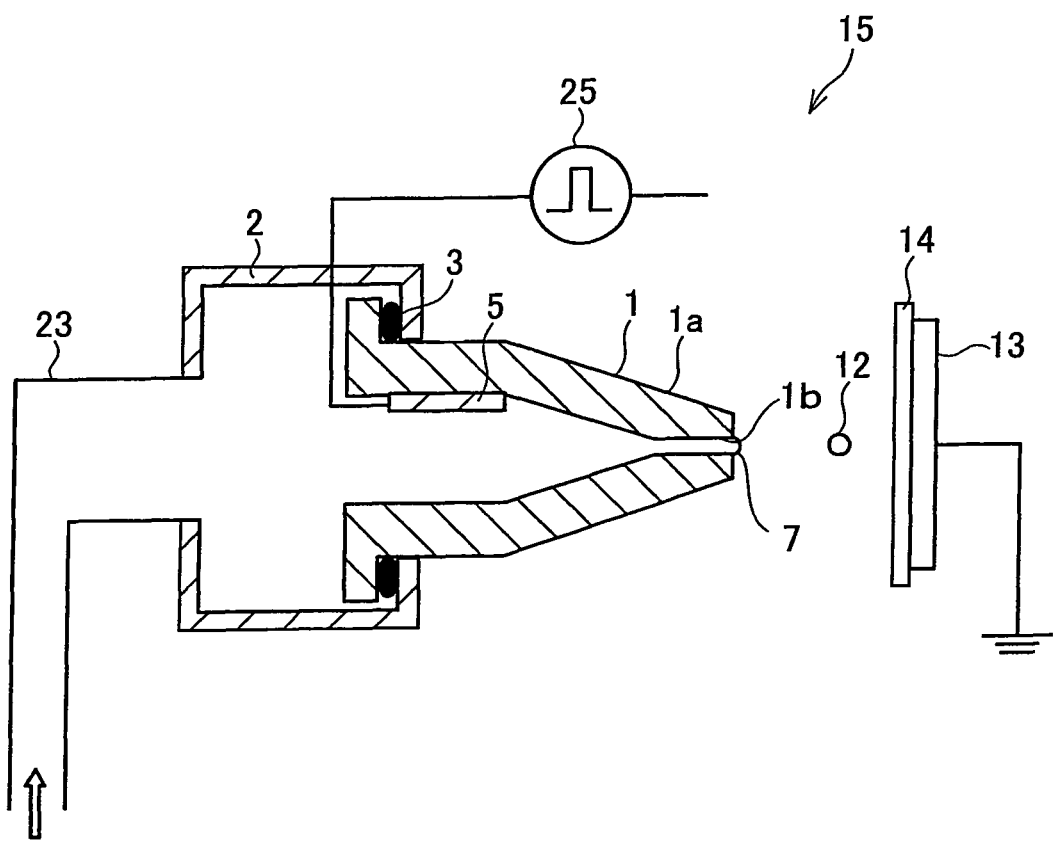
FIG. 1 is an embodiment of the present invention and is a cross sectional view illustrating an overview of an inkjet apparatus for use in manufacturing an organic EL display.

FIG. 1 is a longitudinal sectional view of an inkjet apparatus 15. The inkjet apparatus 15 is provided with a nozzle 1 for ejecting ink being stored in an ink chamber 2.

The nozzle 1 is connected with the ink chamber 2 via a packing 3. In this way, sealing is provided so that the ink in the ink chamber 2 does not leak from a joint section of the ink chamber 2 and the nozzle 1. Further, the nozzle 1 has an orifice 1a having such a shape that a diameter of the orifice 1a gradually becomes smaller toward a side opposite to the joint section of the nozzle 1 and the ink chamber 2, i. e., toward a leading edge of the nozzle 1 from which the ink is ejected. A diameter (Hereinafter referred to as nozzle diameter) of an ejection hole 1b on the leading edge of the nozzle 1 is set on a basis of a relationship with a droplet of the ink immediately after being ejected.

The ink ejected from the nozzle 1 is hereinafter referred to as droplet 12, in order to distinguish the ink ejected from the nozzle 1 from the ink being stored in the ink chamber 2. A relationship between the diameter of the ejection hole 1b and a diameter of the droplet 12 immediately after being ejected are described in detail later.

Inside the nozzle 1, a nozzle electrode 5 for applying an electrostatic field to the ink is provided. To this nozzle electrode 5, a predetermined voltage is applied from a process control section 25. In this way, the process control section 25 controls an electric field strength between the nozzle electrode 5 and a counter electrode 13. By controlling the electric field strength, a diameter of the droplet 12 being ejected from the nozzle 1 is adjusted. Further, the droplet 12 ejected from the nozzle 1 towards the counter electrode 13 is accelerated by the electric field generated between the nozzle electrode 5 and the counter electrode 13.

A solution of the ink filled in the ink chamber 2 is supplied via an ink supplying route 23 from an ink tank (not shown) being connected with the ink chamber 2.

Here, the ink chamber 2 and the nozzle 1 are kept filled with the ink, and a negative pressure is applied to the ink. Toward a side facing the ejection hole 1b of the nozzle 1, the counter electrode 13 is arranged in a position which is in a predetermined distance from the nozzle 1. The counter electrode 13 is for electrically charging a surface of a recording treatment substrate 14 arranged on a surface facing the nozzle 1. The counter electrode 13 electrifies the recording treatment substrate 14 in an electric potential having the opposite polarity from a charged electric potential of the droplet 12 being ejected from the ejection hole 1b of the nozzle 1. With this arrangement, the droplet 12 ejected from the ejection hole 1b of the nozzle 1 is stably landed on the recording treatment substrate 14.

As described, it is necessary that the droplet 12 be electrically charged. Therefore, it is preferable that at least an ink ejection surface of the leading edge of the nozzle 1 be made of an insulative material. Further, since it is necessary to form the ejection hole 1b having a microscopic diameter. Thus, in the present embodiment, a glass capillary tube is used as the nozzle 1.

Here, the following describes a behavior of a meniscus (meniscus portion) 7 formed in the vicinity of the ejection hole 1b, when the ink is ejected as the droplet 12 from the nozzle 1.

Figure 2:
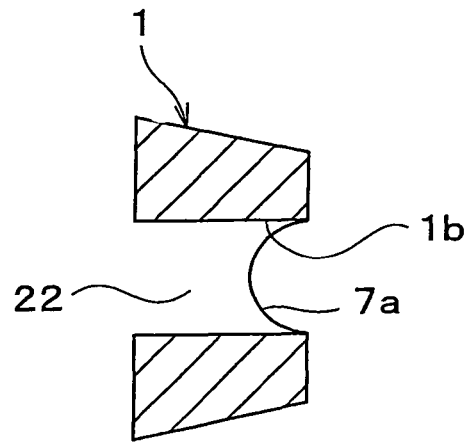
FIGS. 2(a) to 2(c) are explanatory figures illustrating a meniscus behavior in a nozzle shown in FIG. 1.
Figure 2:
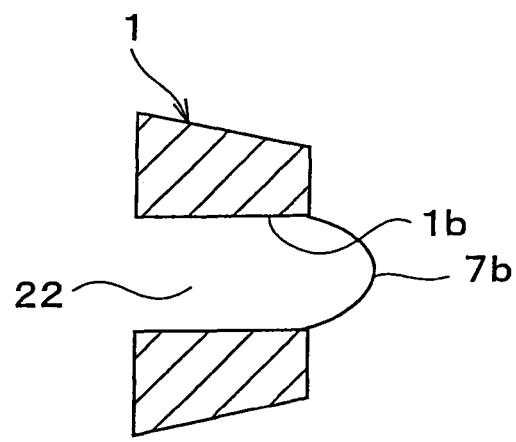
Figure 2:
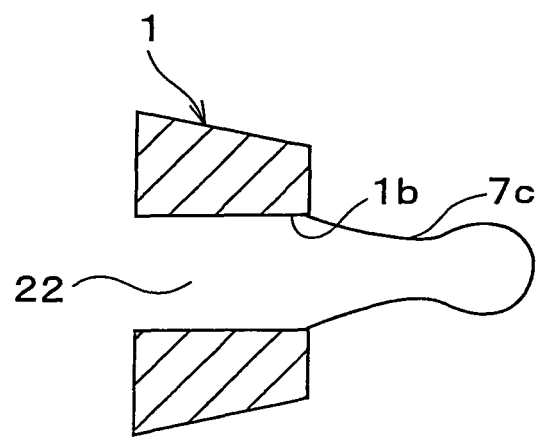
Figure 5:
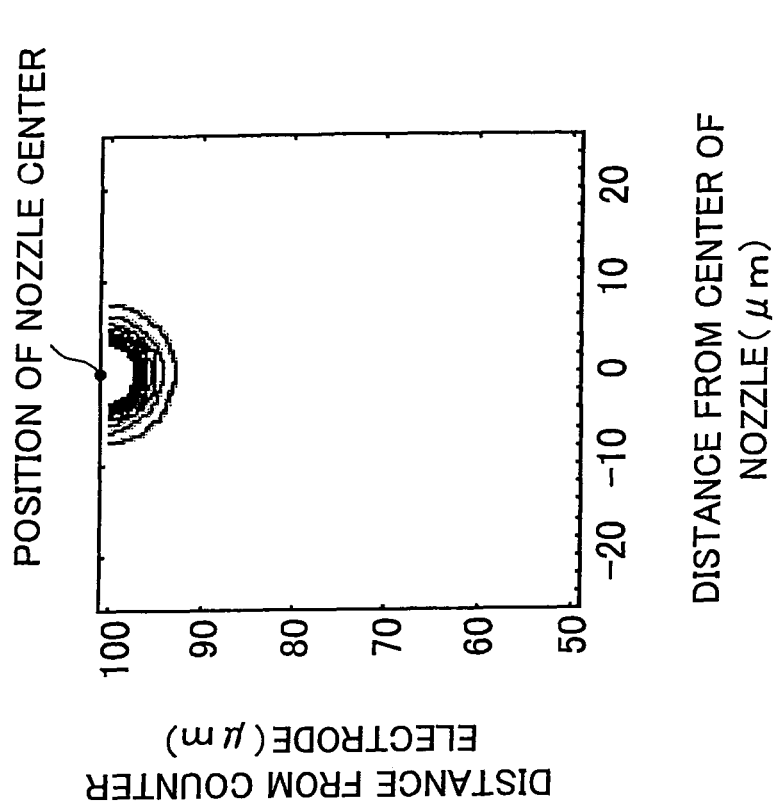
FIGS. 5(a) and 5(b) are graphs indicating distributions of the electric field strength at the leading edge of the nozzle of the electrostatic attraction type inkjet apparatus, in a case where the diameter of the nozzle is φ1 μm.
Figure 5:
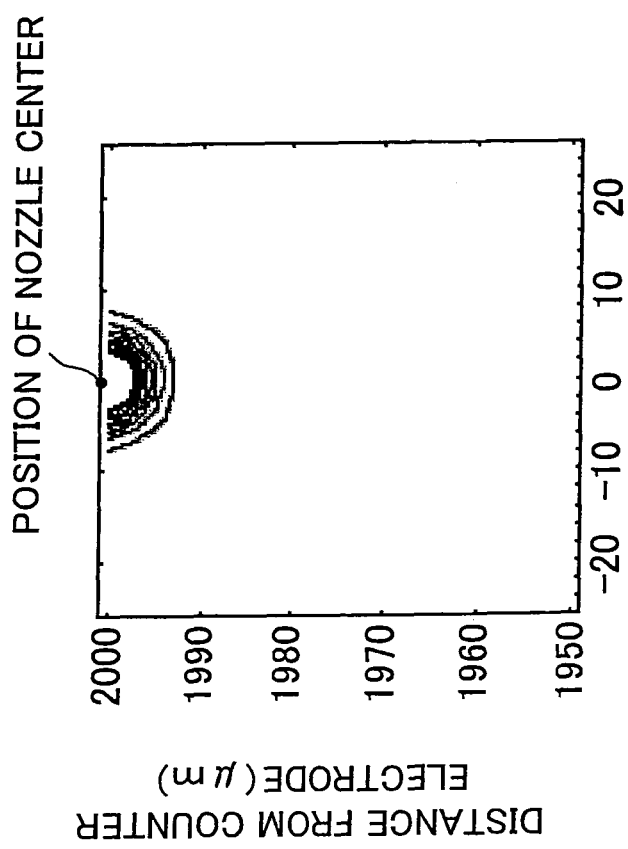
Figure 6:
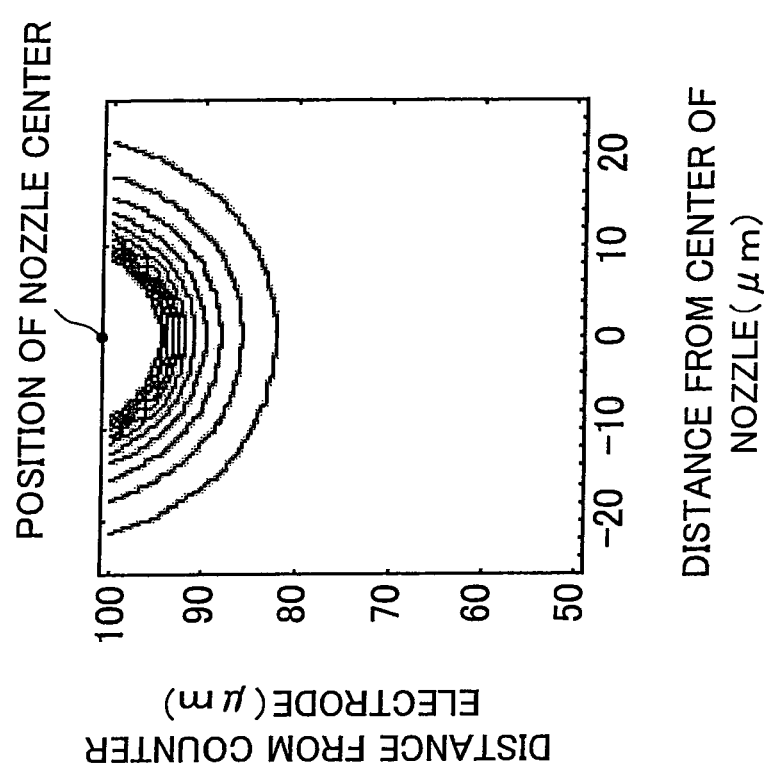
FIGS. 6(a) and 6(b) are graphs indicating distributions of the electric field strength at the leading edge of the nozzle of the electrostatic attraction type inkjet apparatus, in a case where the diameter of the nozzle is φ8 μm.
Figure 6:
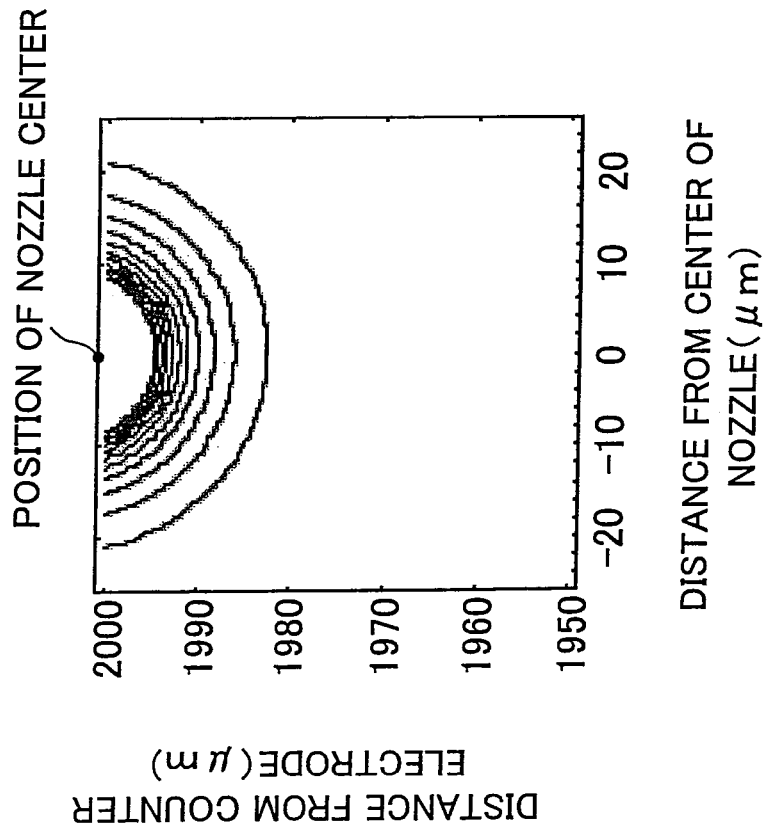

FIGS. 2(a) to 2(c) are model figures illustrating a behavior of the meniscus 7 in the vicinity of the ejection hole 1b. First, as illustrated in FIG. 2(a), since ink 22 is under negative pressure before the ink 22 is ejected, a meniscus 7a is formed in a concave-shape within the leading edge of the nozzle 1. Next, a voltage applied to the nozzle electrode 5 is controlled by the process control section, in order to eject the ink 22. When the predetermined voltage is applied to the nozzle electrode 5, an electric charge is induced to a surface of the ink 22 in the nozzle 1, thus forming a meniscus 7b in such a shape as illustrated in FIG. 2(b) that the ink 22 is pulled toward the surface of the ejection hole 1b of the leading edge of the nozzle 1; i.e., toward the counter electrode (not shown). At this point, since the diameter of the nozzle 1 is minute, the meniscus 7b is attracted towards the outside at the beginning, thus forming a Taylor cone shape.

Then, as illustrated in FIG. 2(c), the meniscus 7b attracted toward the outside forms a meniscus 7c in such a shape that the ink 22 is further ejected toward the counter electrode (not shown), and a droplet to be ejected is formed as a result of prevalence of (A) the electric charge induced to a surface of the meniscus 7c and a force of the electrical field (electric field strength) generated in the nozzle 1 over (B) a surface tension of the ink 22. The present embodiment uses the nozzle 1 whose diameter (Hereinafter referred to as nozzle diameter) of the ejection hole 1b is no more than $\phi 8$ μm (e.g. 5 μm). In this case where the nozzle diameter of the nozzle 1 is microscopic, a curvature radius of a leading edge of the meniscus is not gradually reduced by concentrated surface electric charge, unlike a conventional case, and the curvature radius is deemed as to be constant.

Therefore, if physical property values of the ink are constant, the surface tension of the droplet which the droplet has when separating off is substantially constant, in a case where the droplet is ejected with an application of the voltage. Further, an amount of the surface electric charge being concentrated surpasses the surface tension of the ink, that is, the value of the surface electric charge is no more than a value where Rayleigh separation occurs. Therefore, a maximum amount of the surface electric charge is uniformly defined. The electric field strength does not cause a problem, because the electric field is significantly strong only in the vicinity of the meniscus 7, and a resistance against a discharge breakdown is very high in such a high electric field in an extremely small region. The ink used in the inkjet apparatus 15 of the present embodiment may be dye-type ink including pure water and ink containing microparticles. In a case of using the ink containing the microparticles, it is necessary that a diameter of the microparticle contained in the ink be small, because the nozzle is much smaller than a conventional nozzle. In general, clogging hardly occurs with the microparticles having the diameter of approximately 1/20 to 1/100 of the nozzle diameter.

Accordingly, a diameter of the microparticle in the ink will be 50 nm or less, in a case where the nozzle diameter of the nozzle 1 in the present embodiment is, for example, $\phi 5$ μm.

In this case, the diameter of the microparticles of the ink is much smaller than a smallest diameter of conventionally used microparticles whose diameter is $\phi 100$ nm. Because of this, a moving speed of the charged microparticles in the ink is slowed down in using a method for ejecting the ink containing the microparticles such as a mechanism disclosed in Japanese Laid-Open Patent Application No. 2000-127410 (Tokukai 2000-127410; published on May 5, 2000), in which (I) the electric charge of the meniscus 7 is concentrated by movement of the particulates caused by electrification of the particulates, and (II) the ink is ejected by electrostatic repulsion among the microparticles being concentrated. This causes slowing down of an ejection response speed and a recording speed.

On the contrary, in the inkjet apparatus 15 of the present embodiment, instead of ejecting the ink by using the electrostatic repulsion force among the charged microparticles, the ink is ejected by using the electric charge of a meniscus surface as in a case of using the ink not containing the microparticles. In this case, in order to avoid an unstable ejection caused by the electric charge of the microparticles in the ink affecting the electric charge of the meniscus surface, it is preferable that an electric charge amount of the microparticle be much less than the electric charge of the meniscus surface.

The electrostatic repulsion force among the microparticles and the response speed are reduced, if the electric charge amount of the microparticles in the ink per unit mass is 10 μC/g or less. Further, a total electric charge amount of the microparticles in the ink is reduced by reducing a mass of the ink microparticle, i.e., reducing the diameter of the ink microparticle. Table 1 below indicates an ejection stability of a case where an average diameter of the microparticles in the ink is between $\phi 3$ nm to $\phi 50$ nm.

TABLE 1

| Diameter of | Nozzle Diameter | | | |
|---|---|---|---|---|
| Microparticles | $\phi 0.4$ μm | $\phi 1$ μm | $\phi 4$ μm | $\phi 8$ μm |
| $\phi 50$ nm | X | Δ | Δ | Δ |
| $\phi 30$ nm | O | O | O | O |
| $\phi 10$ nm | O | O | O | O |
| $\phi 3$ nm | O | O | O | O |

Symbols in Table 1 indicates the ejection stability of each nozzle.
X represents no ejection due to clogging or the like.
Δ represents instable ejection when ejecting consecutively.
O represents stable ejection.

Based on Table 1, it is found that the diameter of the microparticles is preferably $\phi 30$ nm or less. Particularly in a case where the diameter of the microparticles is $\phi 10$ nm or less, the electric charge amount of a single grain of the microparticles in the ink is such that influence of the electric charge is almost negligible, and that the moving speed based on the electric charge is significantly slowed down. Therefore, the microparticles are not concentrated at the center of the meniscus. Further in a case where the nozzle diameter is $\phi 3$ μm or less, a maximum electric field strength is extremely high, due to concentration of the electric field at the meniscus portion. This causes an increase in an electrostatic force per grain of the microparticles. Accordingly, it is preferable that the ink contain the microparticles of $\phi 10$ nm or less. However, if the diameter of the microparticles is less than $\phi 1$ nm, it is more likely that the microparticles are aggregated, or that the concentration becomes uneven. Therefore, the diameter of the microparticles is preferably between a range of $\phi 1$ nm to $\phi 10$ nm.

The following describes a relationship between the nozzle diameter of the nozzle 1 and the electric field strength with reference to FIGS. 3(a) and 3(b) through FIGS. 8(a) and 8(b).

FIGS. 3(a) and 3(b) through FIGS. 7(a) and 7(b) respectively illustrate distributions of electric field strength where the nozzle diameter was $\phi 0.2$, 0.4, 1, 8, or 20 μm. Further, FIGS. 8(a) and 8(b) respectively illustrate, for reference, a distribution of electric field strength in a case of using a conventionally used nozzle having a diameter of 50 μm. Here, in each of the figures, "position of nozzle center" indicates a central position of the ink ejecting surface of the ejection hole 1b of the nozzle 1.

Further, in each of the figures, figures (a) indicate the distributions of the electric field strength in a case where a distance between the nozzle 1 and the counter electrode 13 was set at 2000 μm, and figures (b) indicate the distributions of the electric field strength in a case where the distance between the nozzle 1 and the counter electrode 13 was set at 100 μm. In each of the cases, a same voltage of 200 V was applied. A distribution line in each figure was a range of the electric field strength between $1 \times 10^6$ V/m and $1 \times 10^7$ V/m.

Table 2 below indicates the maximum electric field strength under each condition.

TABLE 2

| Nozzle Diameter (μm) | Gap (μm) | | Variation Rate (%) |
|---|---|---|---|
| | 100 | 2000 | |
| 0.2 | $2.001 \times 10^9$ | $2.00005 \times 10^9$ | 0.05 |
| 0.4 | $1.001 \times 10^9$ | $1.00005 \times 10^9$ | 0.09 |
| 1 | $0.401002 \times 10^9$ | $0.40005 \times 10^9$ | 0.24 |
| 8 | $0.0510196 \times 10^9$ | $0.05005 \times 10^9$ | 1.94 |
| 20 | $0.0210476 \times 10^9$ | $0.0200501 \times 10^9$ | 4.98 |
| 50 | $0.00911111 \times 10^9$ | $0.00805 \times 10^9$ | 13.18 |

Figure 7:
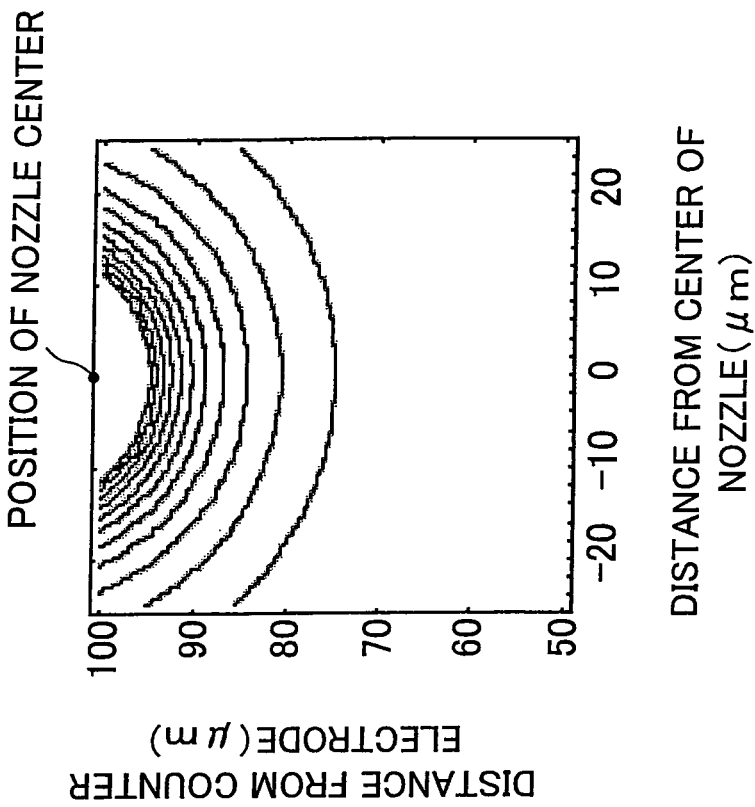
FIGS. 7(a) and 7(b) are graphs indicating distributions of the electric field strength at the leading edge of the nozzle of the electrostatic attraction type inkjet apparatus, in a case where the diameter of the nozzle is φ20 μm.
Figure 7:
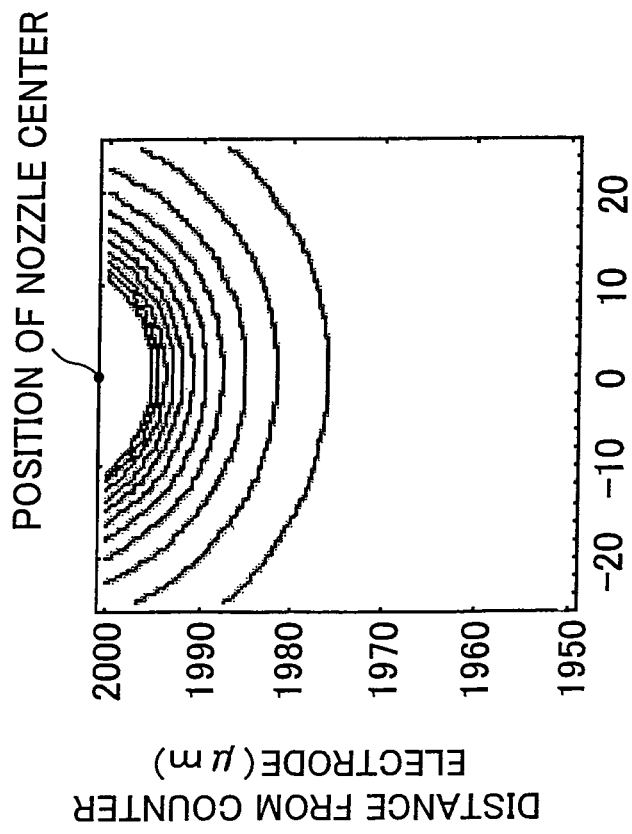

From FIGS. 3(a) and 3(b) through FIGS. 8(a) and 8(b), it was found that the electric field strength was distributed in a wider area with the nozzle diameter of not less than φ20 μm (FIGS. 7(a) and 7(b)).

Further, based on Table 2, it is found that the distance between the nozzle and the counter electrode affects the electric field strength. Accordingly, in a case where the nozzle diameter is no more than φ8 μm (FIGS. 6(a) and 6(b)), the electric field strength is concentrated, and a change in the distance from the counter electrode barely influences the electric field strength. Thus, with the nozzle diameter of φ0 8 μm or less, it is possible to carry out the stable ejection regardless of positional accuracy of the counter electrode and unevenness in the thickness and material property of the recording medium.

In a piezo-electric type and a thermal type inkjet apparatus, an influence of an air resistance is significant in a case where the droplet 12 becomes a micro-droplet. This causes difficulties in accurately landing the droplet 12 on the recording medium.

Further, in a conventional electrostatic attraction method (e.g. Tokukaihei 8-238774), the electric field strength is concentrated in the center of the meniscus 7 by generating a strong electric field in a region larger than a projected area of the droplet 12 being ejected. This required that a very high voltage be applied to the nozzle electrode, thus causing difficulties in controlling a driving operation. Further, the resistance against a discharge breakdown also restricts a formable size of the minute droplet.

In the electrostatic attraction type inkjet apparatus 15 of the present embodiment, the nozzle diameter is smaller than the diameter of the droplet immediately after being ejected. This allowed a region in which the electric charge is concentrated to be substantially equal to a region of the meniscus 7. As a result, the voltage applied to the nozzle electrode 5 is significantly reduced, and the electric field strength of the meniscus 7 is remarkably increased.

Therefore, in the inkjet apparatus 15, the droplet 12 charged with the electric charge is appropriately accelerated by the electric field, whereby the slowing down of the droplet due to the air resistance is restrained. As a result the landing accuracy is improved. Further, by constantly applying a pressure to the inside of the nozzle 1, the meniscus 7 in a Taylor cone shape is formed on the ejection hole 1b. This causes the electric charge to be easily concentrated on the meniscus 7. Therefore, the droplet 12 can be ejected with an application of several hundred voltage to the nozzle electrode 5.

The inkjet apparatus 15 of the present embodiment has the following features.

Firstly, a force is applied to the charged droplet 12 by the electric field generated between the nozzle electrode 5 and the counter electrode 13. Therefore, even if the influence from the air resistance increases because the droplet 12 is the minute droplet, the landing accuracy (a positional accuracy of landing on the recording-subjected-side substrate 14) of the droplet 12 is improved.

Secondly, even highly viscous ink can be ejected as the droplet 12. Ejection of ink having the viscosity of 70 cP has been actually realized. Since the highly viscous ink can be ejected, it is possible to increase the concentration of the ink.

The viscosity of ink in general is in inverse relation to a growth rate of the meniscus 7. High viscosity does not allow the meniscus 7 to grow in a sufficient size, and makes it impossible to eject the droplet. However, in the inkjet apparatus 15 of the present embodiment, the growth rate of the meniscus 7 is not dependent on the viscosity of the ink, but is dependent on the surface tension and the amount of charge. As such, even if solute is dissolved up to a maximum solubility thereof, it is possible to eject the ink.

Thirdly, the solvent of the ink is instantaneously dried off after the droplet 12 lands. A volume of the solvent of the droplet 12 is proportional to a power 3 of the droplet diameter. Therefore, an energy needed for evaporating the solvent is also proportional to a power 3 of the droplet diameter. Further, the droplet 12 is more easily evaporated with a smaller value of (volume)/(surface area). Therefore, a smaller size of the droplet is more advantageous.

In the conventional inkjet apparatus, the size of the ejected droplet is large, and a long time is needed for the solvent to be evaporated off.

Further, a sufficient flying speed is not obtained by merely reducing the size of the droplet to a microscopic size. Further, a heat of vaporization for evaporating off the solvent content of the droplet is not obtained by merely converting a kinetic energy to a heat energy. Therefore the solvent is not instantaneously dried off after landing.

However, in the inkjet apparatus (submicron head) 15, a sufficient flying speed is obtained despite a reduced volume of the droplet. Thus, the solvent is instantaneously dried off after landing. In order to confirm the forgoing points, the following experiments were conducted. Results of the experiments are described below.

Tables 3 through 5 indicates comparison of properties in (I) cases of using inkjet apparatuses of conventional inkjet methods, i.e., piezo-electric type, thermal type, and an electrostatic attraction type from which a droplet having a large droplet diameter is ejected, and (II) a case of using the inkjet apparatus 15 of the present embodiment in accordance with the present invention, i.e., the electrostatic attraction type inkjet apparatus 15 from which a droplet of small diameter is ejected.

TABLE 3

Influence given according to the droplet volume

| Droplet Vol. | Landing Accuracy | | Easiness of Ejection | | Drying Rate | No. of Landing |
|---|---|---|---|---|---|---|
| | C | P | C | P | P | P |
| 0.1 pl | X | ○ | X | ○ | ◎ | Δ |
| 1 pl | X | ◎ | X | ◎ | ◎ | ○ |
| 10 pl | ○ | — | ○ | — | — | — |

C = Conventional
P = the present invention
◎: GOOD ○: EJECTABLE
Δ: NOT SUITABLE X: NOT EJECTABLE
—: OUT OF APPLICABLE RANGE Table 3 shows the landing accuracy of the droplet 12, easiness of ejection, drying rates, and influences of the volume of the droplet to a landing number. The landing number is how many times the ejection needs to be carried out for forming a single pixel. In terms of production efficiency, a smaller landing number is better.

In the case of using the inkjet apparatus 15 of the present invention, even the droplets having volumes of 0.1 pl and 1 pl resulted in usable or good, in terms of landing accuracy and easiness of ejection, while, in the conventional inkjet apparatuses, these droplets were not usable, in terms of all of the items. Further, in the inkjet apparatus 15 of the present embodiment, a good drying rate was obtained from the droplet having the volume of 0.1 pl and 1 pl. From the landing number, it was found that the droplet of 0.1 pl is not suitable (poor production efficiency), and the droplet of 1 pl is suitable (good production efficiency).

TABLE 4

Influences given according to the viscosity

| Viscosity | Conventional | The present invention |
|---|---|---|
| 2 cP | ⊚ | ⊚ |
| 10 cP | ○ | ⊚ |
| 20 cP | Δ | ⊚ |
| 70 cP | X | ⊚ |

⊚: GOOD
○: EJECTABLE
Δ: NOT SUITABLE
X: NOT EJECTABLE
—: OUT OF APPLICABLE RANGE

Table 4 shows suitability of various viscosities of the ink for the inkjet apparatus 15 of the present embodiment, and for the conventional inkjet apparatuses. The inkjet apparatus 15 of the present embodiment was capable of ejecting a highly viscous ink.

TABLE 5

Influence given according to the concentration

| | Easiness of Ejection | Drying Rate | No. of Landing |
|---|---|---|---|
| Concentration | C P | P | P |
| Low | ○ ⊚ | Δ | Δ |
| Medium | X ⊚ | ○ | ○ |
| High | X ⊚ | ⊚ | ⊚ |

C = Conventional
P = The present invention
⊚: Good
○: Ejectable
Δ: Not suitable
X: Not ejectable
—: Out of applicable range Table 5 shows suitability of various concentrations, i.e., easiness of ejection, in the inkjet apparatus 15 and the conventional inkjet apparatuses. Table 5 also shows the drying rate and the landing number resulted from the various concentrations.

As illustrated in Table 5, in terms of easiness in ejecting the ink, medium and high concentrations of the ink resulted in not-ejectable in the conventional inkjet apparatuses, while good results were obtained from low to high concentrations of the ink in the inkjet apparatus 15 of the present invention. Further, in the inkjet apparatus 15 of the present embodiment, the drying rate of the ink at a medium concentration resulted in feasible, and drying rate of the ink at a high concentration resulted in good. Further, the higher a concentration of the ink is, the smaller the landing number becomes, as such, a higher concentration is more suitable in terms of the production efficiency.

Based on the foregoing results, it is obvious that, with the inkjet apparatus 15 of the present embodiment, time taken for drying is remarkably reduced. Therefore, it is no longer necessary to provide a time for waiting a previously ejected droplet to dry on the substrate. As a result, it is possible to reduce time intervals of ejection at one position, and improve the production efficiency.

Further, since a highly concentrated ink can be ejected, it is possible to increase a percentage of the organic EL material contained in the single droplet. This allows a number of ejections to be reduced. A higher concentration of the ink causes a higher viscosity of the ink. However, the inkjet apparatus 15 of the present embodiment is capable of ejecting the highly viscous droplets, therefore, it is possible to eject the highly concentrated ink. As described, with a higher concentration, the number of ejections becomes less.

Next, the following describes an active matrix organic EL display (organic EL display system) being manufactured by using the inkjet apparatus 15 shown in FIG. 1, and a method for manufacturing the active matrix organic EL display.

Figure 9:
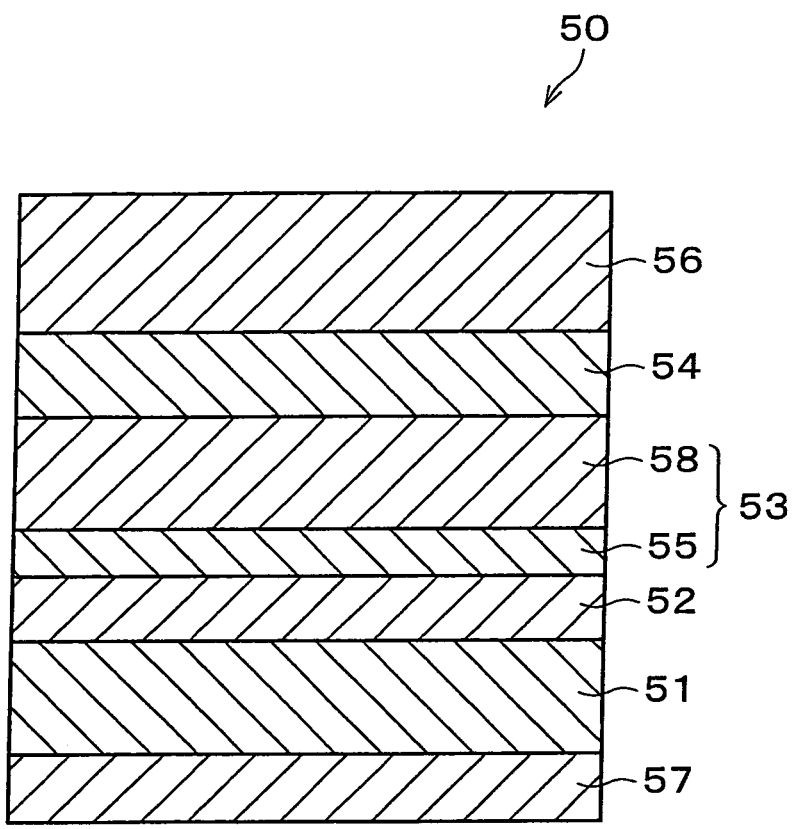
FIG. 9 is an organic EL element of the embodiment in accordance with the present invention, and is a longitudinal sectional view illustrating a schematic configuration of a single pixel of the organic EL element in the organic EL display.

FIG. 9 is a longitudinal sectional view illustrating a configuration of a single pixel of an organic EL element 50. As illustrated in FIG. 9, the organic EL element is provided at least with a substrate 51, a first electrode 52 provided on the substrate 51, an organic EL layer 53, and a second electrode 54. In terms of contrast, it is preferable that a polarizing plate 57 be provided on that surface of the substrate 51 which is an opposite side with respect to the first electrode 52.

Further, in terms of reliability, it is preferable that a sealing film or a sealing substrate 56 be provided on the second electrode 54.

In the organic EL element 50, the organic EL material is laminated and applied by using the foregoing inkjet apparatus 15 without causing a spreading of the droplet. Therefore, the organic EL layers of pixels adjacent to each other do not touch each other, or be mixed with each other. Further, the contrast between the pixels is made clear by causing a metal wiring (not shown) to serve as BM. Therefore, the barrier 105 formed in a conventional organic EL element shown in FIG. 22 becomes no longer necessary.

The substrate 51 may be (I) a substrate made of an inorganic material such as a silica substrate and a glass substrate, or (II) a resin substrate such as a polyethylene terephthalate substrate, a polyether sulfone substrate, a polyimide substrate. However, the present invention is not limited to these.

The organic EL layer 53 has at least one layer of an organic light emitting layer.

The organic EL layer 53 may be a single-layered structure of an organic light emitting layer, or a multilayered structure including a charge transport layer (electron transport layer or a hole transport layer) and the organic light emitting layer. Further, the charge transport layer and the organic light emitting layer may be multilayered structure respectively.

Further, a buffer layer may be provided as needed, between the light emitting layer and the electrode. In the present embodiment, "organic layers" means the organic light emitting layer and the charge transport layer, each constituting the organic EL layer 53.

At least one layer in the organic EL layer 53 is formed with an application liquid by the inkjet method, the application liquid being for organic EL layer formation. In a case where the structure of the organic EL layer 53 is the multilayered structure, formation of the other layers, except formation of the at least one of the organic light emitting layer and the charge transport layer, may be performed by (I) the inkjet method, or (II) a conventional dry process such as a vacuum deposition method, dip coating method, spin coating method or the like method.

In the present embodiment, the structure of the organic EL layer 53 is a laminated structure including the organic light emitting layer 58 and the charge transport layer 53. The charge transport layer 55 is formed by a printing method.

Next described is the application liquid for organic EL layer formation which is used as a material for the organic light emitting layer. The application liquid for organic EL layer formation is roughly classified into an application liquid for light emitting layer formation, and an application liquid for charge transport layer formation.

The application liquid for light emitting layer formation is a liquid prepared by dissolving or dispersing, in a solvent, a widely known luminescent material and leveling agent for use in the organic EL layer formation. The luminescent material may be a low-molecule luminescent material, a high polymer luminescent material, a precursor of a high polymer luminescent material, or a luminescent material including both of (a) a low-molecule luminescent material and (b) a high polymer material. Examples of the materials are listed in the following. However, these examples are not to limit the present invention.

Examples of the widely known low-molecule luminescent material are triphenylbutadiene, cumarin, Nile red, oxadiazole derivatives, and chelated complexes, and the like. Examples of the widely known high polymer luminescent material are poly(2-decyloxy-1, 4-phenylene) [DO-PPP], poly [2,5-bis{2-(N,N,N-triethylammonium) ethoxy}-1,4-phenylene-alt-1,4-phenylene]dibromide [PPP-NEt$_3$+], poly[2-(2'-ethylhexyloxy)-5-methoxy-1,4-phenylenevinylene] [MEH-PPV], poly[5-methoxy(2-propanoxysulfonide)-1,4-phenylenevinylene][MPS-PPV], poly[2,5-bis(hexyloxy-1,4-phenylene) (1-cyanovinylene)][CN-PPV], poly[2-(2'-ethylhexyloxy)-5-methoxy-1,4-phenylene(1-cyanovinylene)][MEH-CN-PPV], and poly(dioctylfluorene) (PDF) and the like. Further, examples of the widely known precursor of high polymer luminescent material are poly(p-phenylene) precursor [Pre-PPP], poly(p-phenylenevinylene) precursor [Pre-PPV], and poly(p-naphthalenevinylene) precursor [Pre-PNV], and the like. Examples of the widely known high polymer materials are polycarbonate (PC), polymethylmethacrylate (PMMA), and polycarbazole (PVCz), and the like.

The levelling agent may be a silicon-containing compound, a fluorine-containing compound, a non-ionic surfactant, an ionic surfactant, a titanate coupling agent, and the like. It is particularly preferable that the levelling agent be a silicon-containing compound, or a fluorine-containing compound.

The silicon-containing compound may be dimethyl silicone, methyl silicone, phenyl silicone, methylphenyl silicone, alkyl denatured silicone, alkoxy denatured silicone, polyether denatured silicone, and the like. It is preferable that silicon-containing compound be dimethyl silicone, or methylphenyl silicone. The fluorine-containing compound may be polytetrafluoroethylene, polyvinyliden fluoride, fluoroalkylmethacrylate, perfluoropolyether, perfluoroalkylethylene oxide, and the like.

As to a solvent for dissolving or dispersing the luminescent material therein, it is preferable in a case of forming the organic EL layer 53 made of a multi-layered-lamination film that a solvent used for formation of a layer formed later is such as solvent in which a layer formed earlier is not soluble, in order to prevent mixing of materials in an interface therebetween.

Examples of the solvent are ethylene glycol, propylene glycol, triethylene glycol, ethylene glycol monomethyl ether, ethylene glycol monoethyl ether, triethylene glycol monomethyl ether, triethylene glycol monoethyl ether, glycerin, N,N-dimethylformamide, N-methyl-2-pyrolidone, cyclohexanone, methanol, ethanol, 1-propanol, octane, nonane, decane, xylene, diethylbenzene, trimethylbenzene, nitrobenzene and the like. Two or more of these solvents may be used in combination as a mixed solvent.

Further, to the application liquid for light emitting layer formation, it is possible to add, as needed, an. additive for viscosity adjustment; a widely known hole transporting material for the organic EL or an organic photoconductor, such as N,N-bis-(3-methylphenyl)-N,N'-bis(phenyl) benzidine [TPD], N,N'-di(naphthalene-1-yl)-N, N'-diphenyl-benzidine [NPD]; an electron transport material, such as 3-(4-biphenylyl)-4-phenylene-5-t-butylphenyl-1,2,4-triazo-le [TAZ], tris (8-hydroxynate) aluminum [Alq3]; a dopant such as accepter and donor; and the like.

Another one of the application liquid for organic EL layer formation, i. e, the application liquid for charge transport layer formation, is a liquid prepared by dissolving or dispersing, in a solvent, a widely known charge transport layer material and leveling agent for use in the organic EL layer formation. The charge transport layer material may be a low-molecule charge transport layer material, a high polymer charge transport layer material, a precursor of a high polymer charge transport layer material, or a charge transport layer material including both of (a) a low-molecule charge transport material and (b) a high polymer material. Examples of the materials are listed in the following. However, these examples are not to limit the present invention.

Examples of a widely known low-molecule charge transport layer material are TPD, NPD, and oxadiazole derivatives and the like. Examples of the widely known high polymer charge transport material are polyaniline (PANI), 3,4-polyethylenedioxythiophene (PEDOT), polycarbazoles(PVCz), poly(triphenylamine derivatives) (Poly-TPD), poly(oxadiazole derivatives) (Poly-OXZ), and the like. Further, examples of the widely known precursor of high polymer charge transport material are Pre-PPV, Pre-PNV, and the like. Examples of the widely known high polymer material are PC, PMMA, PVCz, and the like.

The addition of the levelling agent is also effective for charge transport layer not containing the luminescent material. In this case, examples of the levelling agent may be the compounds listed for the application liquid for light emitting layer formation.

As to a solvent for dissolving or dispersing the charge transport layer material therein, it is preferable in a case of forming the organic EL layer 53 made of a multi-layered-lamination film that a solvent used for formation of a layer formed later is such as solvent in which a layer formed earlier is not soluble, in order to prevent mixing of materials in an interface therebetween.

It is possible to add, as needed, the additive for viscosity adjustment listed in the case of the application liquid for light emitting layer formation, and/or the dopant such as the accepter and the donor listed in the case of the same.

Here, the following further describes other materials of the organic EL layer 53. The followings are materials for forming the light emitting layer.

However, in the organic EL layer 53, even the organic light emitting layer 58 has charge transporting characteristics.

Examples of low-molecule based material are distyrylbiphenyl-based blue luminescent material, dimesitylboryl-group-bonded amorphous luminescent material, stilbene-base-conjugated dendrimer luminescent material, dipyrilyldicyanobenzene luminescent material, methylated-benzoxazole-based luminescent/phosphorescent material, distyryl-based red-luminescent material, heat-resistive carbazole-based green-luminescent material, dibenzochrysene-based blue-green-luminescent material, arylamine-based luminescent material, pyrene-substituted oligothiophene-based luminescent material, divinylphenyl-bonded triphenin-based luminescent material, perylene-based red-luminescent material, PPV oligomer-based luminescent material, (carbazolecyanoterephthalylidene)-based luminescent material, arylethynylbenzene-based blue-luminescent material, quinquepyridine-based luminescent material, fluorine-base star-shaped luminescent material, thiophene based amorphous patina-luminescent material, low-molar mass liquid crystal luminescent material, (acetonitrile-triphenyleneamine)-based red-luminescent dye, bithiazole-based luminescent material, (carbazolenaphthalimide)-based luminescent dye, sequisi phenyl-based blue-luminescent material, dimesitylborylanthracene-based luminescent material, and the like.

Examples of metal complex are oxadiazole-beryllium blue luminescent complexes, europium-based luminescent/phosphorescent complexes, heat-resistive lithium-based blue luminescent complexes, luminescent/phosphorescent phosphine-metal complexes, terbium-based luminescent complexes, thiophene-aluminum yellow luminescent complexes, zinc-based yellowish-green luminescent complexes, amorphous aluminum-based green luminescent complex, boron-based luminescent complexes, terbium-substituted europium-based luminescent complexes, magnesium-based luminescent complexes, near-infrared phosphorescent lanthanide complexes, ruthenium-based luminescent complexes, and copper-based luminescent/phosphorescent complexes.

An example of high polymer-based is oligophenylenevinylenetetramer luminescent material.

Examples of a π-conjugated -polymer material are liquid crystalline fluorine-based blue-polarizing luminescent polymers, binaphthalene-contained luminescent polymers, disilanileneoligothyenilen-based luminescent polymers, (fluorencarbazole)-based blue luminescent copolymers, (dicyanophenylenevinylene-PPV)-based luminescent copolymers, silicon blue luminescent copolymers, conjugated chromophoric group-containing luminescent polymers, oxadiazole-based luminescent polymers, PPV-based luminescent polymers, (thynylene-phenylene)-based luminescent copolymer, liquid crystalline chiral-substituted fluoren-based blue luminescent polymer, spiro-type-fluoren-based blue luminescent polymer, thermally stable diethylbenzene-based luminescent polymers, (binaphthylfluoren)-based blue luminescent copolymers, porphyrin-group graft PPV-based luminescent polymers, liquid crystallinedioctylfluorene-based luminescent polymers, ethyleneoxide-group-added thiophene-based luminescent polymers, (oxadiazole-carbazole-naphthalimide )-based luminescent copolymer, oligothiophene-based luminescent polymers, PPV-based blue based luminescent polymers, thermally-stable acetylene-based luminescent polymers, (oxadiazole-carbazole-naphthalimide)-based luminescent copolymer, (vinyle-pyridine)-based gelled luminescent polymers, PPV-based luminescent polymers, PPV-based luminescent polymers, PPV-based luminescent liquid crystalline polymers, thiophene-based luminescent polymers, (thiophene-fluorene)-based luminescent copolymers, alkylthiophene-based luminescent copolymers, thiophene-based luminescent polymers, ethyleneoxideoligomer-added PPV-based luminescent polymers, (carbazoylemethacrylate-cumarin)-based luminescent copolymers, n-type all aramatic oxadiazole-based luminescent polymers, carbazoylecyanoterephthalylidene-based luminescent polymers, heat-and/or-radiation-resistive naphthalimid-based luminescent polymers, aluminum chelate-based luminescent polymers, and octafluorobiphenyl-group-containing luminescent polymers.

An example of a-conjugated polymer material is polysilane-based luminescent polymer.

Examples of a pigment-containing low-molecule polymer material are carbazole-side-chain-bonded PMMA-based luminescent polymers, polysilane/pigment-based luminescent compositions, polyfluorene-based derivatives and metal complexes.

Materials of the second electrode 54 and the first electrode 52 between which the organic EL layer 53 is sandwiched, are selected based on the configuration of the organic EL display. More specifically, in the organic EL display, in a case where the substrate 51 is a transparent substrate, and the first electrode 52 is transparent electrode, light generated by the organic EL layer 53 is emitted from that side of the organic EL layer 53 which faces the substrate 51. Accordingly, in order to improve the light emitting efficiency, it is preferable that the second electrode 54 be a reflecting electrode, or that a reflective film (not shown) is provided on that surface of the second electrode 54 which is not adjacent to the organic EL layer 53. On the contrary, in a case where the second electrode 54 is transparent electrode, the light generated by the organic EL layer 53 is emitted from that side of the organic EL layer 53 which faces the second electrode 54. Accordingly, it is preferable that the first electrode 52 be a reflecting electrode, or that a reflective film (not shown) be provided between the first electrode 52 and the substrate 51.

Examples of a material for the transparent electrode are CuI, ITO (Indium Tin Oxide), $SnO_2$, ZnO and the like. Further, examples of a material for the reflecting electrode are metals such as aluminum and calcium; alloys such as magnesium-silver alloy and lithium-aluminum alloy; lamination films of metals suc has laminations of magnesium/silver, magnesium/silver, and the like; lamination films of an insulative substance and metal such as lithium fluoride/aluminum; and the like. However, the present invention is not limited to these.

With the material for the electrode, the first electrode 52 is formed on the substrate 51, and the second electrode 54 is formed on the organic EL layer 53. A method for the formation of the first and the second electrodes 52 and 54 is not particularly limited, and the method may be a dry process such as spattering, EB deposition, resistance heating deposition.

Further, it is possible to form the first electrode 52 or the second electrode 54 through a wet process such as the printing method or the inkjet method, by dispersing the electrode material in resin.

Next described is a positional arrangement of the organic EL element (pixel).

In the present invention, the positional arrangement of the pixels in the organic EL display (organic EL display element) may be, for example, a stripe arrangement in which red (R) luminescent pixel 61, green (G) luminescent pixel 62, and blue (B) luminescent pixel 63 are arranged in a matrix-manner as illustrated in FIG. 10(a).

Further, the arrangement of the pixels may be a mosaic arrangement shown in FIG. 10(b) or a delta arrangement shown in FIG. 10(c).

A ratio of the R-luminescent pixel 61, G-luminescent pixel 62, and B-luminescent pixel 63 does not necessarily have to be 1:1:1. The occupied area of the pixels may be equal to each other, or different from each other.

In general, in order to prevent the light emitting layers from being mixed, it is preferable that a barrier be provided between pixels having different colors.

However, in the manufacturing method of the present invention, the ink for forming the light emitting layer instantly dries. This allows the lamination by application of the organic EL material, without causing the droplet to spread out.

Since the method does not cause the organic EL layers of adjacent pixels to directly border with each other or to be mixed with each other, a manufacturing of the barrier can be omitted.

However, the barrier can be formed in order to obtain a clear contrast of the pixels adjacent to each other. In this case, a height of the barrier may be less than the light emitting layer, because the barrier do not have to play the role of preventing the mixing of the light emitting layers.

The barrier may be single-layered structure or a multilayered structure. Further, the barrier may be arranged between each of the pixels, or between the pixels having different colors.

A material for the barrier is preferably insoluble or difficult to be dissolved in a solvent in which the luminescent material, the charge transport material, and/or the high polymer material are dissolved or dispersed, i.e., in the application liquid for light emitting layer formation and the application liquid for charge transport layer formation.

It is preferable that the material for the barrier be the material for the black matrix (BM), e.g. chromium or resin black, for the sake of a better displaying quality of the display device.

Next, described is a connection method for the first electrode 52 and the second electrode 54 corresponding to each of the pixel.

Figure 11:
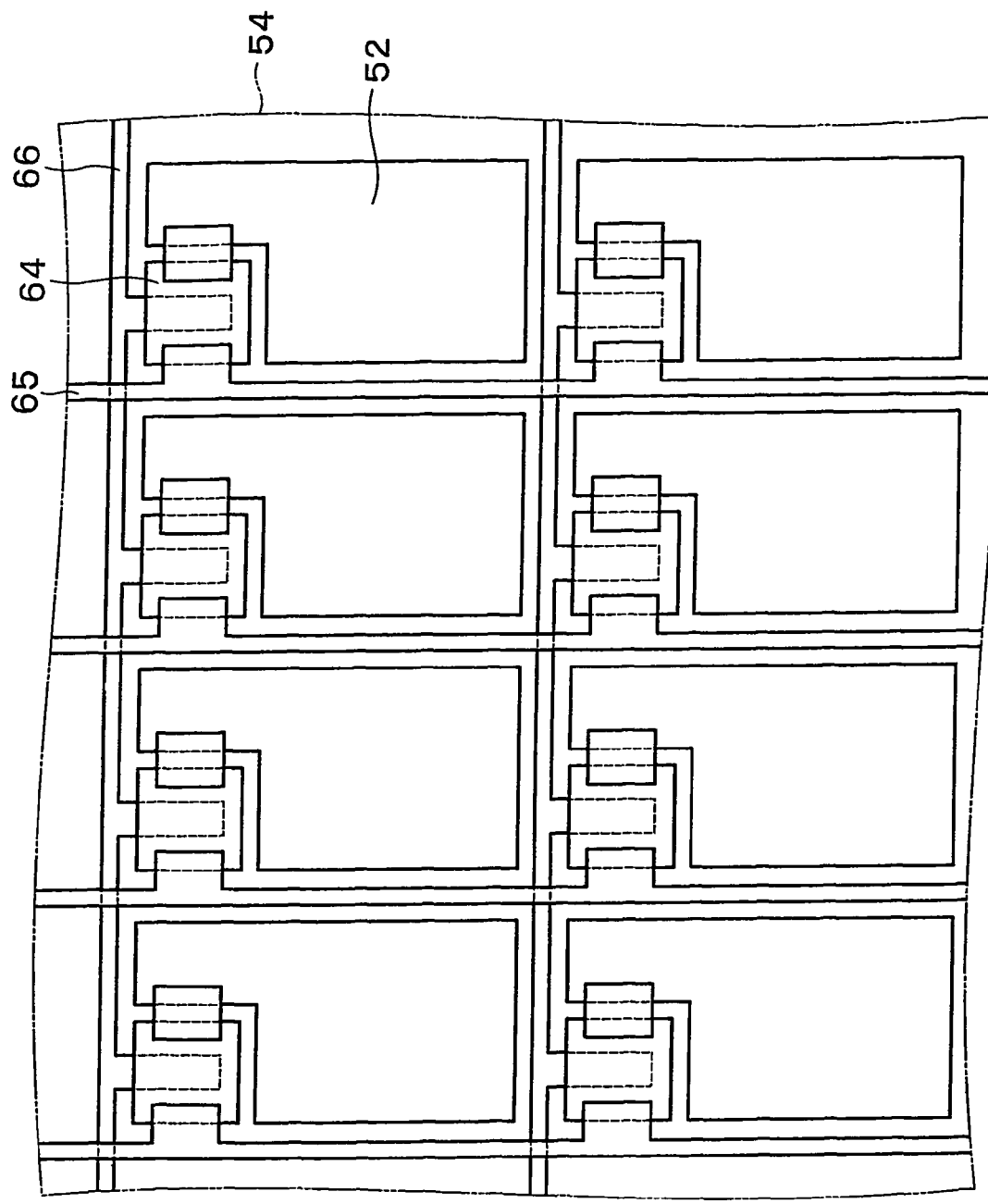
FIG. 11 is a plane view illustrating an example arrangement of electrodes in the organic EL display of the embodiment in accordance with the present invention.

For example, as illustrated in FIG. 11, in the organic EL display of the present invention, the first electrode 52 or the second electrode 54 may be connected to common wiring via a thin film transistor (TFT) 64. In FIG. 11, 65 indicates a source bus line, and 66 indicates a gate bus line.

Further, the organic EL display may be arranged such that the first electrode 52 and the second electrode 54 interposing the organic EL layer 53 therebetween are in s stripe shape, and are perpendicularly intersecting each other on the common substrate 51. Further, the first electrode 52 or the second electrode 54 may work as an electrode independently for each of the pixels.

As illustrated in FIG. 11, in the organic EL display of the present embodiment, a plurality of pixels are arranged in a matrix manner, and a full-color display is realized by a plurality of colors caused with the plurality of pixels. The plurality of colors are preferably a combination of red, green, and blue.

Figure 13:
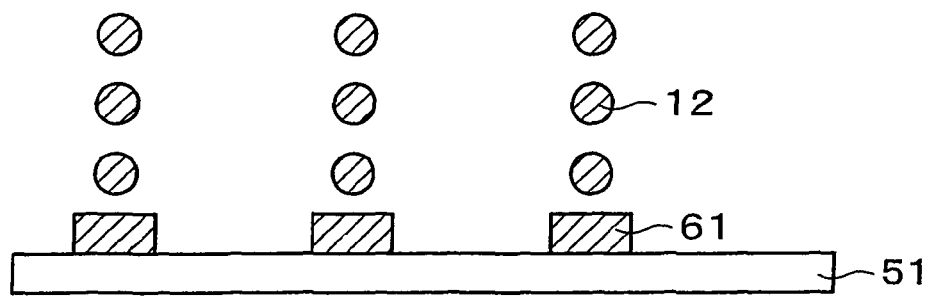
FIGS. 13(a) through 13(c) are longitudinal sectional views illustrating manufacturing processes of the organic EL layer shown in FIG. 12(c).
Figure 13:
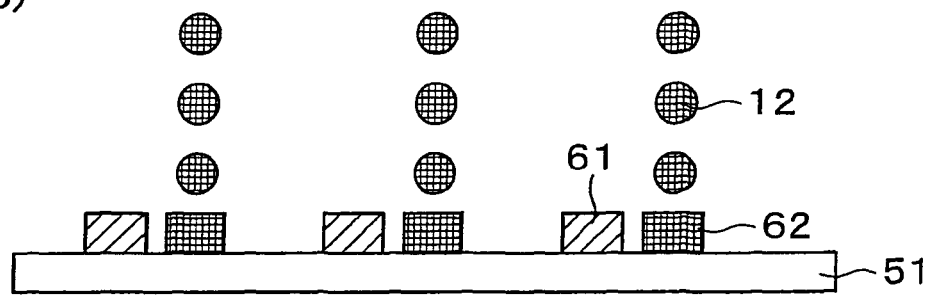
Figure 13:
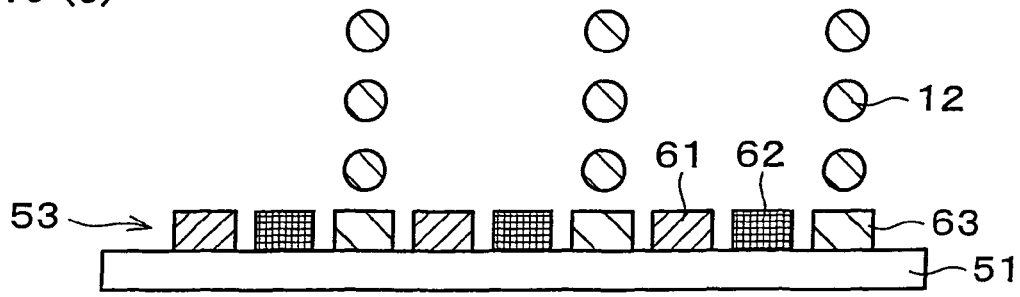

Next, a method for manufacturing an organic EL substrate in the organic EL display is described with reference to FIGS. 12 and 13.

First, as illustrated in FIG. 12(a), a photolithography method was carried out, by using a mask 67, with respect to the glass substrate (substrate 51) having ITO of 130 nm in thickness, so as to form, at a pitch of 120 µm, an ITO transparent stripe electrode of 100 µm in width, the ITO transparent stripe electrode serving as the first electrode 52.

Next, the substrate was cleaned through a conventional wet process (by using isopropyl alcohol, acetone, and pure water). The substrate was further cleaned through a conventional dry process (by using UV ozone treatment and plasma treatment).

Next, as illustrated in FIG. 12(b), by using a relief printing machine 68, the charge (hole) transport layer 55 of 50 nm in thickness was formed by transferring the application liquid for hole transport layer formation made of PEDOT solution (PEDOT/PSS dissolved in a mixed solvent of pure water and ethylene glycol). The relief printing machine 68 had a roll section 69 being provided with a roll substrate 70 for supplying the application liquid for charge (hole) transport layer formation.

Then, as illustrated in FIG. 12(c), the inkjet apparatus 15 was used for applying, on light emitting layer formation regions of respective colors, (I) an application liquid for red-light emitting layer formation which was tetramethyl benzidine in which a red luminescent material was dissolved, (II) an application liquid for green-light emitting layer formation which was tetramethyl benzidine in which a green luminescent material was dissolved, and (III) an application liquid for blue-light emitting layer formation which was tetramethyl benzidine in which a blue luminescent material was dissolved.

In the process of the light emitting layer formation shown in FIG. 12(c), an R light emitting pixel 61 is firstly formed among the three colors of R, G, and B by carrying out a first process (see FIG. 13(a)) by using the inkjet apparatus 15 for jetting the droplet 12 of the ink (application liquid for red light emitting layer formation) in which pigment of a first color R is dispersed.

In this case, since the droplet 12 dries immediately after the landing. A landing area did not expand. Therefore, it is not necessary to form the barrier for compartmentalize pixel formation regions, or a water-affinitive and water-repellent regions.

Here, in a case where a volumetric concentration is $\eta$ (%), a volume V of the organic EL material contained in a single droplet is:

$$V=(4/3)\times\pi\times(D/2)^3\times(\eta/100).$$

A size of the droplet is $\phi D$ µm in its diameter, and the diameter is expected to expand by $\kappa$ times when landing.

In a case where a thickness of the organic EL layer formed by the single droplet is $1/\alpha$ of a desirable thickness t of the organic EL layer, that is, a number of repeating ejections is $\alpha$, the following formula is derived, $$V/(\pi\times((D/2)\times\kappa)^2)=t/\alpha$$

This formula is worked out to be:

$$\eta=\beta\times t/(\alpha\times D).$$

Since $\beta=150\times\kappa^2$, $\kappa=1.5$ where the diameter of the droplet expands to 1.5 times when landing. Therefore, $$\eta=340\times t/(\alpha\times D).$$

In a case where the desirable thickness of the organic EL layers 53 is 0.05 µm, and the size of the droplet 12 is approximately 8 µm in its diameter, the concentration of the ink is determined as follows.

In order to reduce a time needed for manufacturing the pixel, the number of repeating ejection of the droplet 12 is reduced. A number of lamination is determined in accordance with a droplet landing area, an area per pixel, a drive frequency of a head (inkjet apparatus 15), and a number of nozzles in the head.

In a case where the number of repeating ejection of the droplet 12 is no more than 100 ($\alpha \leq 100$), the volumetric concentration $\eta$ of the ink needed is:

$$\eta=3.4\times t/D=0.02\%.$$

Similarly, in order to further reduce the number of the repeating ejections to 10 or less ($\alpha \leq 10$), $$\eta=34\times t/D=0.2\%.$$

Further, it is preferable that the surface of the organic EL layers 53 be as flat as possible.

Therefore, it is preferable that the organic EL material ejected in plural times, shifting a landing position of the droplet 12, thereby overlapping the organic EL material. In the present embodiment, the repeating ejection is carried out twice or more ($\alpha \geq 2$).

In this case, a center of an upper-landing position of the droplet 12 is targeted in a middle of centers of adjacent landing positions on a lower-side. This allowed the surface of the organic EL layers 53 to be sufficiently smooth. The volumetric concentration $\eta$ of the ink needed in this case is:

$\eta = 170 \times t/D = 1\%$.

Table 4 shows a result of study on an influence of a number of laminations ($\alpha$) of the landed droplet 12 to the concentration and the viscosity of the ink, the production efficiency of the organic EL layer 53, and a surface smoothness of the organic EL layer 53.

TABLE 6

Influence given according to the number of laminations

| | Concentration | Viscosity | Production Efficiency | Surface Smoothness |
|---|---|---|---|---|
| $\alpha = 1$ | 2% | 50 cP or more | ◎ | Δ |
| $\alpha = 2$ | 1% | 20 cp | ◎ | ○ |
| $\alpha = 10$ | 0.2% | 2.3 cP | ○ | ◎ |
| $\alpha = 100$ | 0.02% | 2.2 cP | ○ | ◎ |
| $\alpha = 1000$ | 0.002% | 2.2 cP | Δ | ◎ |

◎: GOOD
○: EJECTABLE
Δ: NOT SUITABLE
X: NOT EJECTABLE
—: OUT OF APPLICABLE RANGE

From the result shown in Table 6, it is preferable that the number of the laminations ($\alpha$) be set between 2 to several hundreds in consideration with the production efficiency and the surface smoothness, and that the volumetric concentration of the ink be determined in accordance with the number of the laminations. Here, a is set at 2 giving priority to the production efficiency. At this point, the volumetric concentration is 1%, and the ink viscosity is 20 cP. This is difficult to eject by using a conventional inkjet apparatus, while the inkjet apparatus 15 of the present embodiment can easily carry out the ejection.

From the foregoing result, the volumetric concentration realizing a sufficient smoothness of the surface of the organic EL layer 53, with a least number of the repeating ejections, is 1%. This volumetric concentration is highly concentrated when compared to the volumetric concentration of 0.7% (viscosity 9.7 cP) of the ink for the organic EL layer formation used in a conventional inkjet apparatus. Further, the size of the droplet is smaller. By using the inkjet apparatus 15, it is possible to eject highly viscous ink. Since the flying speed of the droplet 12 is accelerated by the electric field, the droplet 12 dries immediately after the landing.

In a case where the R-light emitting pixel 61 is formed in the first process shown in FIG. 13(a), the head of the inkjet apparatus 15, having the nozzle 1, or the recording-subjected-side substrate 14 (substrate 51) is moved in a feed-direction while ejecting the droplet 12.

In this case, a latter droplet is targeted so as to land in a position slightly shifted with respect to a previous droplet. In this way, the R-pixel 61 of the desirable thickness is obtained.

Similarly, among the three colors of R, G, and B, a G-light emitting pixel 62 having the desirable thickness is formed by carrying out a second process shown in FIG. 13(b) by using the inkjet apparatus 15 for jetting the droplet 12 of the ink in which a pigment of a second color G is dispersed.

Similarly, among the three colors of R, G, and B, a B-light emitting pixel 63 having the desirable thickness is formed by carrying out a third process shown in FIG. 13(c) by using the inkjet apparatus 15 for jetting the droplet 12 of the ink in which a pigment of a third color B is dispersed. An order of forming the R-light emitting pixel 61, the G-light emitting pixel 62, and the B-light emitting pixel 63 is not limited to the foregoing order, and may be changed as needed.

In a case where the material and the solvent for the light emitting layer, and the size of the light emitting layer are different among each of the colors, optimum volumetric concentration is also different. The higher the volumetric concentration of the light emitting layer is, the less a number of repeating ejections becomes, whereby the production efficiency is further improved but the ink viscosity is increased.

The inkjet apparatus 15 allows ejection of ink having a higher viscosity than the ink used in the present embodiment, having the viscosity of 20 cP, as such, it is possible to further increase the volumetric concentration of the ink.

After the formation of the organic EL layer 53, an AlLi alloy electrode serving as the second electrode 54 is formed by co-deposition of Al and Li by using a shadow mask.

An element obtained at last is sealed off by using epoxy resin that is to serve as a sealing substrate 56. In this way, the organic EL display is manufactured. A state of light emission was observed by applying a pulse voltage of 30 V to the organic EL display thus obtained. All of the pixels were emitting light, and no short was occurring between the first and the second electrodes 52 and 54, between the first electrodes 52, and between the second electrodes 54. Further, a color mixing due to mixing of the light emitting layers of the colors with each other was not observed.

Further, an unevenness in the light emission within the pixels, due to an unevenness in the film thickness of the organic light emitting layer 58, was not observed.

Since the inkjet apparatus 15 is for ejecting a plurality of the ink droplets with respect to 1 pixel of the organic EL display, the number of nozzle per pixel may be plural, and does not have to be a single nozzle. Further, it is not necessary to consecutively eject the ink for filling 1 pixel of the organic EL display, and the ejection of the ink may be carried out separately.

Further, in forming the organic EL layer 53, it is not necessary that all of the droplets be quickly-drying minute droplets. Thus, the formation of the organic EL layer 53 may be arranged such that a large droplet is used at first for forming an outline, then, a minute adjustment of the thickness and correction of unevenness is carried out by ejecting minute droplets by using the inkjet apparatus (sub-micron head) 15.

In the foregoing embodiment, the light emitting pixels of all of three colors are formed by using the inkjet method (inkjet apparatus 15). However, it is possible to use the spin coat method, an offset printing method, or an electrodeposition method, for one or two of the tree colors.

Further, in the foregoing embodiment, the inkjet method is used for forming the organic light emitting layer 58 of the organic EL layers 53 having the multilayered structure, and the charge transport layer 55 of the organic EL layers 53 is formed by using the printing method. However, it is possible to use the inkjet method for forming the both, or only the charge transport layer 53.

Further, in the foregoing embodiment, the first color is R, and the second color is B. However, the order of the colors may be changed, e.g. the first color is B. and the second color is R.

Further, the foregoing embodiment deals with a case of manufacturing the organic EL substrate having the stripe arrangement of the color pixels. However, the organic EL substrate may be an organic EL substrate having a delta arrangement of the color pixels shown in FIG. 10, or other organic EL substrates.

Further, in the inkjet method of the present embodiment in which the inkjet apparatus (sub-micron head) 15 is used, the droplets instantaneously dries after the landing. This prevents the droplets adjacent to each other from being mixed with each other. Therefore, it is no longer necessary to provide a boundary between pixels, or the BM serving as a wall for preventing an out flow of the ink (droplet), unlike a conventional inkjet method.

Further, since the portions other than the pixels are shaded by the wiring metal, the organic EL substrate does not necessarily have to be provided with the BM. Therefore, the manufacturing cost of the organic EL substrate becomes low. Even though the BM is not provided in the foregoing embodiment, the BM can be provided as long as the cost allows the provision of the BM.

The inkjet apparatus 15 of the present embodiment allows the ejection of such a highly viscous droplet that a conventional inkjet apparatus is not able to eject. Therefore, the concentration of the organic EL material can be high, and the size of the droplet can be reduced to a minute size.

This realizes an effect, which has been conventionally unattainable, that the droplet is instantaneously dries after the landing. Therefore, it is possible to reduce a number of repeated ejections, and reduce the time interval between a previous droplet and a latter droplet of the repeated ejections, thus enabling an improvement in a workability.

Further, the inkjet apparatus 15 allows a reduction of a voltage between the nozzle 1 and the recording medium (counter electrode 13). Therefore, there is no risk of damaging a hole injection layer.

Further, the increase in the volumetric concentration of the ink and the sufficient flying speed are not realized even by using a conventional inkjet apparatus other than the electrostatic attraction type, and reducing the droplet diameter. As a result, it is not possible to improve the workability of the repeated ejections by instantaneously drying the droplet after the landing.

The following describes a result of a further studying on a configuration of the inkjet apparatus 15 that can be used in manufacturing of the active matrix organic EL display element.

Figure 14:
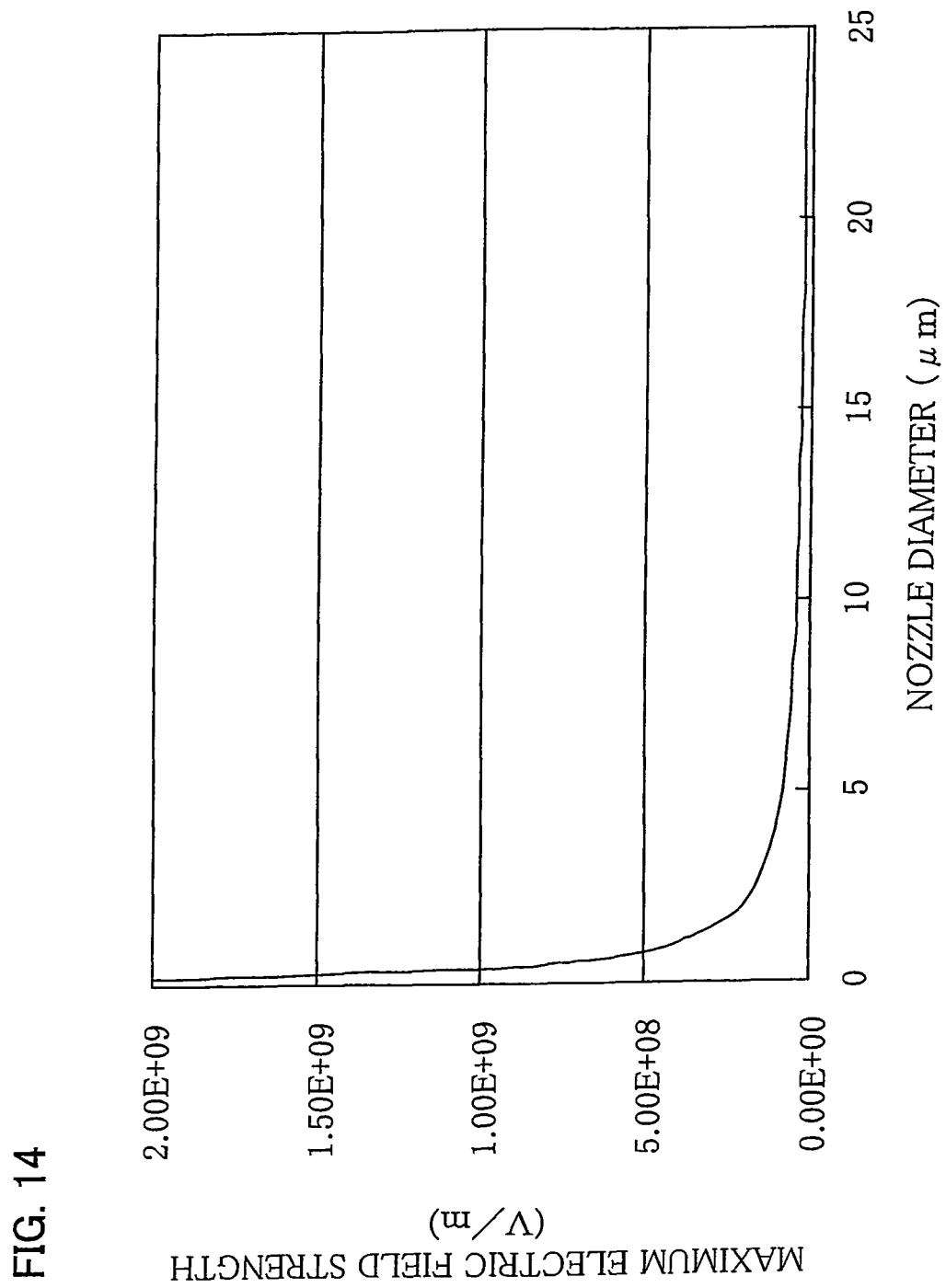
FIG. 14 is a graph indicating a relationship between a nozzle diameter and a maximum electric field strength.

FIG. 14 illustrates the relationship of the nozzle diameter of the nozzle 1, the maximum electric field intensity at the meniscus portion 7, and the high electric field region.

It is clear from the graph of FIG. 14 that, when the nozzle diameter is equal to or less than $\phi 4$ μm, it is possible to increase the maximum electric field intensity because the electric field is concentrated extremely.

Therefore, it becomes possible to increase the initial velocity of the ejected droplet of the ink. On this account, the stability of the flying ink (droplet) increases and the moving velocity of the electric charge at the meniscus portion increases. As a result, the response of ejection is improved. Next, the following description explains the maximum amount of electric charge which can be electrified in the droplet 12 of the ink ejected.

Figure 15:
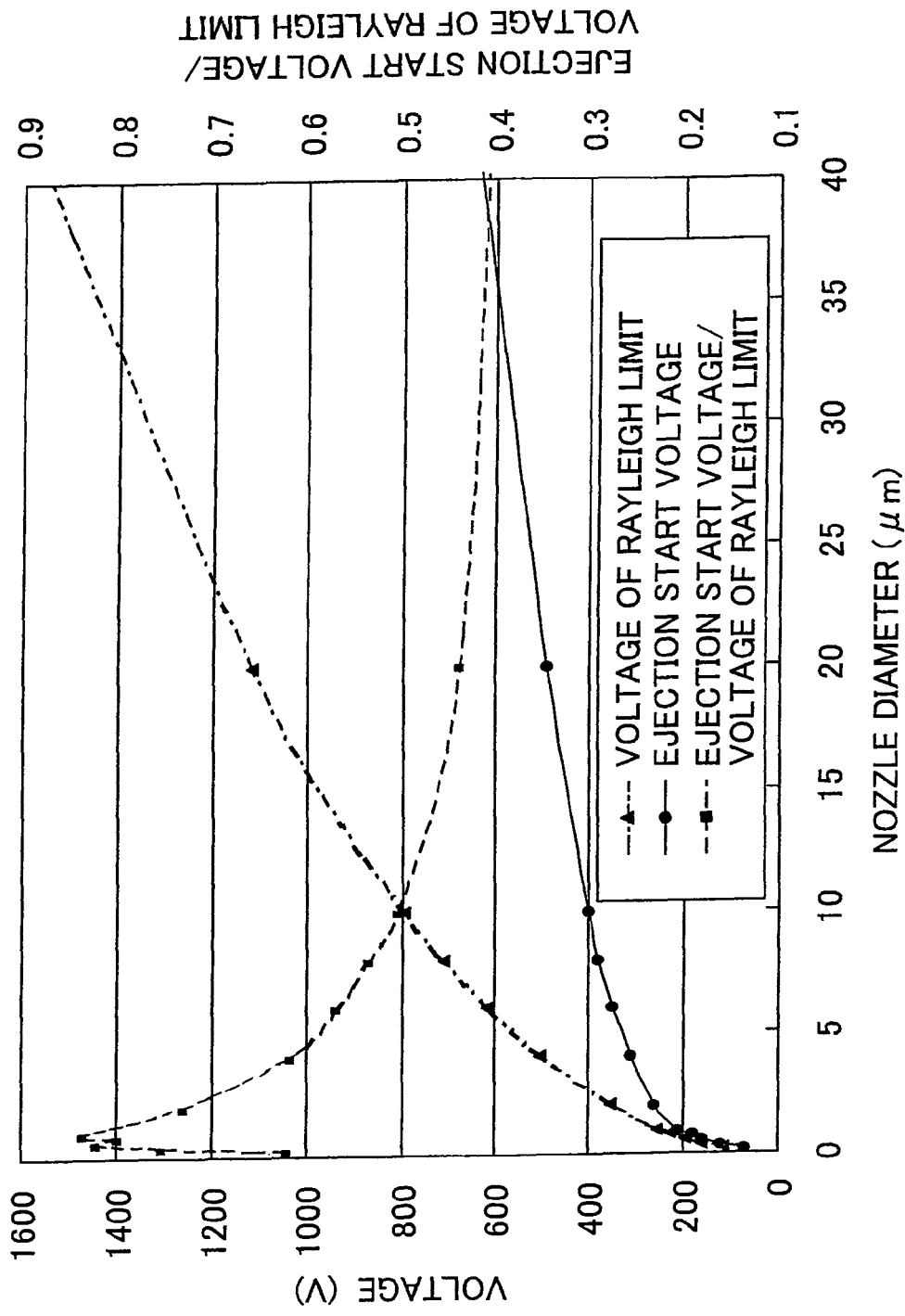
FIG. 15 is a graph indicating a relationship between the nozzle diameter and various voltages.
Figure 16:
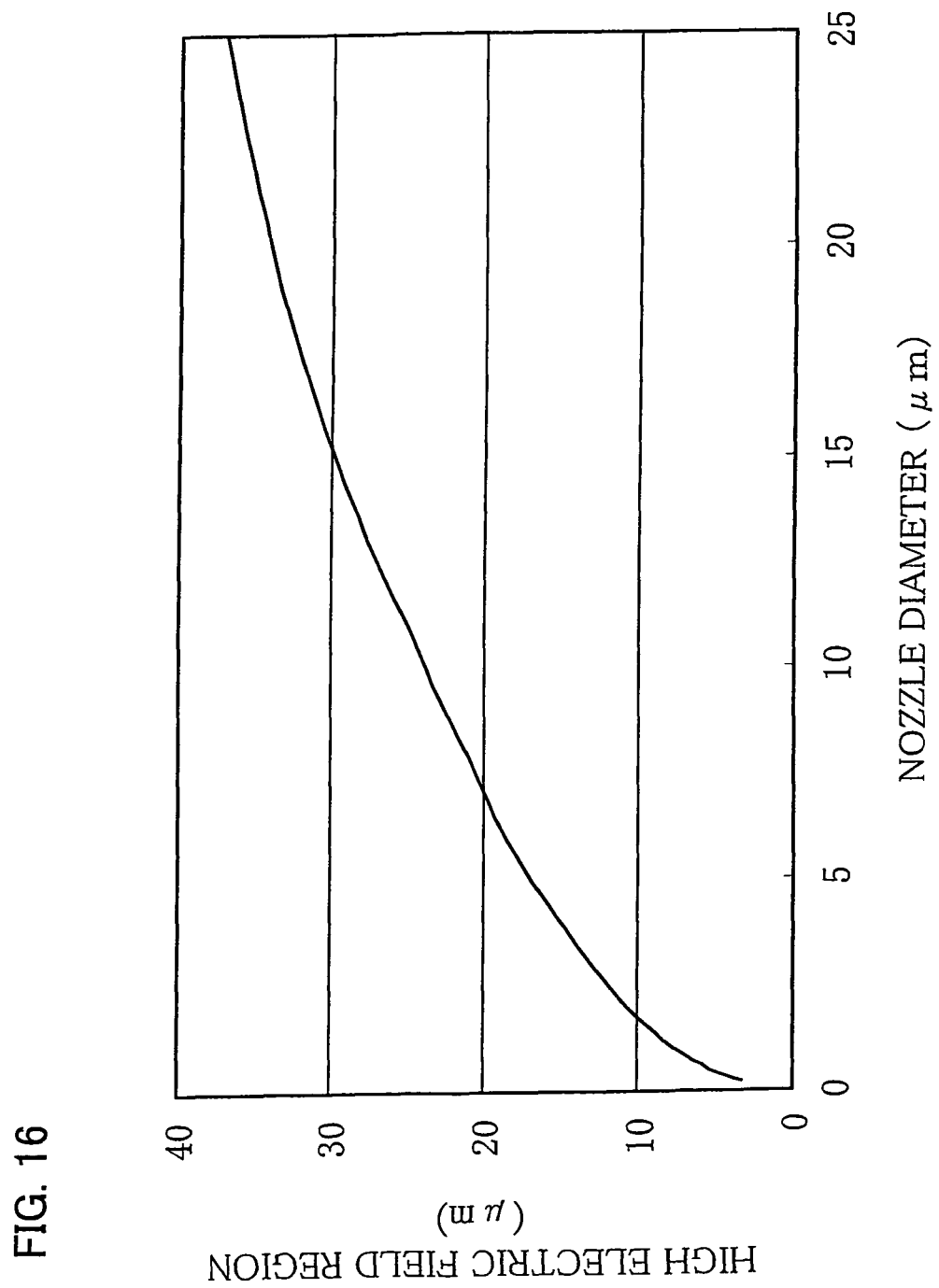
FIG. 16 is a graph indicating a relationship between the nozzle diameter and a strong electric field region.

The amount of electric charge, which can be electrified in the droplet 12, is expressed by Equation (1) which takes Rayleigh split of the droplet 12 into consideration.

$$q = 8 \times \pi \times (\in 0 \times \gamma \times r^3)^2 \qquad (1)$$

where q is the amount of electric charge which gives Rayleigh limit, $\in 0$ is a dielectric constant in a vacuum, γ is a surface tension energy of ink, and r is a radius of an ink droplet. The closer the amount q of electric charge, which can be obtained by Equation (1), is to the value of Rayleigh limit, the stronger the electrostatic force becomes, even when the electric field intensity is constant. Therefore, it is possible to improve the stability of ejection. However, when the amount q is too close to the value of Rayleigh limit, the ink may scatter at the ink-ejecting hole 1b of the nozzle 1. This results in lack of the stability of ejection. Here, FIG. 15 is a graph illustrating the relationship of (i) the nozzle diameter of the nozzle, (ii) an ejection starting voltage which causes a droplet to fly from the meniscus portion, (iii) the value of a voltage at Rayleigh limit of the initially ejected droplet, and (iv) the ratio of the ejection starting voltage to the value of the voltage of Rayleigh limit. According to the graph of FIG. 15, when the nozzle diameter is from $\phi 0.2$ μm to $\phi 4$ μm, the ratio of the ejection starting voltage to the value of the voltage of Rayleigh limit is over 0.6. Moreover, the electrification efficiency of the droplet is good. Thus, it is clear that it is possible to carry out the ejection stably when the nozzle diameter is as above. For example, according to the graph of FIG. 16 which illustrates the relationship between the nozzle diameter and the high electric field (not less than $1 \times 10^6$ V/m) region at the meniscus portion, the region where the electric field is concentrated becomes extremely small when the nozzle diameter is equal to or less than $\phi 0.2$.

According to this, it is not possible to give enough energy for accelerating the ejected droplet, so that the stability of the flying ink is decreased. Therefore, the nozzle diameter needs to be longer than $\phi 0.2$ μm.

Figure 17:
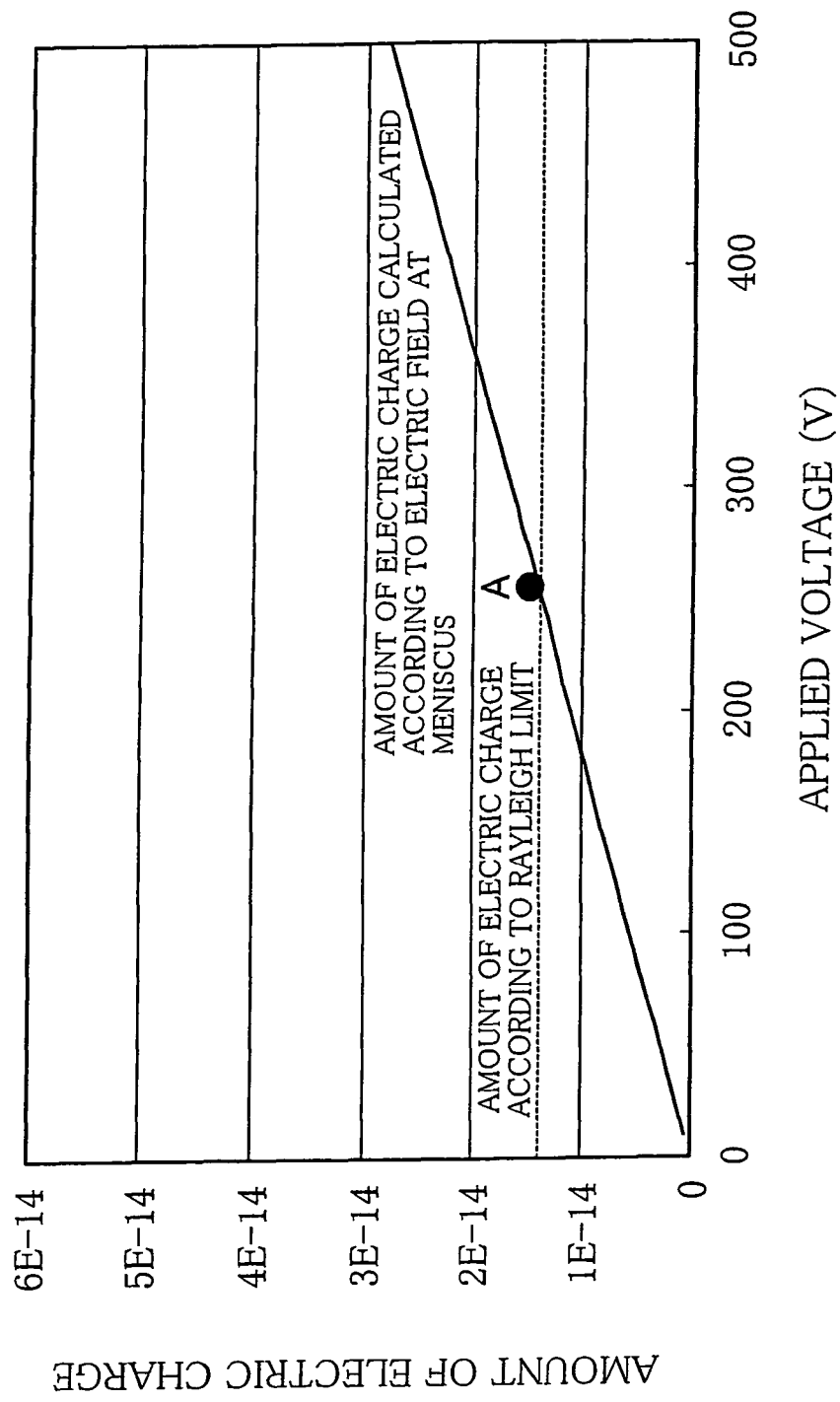
FIG. 17 is a graph indicating a relationship between an applied voltage and a charged electric charge.

Next, FIG. 17 is a graph illustrating a relationship between (i) an applied voltage for actually driving the ink jet device arranged as above, that is, where the initial droplet ejected from the meniscus portion is constant, the amount of electric charge of the droplet derived from a maximum electric field intensity attained in a case where a voltage value is varied in a range of not less than ejection starting voltage of the droplet and (ii) the value of Rayleigh limit according to the surface tension energy of the droplet.

Figure 18:
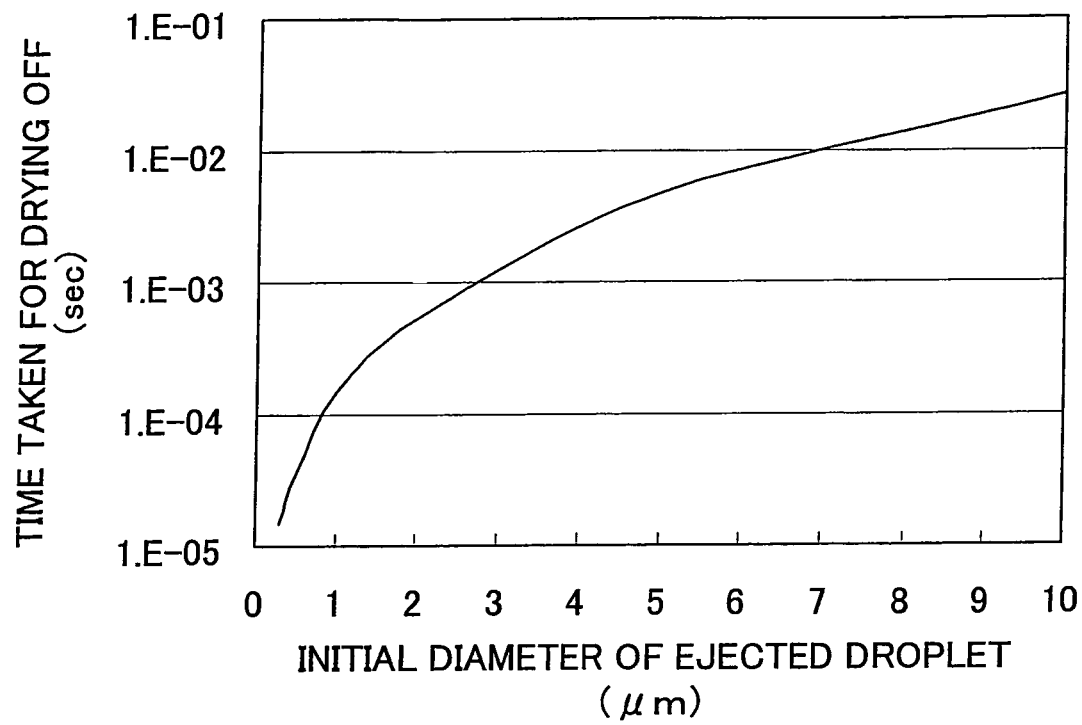
FIG. 18 is a graph indicating a relationship between a diameter of an initially ejected droplet and a time taken for drying.

In the graph of FIG. 17, the point A is an intersection point of the amount of electric charge of the droplet and the value of Rayleigh limit according to the surface tension energy of the droplet. When a voltage applied to ink is higher than the point A, the maximum amount of electric charge, which is close to the value of Rayleigh limit, is generated in the droplet initially in the ejection. When a voltage applied to ink is lower than the point A, the amount of electric charge, which is not more than the value of Rayleigh limit and is required for the ejection, is generated. Here, when focusing only on the motion equation of the ejected droplet, the droplet is ejected under the best condition of the ejection energy which is the high electric field and the maximum amount of electric charge, so that it is preferable that an applied voltage be higher than the point A. Incidentally, FIG. 18 is a graph illustrating a relationship between an initial diameter of an ejected droplet of ink (in this case, purified water) and a drying time (time for all the solvent in a droplet to be vaporized) under the environmental humidity of 50%.

According to the graph, it is clear that, when the initial diameter of the ejected droplet is short, the change in the droplet diameter of the ink rapidly occurs because of vaporization and the droplet vaporizes while the droplet is flying, that is, even in a short period of time. On this account, in the case in which the maximum amount of electric charge is generated in the droplet when the initial ejection is carried out, the droplet diameter decreases because the droplet dries, that is, the surface area, in which the electric charge is generated, of the droplet decreases. Therefore, Rayleigh split occurs while the ink is flying. When the droplet releases the excessive electric charge, the electric charge is released with a part of the droplet. As a result, the flying droplet decreases more seriously than vaporization. Therefore, the droplet diameter of the landed droplet is inconsistent and the landing accuracy deteriorates. Moreover, mist of the droplet floats in the nozzle and on the printing medium, so that the printing medium is contaminated.

Therefore, in consideration of the stable formation of ejected dots, the initial amount of electric charge induced to the ejected droplet needs to be a little less than the amount of electric charge corresponding to Rayleigh limit.

When the amount of electric charge is 95% of the amount of electric charge corresponding to Rayleigh limit, it is impossible to improve the accuracy of the dot diameter of the landed droplet. Therefore, it is preferable that the amount of electric charge be equal to or less than 90% of the amount of electric charge corresponding to Rayleigh limit. As a concrete value, first, it is necessary to calculate the value of Rayleigh limit of the initially ejected droplet, whose diameter is determined according to the maximum electric field intensity, of the meniscus when the nozzle hole is considered as the tip shape of the stylus electrode. Then, by setting the amount of electric charge to be equal to or less than the value thus calculated, it is possible to suppress the inconsistency in the diameter of the landed droplet.

This may be because (i) the surface area of the ejected droplet which is about to split is smaller than that of the droplet which has just been ejected, and (ii) the initially amount of electric charge induced to the ejected droplet is in reality less than the amount of electric field obtained by the above calculation due to the time lag of the amount of time for the electric charge to move. Under these conditions, it is possible to prevent Rayleigh split while the droplet is flying. Moreover, it is possible to reduce the, unstable ejection, such as the generation of the mist which is caused because the amount of electric charge is too much when the ejected droplet (Rayleigh) splits at the meniscus portion. Note that, because the vapor pressure decreases, the electrified droplet becomes to hardly vaporize. This is clear from Equation (2) below.

$$RT\rho/M \times \log(P/PO) = 2\gamma/r - q^2/(8\pi r^4), \quad (2)$$

where R is a gas constant, M is a molecular weight of a gas, T is a gas temperature, $\rho$ is a gas density, P is a vapor pressure of a minute droplet, PO is a vapor pressure on a plane surface, r is a surface tension energy of ink, and $\gamma$ is a radius of an ink droplet. As expressed by Equation (2), the vapor pressure of the electrified droplet decreases according to the amount of electric charge of the droplet. When the amount of electric charge is too small, it is not effective to suppress the vaporization. It is preferable that the amount of electric charge be equal to or more than 60% of the electric field intensity and the voltage value corresponding to Rayleigh limit.

This result is the same as the following: first, the initial value of Rayleigh limit of the ejected droplet, whose diameter is determined according to the maximum electric field intensity, of the meniscus when the nozzle hole is considered as the tip shape of the stylus electrode. Then, by setting the amount of electric charge to be equal to or more than 0.8 times the value thus calculated, it is possible to suppress the variation of the diameter of the landed droplet. Especially, as illustrated in FIG. 18, when the initial diameter of the ejected droplet is equal to or less than $\phi 5$ µm, the drying time becomes extremely short, and the droplet is easily influenced by the vaporization. Therefore, in order to suppress the vaporization, it is effective to suppress the initial amount of electric charge of the ejected droplet.

The environmental humidity is 50% when the relationship between the time taken for drying and the initial diameter of the ejected droplet illustrated in FIG. 18 is obtained. Moreover, in consideration of the drying of the ejected droplet, it is necessary of shorten the amount of time for ejecting the fluid onto the printing medium. Here, Table 7 below shows results of comparison of the stability of ejection and the landing accuracy of the landed dot when the average velocity of the ejected droplet, which is separated from the meniscus portion so as to fly from the nozzle to the printing medium, is 5 m/s, 10 m/s, 20 m/s, 30 m/s, 40 m/s, or 50 m/s.

TABLE 7

| | Initially ejected droplet diameter | | | | | |
|---|---|---|---|---|---|---|
| | $\phi 0.4$ µm | | $\phi 1$ µm | | $\phi 3$ µm | |
| Average ejection speed | Stability of Ejection | Landing Accuracy | Stability of Ejection | Landing Accuracy | Stability of Ejection | Landing Accuracy |
| 5 m/s | X (No Landing) | | Δ | Δ | ○ | Δ |
| 10 m/s | ○ | ○ | ○ | ○ | ○ | ○ |
| 20 m/s | ○ | ◎ | ○ | ◎ | ○ | ◎ |
| 30 m/s | ○ | ◎ | ○ | ◎ | ○ | ◎ |
| 40 m/s | ○ | ◎ | ○ | ◎ | ○ | ◎ |
| 50 m/s | X (Mist is produced) | | X (Mist is produced) | | X (Mist is produced) | |

Marks concerning "Stability of Ejection" in Table 7 indicate as follows: x indicates that the ink is hardly ejected, Δ indicates that the ink may not be ejected when the ink is continuously ejected, and ○ indicates that the ink is stably ejected. Marks concerning "Landing Accuracy" in Table 7 indicate as follows: x indicates that landing gap>dot diameter of landed droplet, Δ indicates that landing gap>dot diameter of landed droplet×0.5, ○ indicates that landing gap<dot diameter of landed droplet×0.5, ◎ indicates that landing gap<dot diameter of landed droplet×0.2.

As is clear from Table 7, when the average velocity is 5 m/s, the landing accuracy and the stability of ejection deteriorate. Especially, in the case in which the nozzle diameter is equal to or less than $\phi 1$ µm, when the velocity of the ejected droplet is low, the air resistance with respect to the droplet is high and the dot diameter is further decreased by vaporization. On this account, the droplet may not land.

Figure 19:
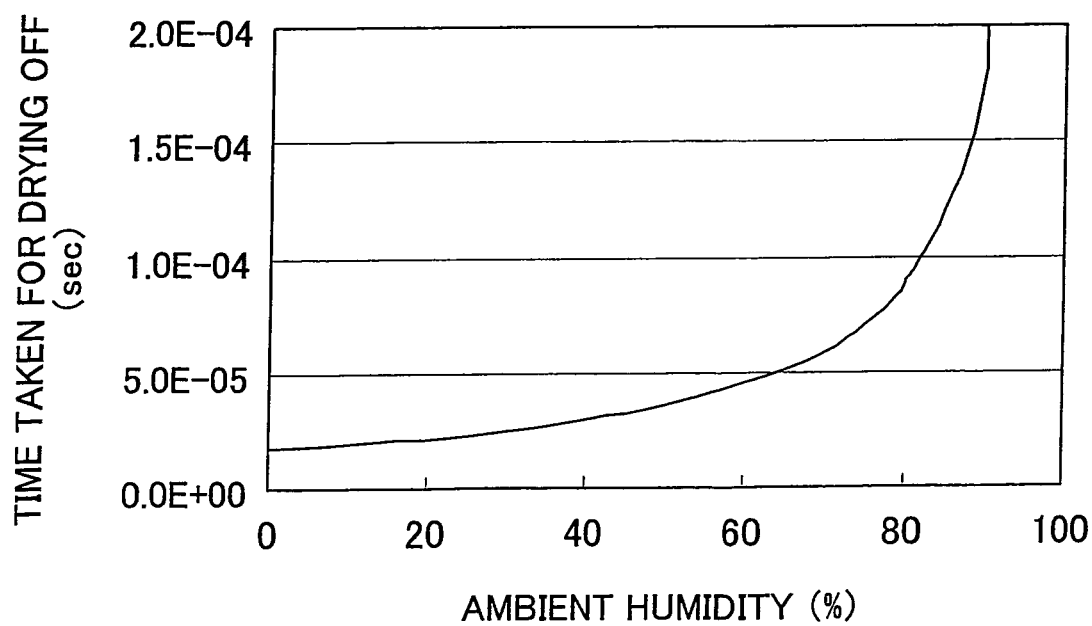
FIG. 19 is a graph indicating a relationship between a surrounding moisture and the time taken for drying.

In contrast, in the case in which the average velocity is 50 m/s, it is necessary to increase the applied voltage. Therefore, the electric field intensity at the meniscus portion becomes very high, so that the mist of the ejected droplet is generated frequently. Therefore, it is difficult to eject the droplet stably. According to the above, it is clear that it is preferable that the average velocity of the droplet, which is separated from the meniscus portion so as to land on the printing medium, be from 10 m/s to 40 m/s. Incidentally, FIG. 18 illustrates a relationship between the initial diameter of the ejected droplet and the time taken for drying, the relationship being attained when the environmental humidity is 50%. Meanwhile, FIG. 19 illustrates a relationship between the environmental humidity and the time taken for drying, the relationship attained when the initial diameter of the ejected droplet is $\phi 0.5$ µm and a distance between the nozzle and the printing medium is 0.2 mm. According to the graph of FIG. 19, it is clear that the drying velocity does not change significantly when the environmental humidity is equal to or less than 60%.

However, when the environmental humidity is over 70%, it is possible to dramatically suppress the vaporization of the ink. When the environmental humidity is equal to or more than 70%, the influence of the above conditions becomes little. Especially, when the environmental humidity is equal to or more than 95%, it is clear that it is possible to (i) substantially neglect the influence of the drying, (ii) increase the freedom of the designing of the ink jet device of the present invention and (iii) increase the applicability of the ink jet device of the present invention. Here, Table 8 below shows the stability of ejection and variation of the dot diameter of the ejected droplet (variation of the landed droplet) when (i) the nozzle diameter is φ1 μm or φ3 μm and (ii) the initial diameter of the ejected-droplet varies.

Note that, it is possible to control the initially diameter of the ejected droplet from the nozzle by changing the value of the applied voltage. Moreover, it is also possible to control the diameter by adjusting the pulse width of the applied voltage pulse. Here, in order to remove the influence of the electric field intensity when using the nozzles whose diameters are the same with each other, the initial diameter of the ejected droplet is adjusted by changing the pulse width.

TABLE 8

| Initially ejected droplet diameter (μm) | Nozzle Diameter (μm) | | | | | |
| --- | --- | --- | --- | --- | --- | --- |
| | φ1 μm | | φ3 μm | | φ5 μm | |
| | Variation | Stability of Ejection | Variation | Stability of Ejection | Variation | Stability of Ejection |
| φ1 | Δ | ○ | | X | | X |
| φ1.5 | ⊙ | ⊙ | | X | | X |
| φ2 | ⊙ | ⊙ | | X | | X |
| φ3 | ⊙ | ○ | Δ | Δ | | X |
| φ5 | ○ | Δ | ⊙ | ⊙ | Δ | Δ |
| φ7 | X | | ⊙ | ○ | ⊙ | ○ |
| φ10 | X | | Δ | ○ | ⊙ | ⊙ |
| φ15 | X | | Δ | Δ | ○ | ○ |
| φ20 | X | | | X | ○ | Δ |

Marks concerning "Stability of Ejection" in Table 8 indicate as follows: x indicates that the ink is hardly ejected, Δ indicates that the ink may not be ejected when the ink is continuously ejected for 10 minutes, ○ indicates that the ink is stably ejected even when the ink is continuously ejected for 10 minutes, ⊙ indicates that the ink is stably ejected even when the ink is continuously ejected for 30 minutes. Marks concerning "Variation" indicate as follows: Δ indicates that landing dot variation>dot diameter of landed droplet×0.2, ○ indicates that landing dot variation≤dot diameter of landed droplet×0.2, ⊙ indicates that landing dot variation≤dot diameter of landed droplet×0.1.

According to Table 8, when the diameter of the initially ejected droplet is substantially from 1.5 times to 3 times longer than the nozzle diameter, it is clear that the stability of ejection is favorable. Especially, when the initial diameter of the ejected droplet is from 1.5 times to twice longer than the nozzle diameter, variation of the dot diameter of the landed droplet is suppressed dramatically. This is because the droplet separates most stably under the condition that, when the shape of the ink separated from the meniscus portion is assumed as a liquid column, the surface area of the liquid column is larger than the surface area of a globe whose volume is the same as that of the liquid column.

According to the above arrangement, in an electrostatic attraction ink jet device which ejects a minute ink droplet whose amount of the ink, which has just been ejected, is equal to or less than 1 pl, the diameter of the ink-ejecting hole 1b of the nozzle 1 is set to be less than the diameter of the droplet of the ink which has just been ejected. In this way, it is possible to concentrate the electric field, which is used for the ejection, on the meniscus 7 of the nozzle 1. Therefore, it is possible to dramatically decrease the applied voltage required for ejecting the ink. As a result, it is possible to suppress variation of the diameter of the droplets which are separated and ejected one by one, and also possible to stably eject the droplets.

In addition, it becomes unnecessary to apply the bias voltage which is conventionally needed. Therefore, it becomes possible to alternately apply the positive and negative drive voltages. It is also possible to prevent an increase in the surface potential of the printing medium from influencing on the landing accuracy.

Moreover, by setting the nozzle hole diameter to be equal to or less than φ8 μm, it is possible to concentrate the electric field on the meniscus portion of the nozzle. It is also possible to stably eject droplets without being influenced by the landing accuracy of the counter electrode, variation of the material characteristics of the printing medium, and variation of the thickness.

Especially, when the diameter of the ink-ejecting hole 1b of the nozzle 1 is not less than φ0.4 μm and not more than φ4 μm, the electric field concentrates extremely. Thus, increasing the maximum electric field intensity increases the initial velocity of the ejected droplet of the ink. Therefore, the stability of the flying ink increases and the moving velocity of the electric charge increases at the meniscus portion. As a result, the response of ejection is improved and it is possible to suppress variation, which is caused by the influence of Rayleigh split, of dot diameter of the landed droplet.

Furthermore, the diameter of the droplet, which has just been ejected from the nozzle 1, is set so as to be from 1.5 times to 3 times longer than the diameter of the ink-ejecting hole 1b of the nozzle 1. In this way, it is possible to improve the stability of ejection. Especially, when the diameter of the droplet, which has just been ejected, is set to be from 1.5 times to twice longer than the nozzle diameter, it is possible to extremely suppress variation of the dot diameter of the landed droplet.

Figure 20:
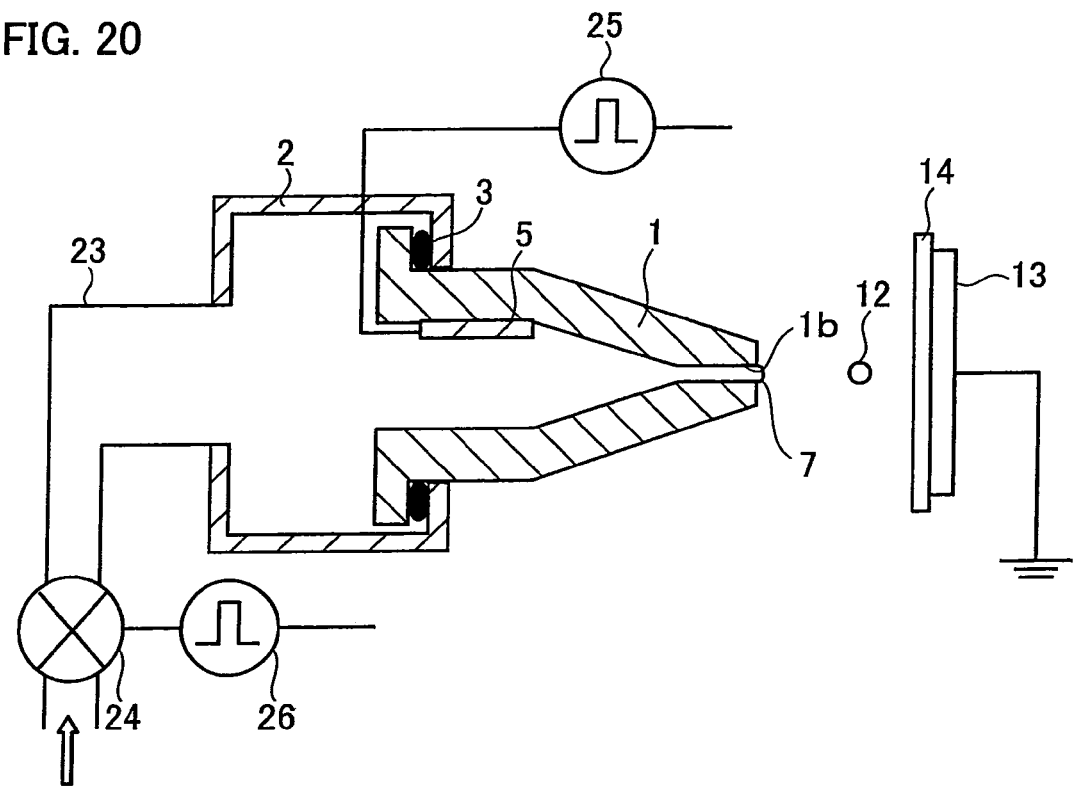
FIG. 20 is another embodiment of the present invention and is a cross sectional view illustrating a schematic configuration of an inkjet apparatus.

As above, the present embodiment explained a case in which the negative pressure is applied to the ink in the ink chamber 2. However, the positive pressure may be applied to the ink in the ink chamber 2. As illustrated in FIG. 20, in order to apply the positive pressure to the ink in the ink chamber 2, for example, a pump 24 is provided on the ink supplying path 23 so as to be between an ink tank (not illustrated) and ink chamber 2. In this case, it is possible to control the driving of the pump 24 by using a process control section 26 separately provided from the process control section 25, so that the positive pressure can be applied to the ink in the ink chamber 2 by using the pump 24. Thus, by applying the positive pressure to the ink in the ink chamber 2, it becomes unnecessary to form the projection of the meniscus portion by the electrostatic force. Therefore, it is possible to reduce the applied voltage and improve the response velocity.

Note that, for ease of explanation, the present embodiment explained an ink jet device provided with a single nozzle. However, the present invention is not limited to this. When the designing is carried out in consideration of the influence of the electric field between the nozzles adjacent to each other, it is possible to apply the present invention to an ink jet device provided with a multi head having a plurality of nozzles.

Furthermore, the present embodiment explained an ink jet device provided with the counter electrode 13. However, as is clear from Table 2, the distance (gap) between the counter electrode 13 and the ink-ejecting hole 1b of the nozzle 1 hardly influences the electric field strength between the printing medium and the nozzle. Therefore, when the distance between the printing medium and the nozzle is short and the surface potential of the printing medium is stable, the counter electrode is unnecessary.

Figure 21:
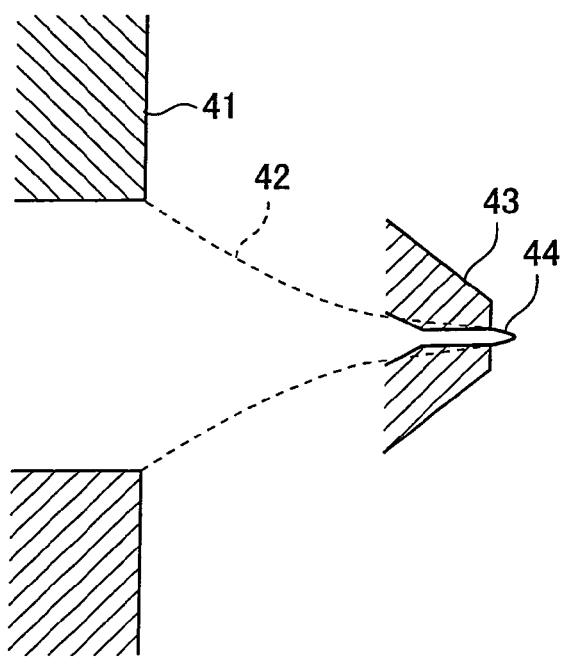
FIG. 21 is a figure for explaining a mechanism of the inkjet apparatus of the embodiment in accordance with the present invention.

The inventors of the present invention found out that the use of nozzle 43 allows (i) formation of narrow electric field, which has been required to be wide conventionally, and (ii) reduces an amount of movement of the electric charge of meniscus, the nozzle 43 arranged such that the nozzle 43 is narrowed toward fluid ejection hole so as to have, as illustrated in FIG. 21, a nozzle diameter substantially equal in size to a curvature 44, where the curvature 44 is formed by the nozzle section 41 in the process of electrostatic attraction in the conventional art, the curvature 44 being a curvature of leading edge of the meniscus 42 of the liquid when the liquid has the Taylor cone-like shape and is about to be ejected.

The inventors of the present invention found out that the concentration region of the electric charge and the meniscus region can be substantially equal by arranging such that the diameter of the liquid ejection hole of the leading portion of the nozzle is smaller than that droplet diameter of the liquid which is attained immediately after ejected.

[Embodiment 2]

The following explains a preferred embodiment of the present invention in reference to drawings.

In order to manufacture a liquid crystal array of the present embodiment, the electrostatic attraction type inkjet apparatus explained in reference to FIGS. 1 to 8 is used.

The following explains a configuration of the liquid crystal array of the present embodiment.

Figure 22:
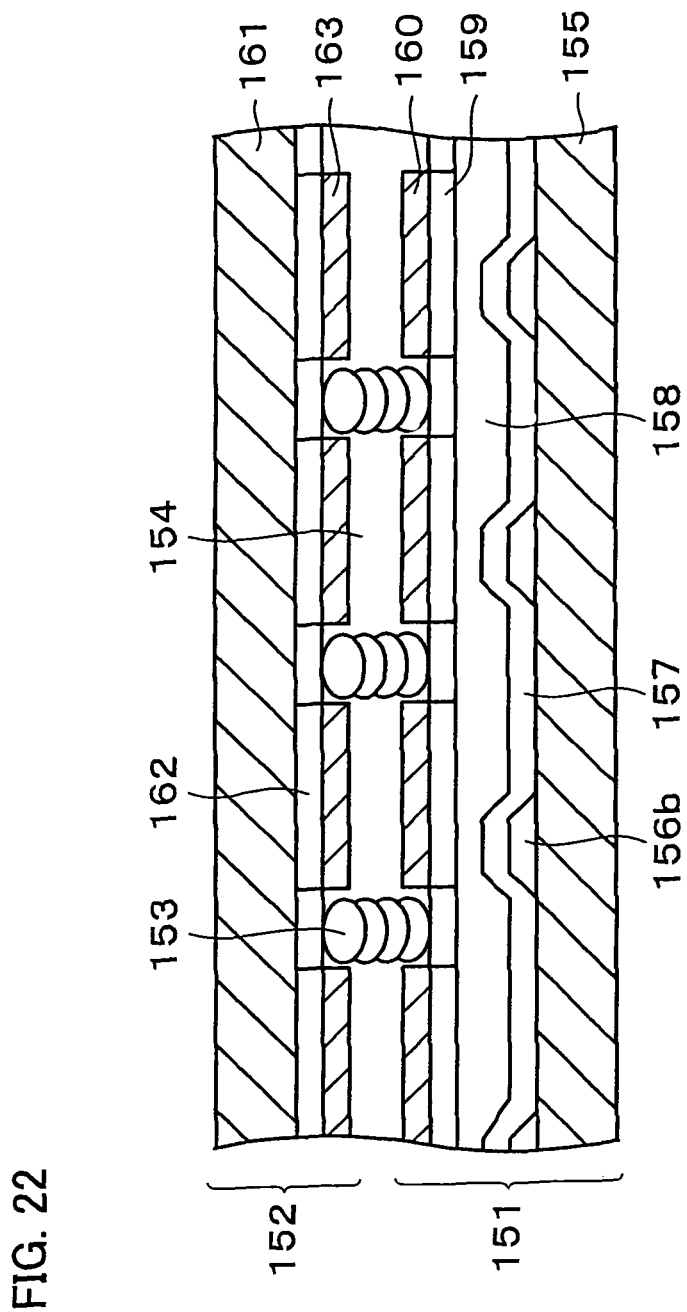
FIG. 22 is a longitudinal sectional view illustrating a liquid crystal array of an embodiment in accordance with the present invention.

As illustrated in FIG. 22, the liquid crystal array of the present embodiment includes (i) a TFT substrate 151, (ii) a color filter substrate 152, (iii) spacers 153 provided between those substrates, and (iv) liquid crystal 154 filled in a gap between the substrates which gap is made by the spacers 153.

The TFT substrate 151 is so arranged that an insulating substrate 155, gate electrodes 156b, a gate insulating film 157, an interlayer insulating film 158, pixel electrodes 159 and alignment films 160 are sequentially formed in this order. Meanwhile, the color filter substrate 152 is so arranged that a glass substrate 161, color filters 162 and alignment films 163 are sequentially formed in this order.

The following explains a process of manufacturing the above-described liquid crystal array.

Figure 23:
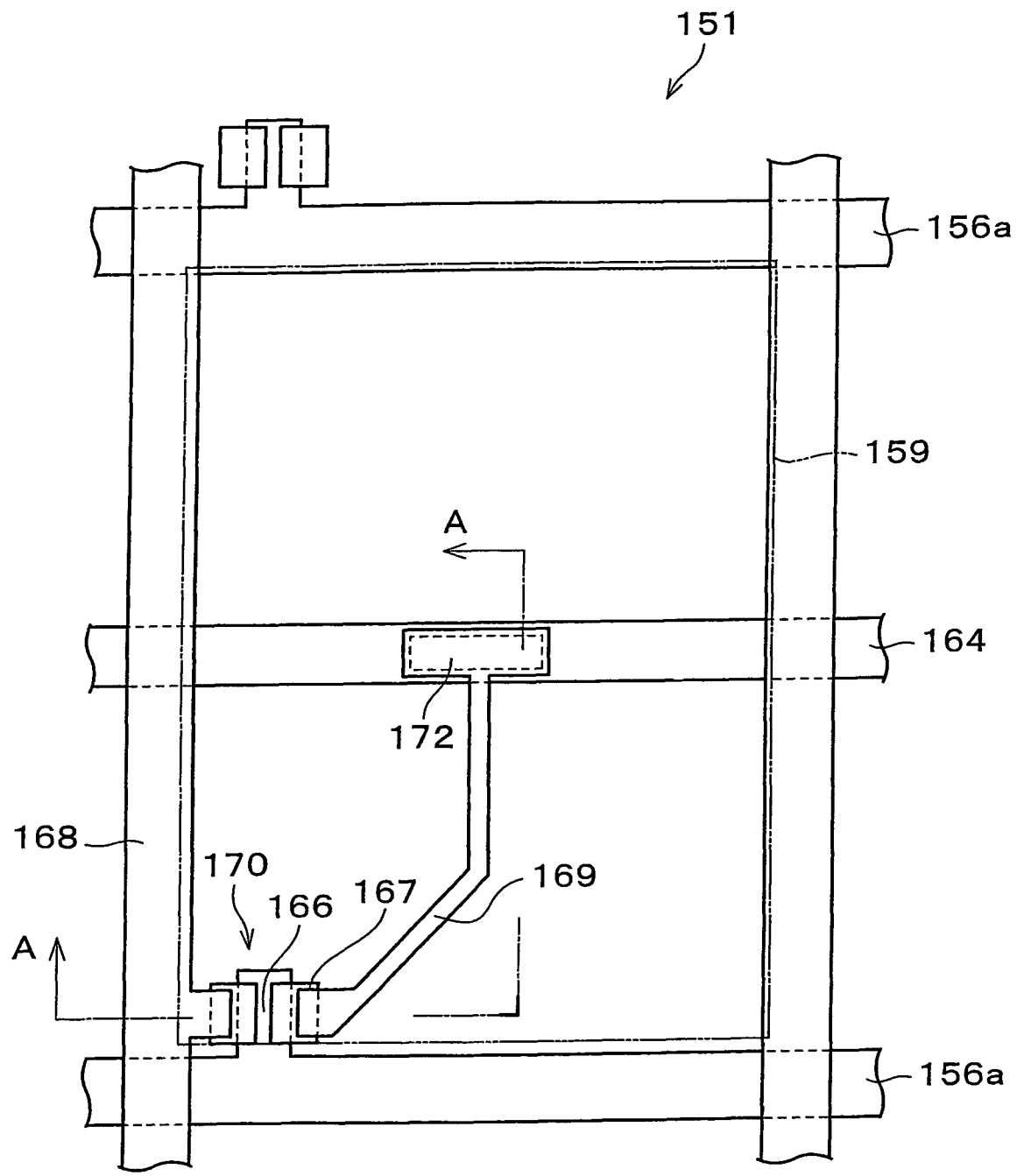
FIG. 23 is a plane view showing a configuration of a single pixel of a TFT substrate shown in FIG. 22.
Figure 24:
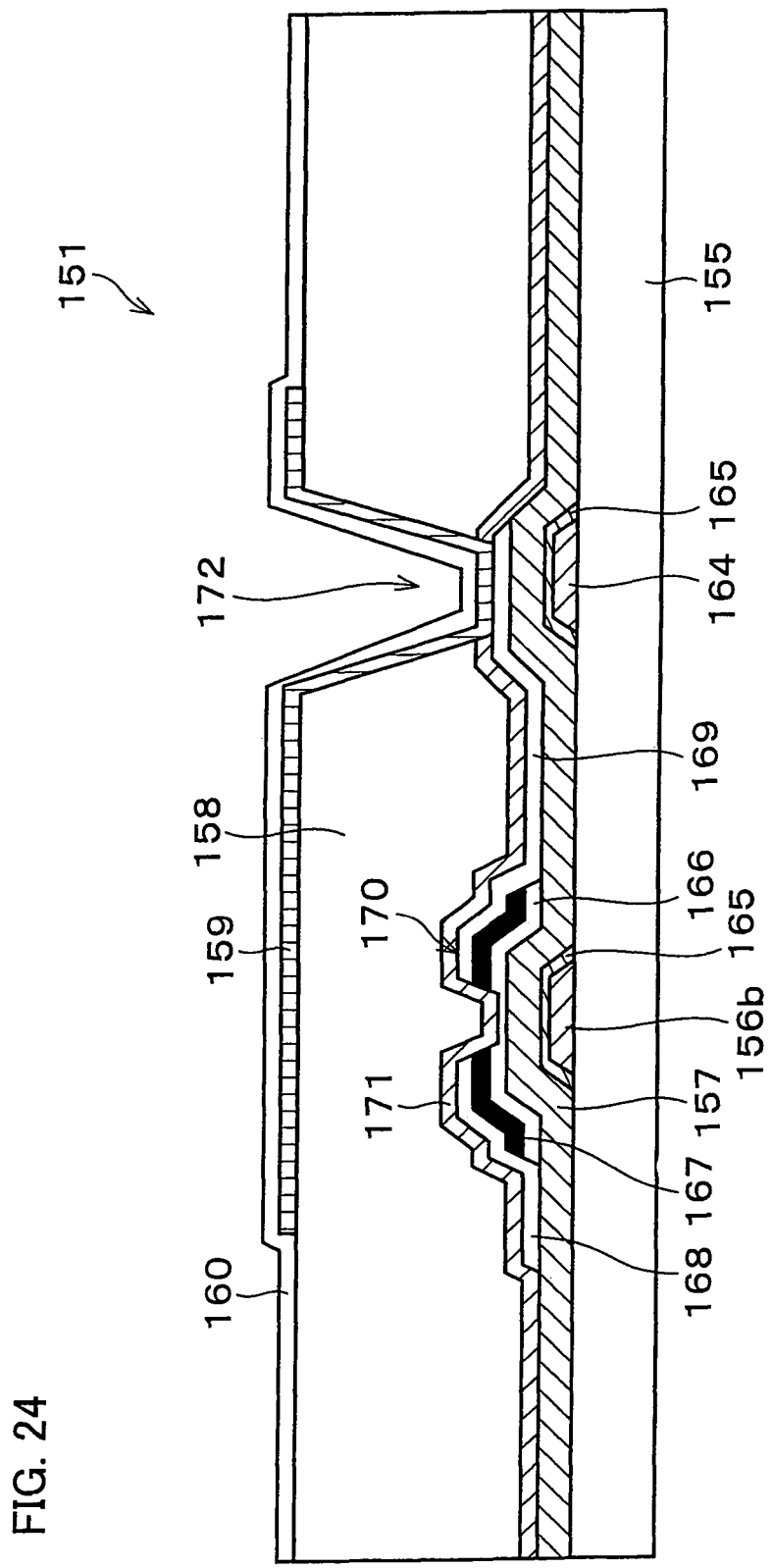
FIG. 24 is a cross sectional view taken at A-A in FIG. 23.

First explained is a process of manufacturing the TFT substrate 151. Detailed configuration of the TFT substrate 151 is illustrated in FIGS. 23 and 24. FIG. 23 is a plane view of the TFT substrate 151, and FIG. 24 is a cross sectional view taken at A-A in FIG. 23. In the TFT substrate 151, the interlayer insulating film is formed via a passivation film.

First, on the insulating substrate 155 made of glass or the like, (i) a film of Al, Mo, Ta, or the like is formed by sputtering, (ii) gate wirings 156a, gate electrodes 156b and auxiliary capacity wirings 164 are formed by photolithography and (iii) anodic oxide films 165 are formed by anodic oxidation.

Next, (i) the gate insulating film (SiNx film) 157, an a-Si layer 166 and an n+-Si layer 167 are continuously layered by plasma CVD and (ii) those are pattered in an island-like shape by photolithography.

Then, a metal layer of Ai, Mo, Ta or the like is formed, and the layer is patterned to be a predetermined shape by photolithography, so as to form source wirings 168 and drain electrodes 169. Next, by channel etching, channel portions of the a-Si layer 166 and the n+-Si layer 167 are formed. Through the process described above, a TFT (active element) 170 which is a switching element is formed in each pixel.

Next, the passivation film 171 of thickness about 350 nm is formed. Then, the interlayer insulating film 158 made of organic materials, etc. is formed, and a contact hole 172 is formed at a predetermined position of each of the drain electrodes 169 by photolithography.

Then, by wet etching or dry etching the passivation film 171 by using, as a mask, the interlayer insulating film 158 made of organic materials, etc., the contact hole 172 reaches the drain electrode 169.

Next, on the interlayer insulating film 158, the pixel electrode 159 made of a transparent conductive film is formed. Then, photoresist is applied, exposed and developed. After that, the wet etching or the dry etching is carried out for the pixel electrode 159 on the interlayer insulating film 158. Then, the pixel electrode 159 is formed by removing the photoresist. In this way, the TFT substrate is so fabricated that the interlayer insulating films 158 are formed via the passivation film 171.

The following explains a process of manufacturing the color filter substrate 152.

Figure 25:
FIGS. 25(a) through 25(d) are longitudinal sectional views illustrating manufacturing process of a color filter substrate shown in FIG. 22.
Figure 25:
Figure 25:
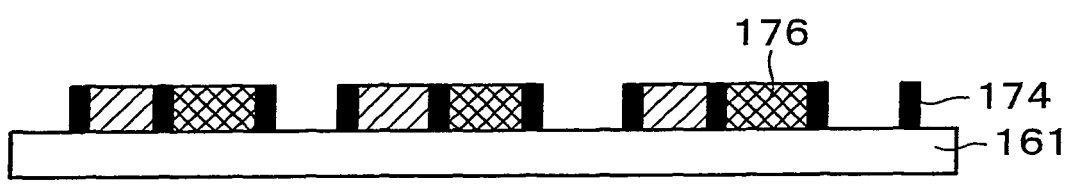
Figure 25:
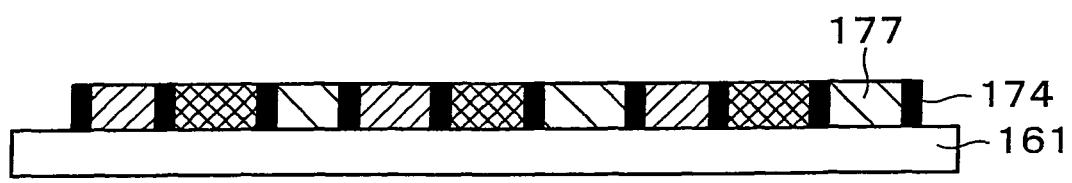

FIGS. 25(a) to 25(b) illustrate a process of manufacturing the color filter substrate.

First, as illustrated in FIG. 25(a), metal oxides are stacked on a transparent substrate 61, such as a glass substrate, by photolithography, thus forming BMs 174.

Next, as illustrated in FIGS. 25(b) to 25(d), three-primary-color (R, G and B) color filters 162 (R pixel 175, G pixel 176 and B pixel 177) are sequentially formed on the transparent substrate 61 by a pigment dispersion method. In this case, photoresist is applied entirely to the transparent substrate 61 by spin coating. Note that, this photoresist is a photo-curing resin composition in which R pigments are dispersed. After that, the photoresist is exposed and developed. As a result, a color filter 162, that is, the R pixel 175 is formed at a predetermined position. In the same way, the G pixel 176 and the B pixel 177 are formed as the color filters 162.

Note that, the method of forming the color filters 162 is not limited to the pigment dispersion method, but it is possible to use other methods, such as a printing method and an electrodeposition method. In the case of using the electrodeposition method, a process of forming the BMs 174 is carried out after a process of forming the color filters 162.

Then, alignment films 160 and 63 are formed as a part of the TFT substrate 151 and as a part of the color filter substrate 152, respectively. In this process, the alignment films 160 and 63 which are polyamide films are respectively formed as a part of the TFT substrate 151 and as a part of the color filter substrate 152 by the printing method or the like, and solvents are evaporated and removed in a process of baking. After that, a rubbing treatment is carried out with respect to the alignment films 160 and 63 of those substrates by using a roller.

The following explains a process of forming the spacers 153. This process is carried out after the processes of forming the TFT substrate 151 and the color filter substrate 152. In the present embodiment, the spacers 153 are formed with respect to the color filter substrate 152.

Figure 26:
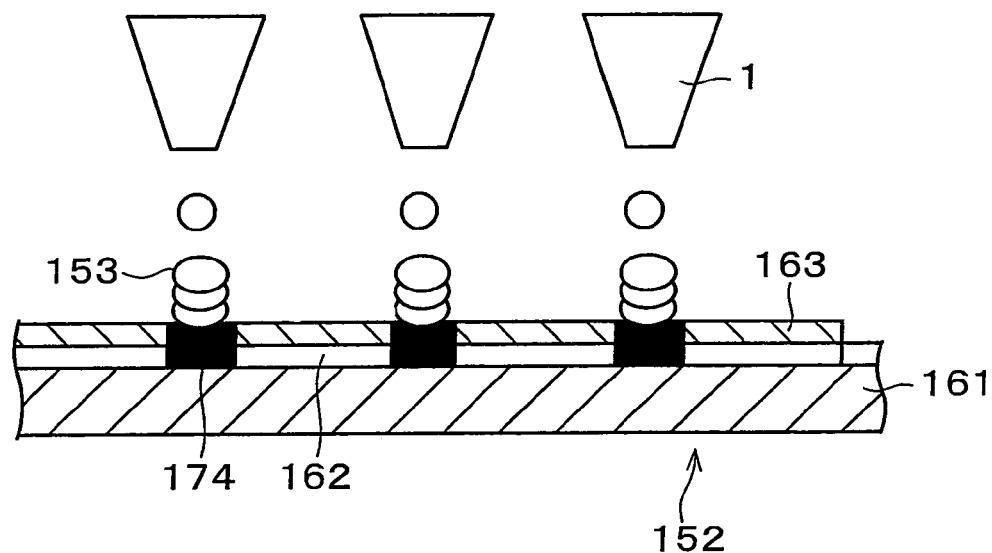
FIG. 26 is a longitudinal sectional view illustrating a process of forming spacers shown in FIG. 22.

The spacers 153 are formed by using the inkjet apparatus 15 illustrated in FIG. 1 which repeatedly ejects a spacer-forming liquid so that the spacer-forming liquid lands in lamination, the spacer-forming liquid being for forming the spacers 153 on the BMs 174 of the color filter substrate 152. Curable resins are dissolved in the spacer-forming liquid. This process is illustrated in FIG. 26.

A component of the curable resins may be acrylic ester, vinyl acetate, or the like, but the components are not limited to these. Further, examples of a monomer which is a component of a polymer or a copolymer contained in the composition of the curable resins are N,N-Dimethylol Acrylamide, N,N-Dimethoxymethyl Acrylamide, N,N-Diethoxymethyl Acrylamide, N,N-Dimethylol Methacrylamide, N,N-Dimethoxymethyl Methacrylamide, N,N-Diethoxymethyl Methacrylamide, etc., but the examples are not limited to these. Each of these monomers is used as a homopolymer or used in a copolymer with other vinyl monomer(s). Moreover, examples of the above other vinyl monomers are (i) acrylic ester, such as acrylic acid, methacrylic acid, methyl acrylate and ethyl acrylate, (ii) methacrylic ester, such as methyl methacrylate and ethyl methacrylate, (iii) a vinyl monomer containing a hydroxyl group, such as hydroxymethyl methacrylate, hydroxyethyl methacrylate, hydroxymethyl acrylate and hydroxyethyl acrylate and (iv) others, such as styrene, α-methylstyrene, acrylamide, methacrylamide, acrylonitrile, allylamine, vinylamine, vinyl acetate and vinyl propionate.

Moreover, in addition to the curable resin, the spacer-forming liquid further includes water or the like as a solvent.

The nozzle 1 of the inkjet apparatus 15 has a nozzle diameter 6 μm. A surface on which the droplet 12 of the spacer-forming liquid lands (a surface of the BM 174 on which surface a spacer is formed) has a diameter 10 μm. A volumetric concentration of the spacer-forming liquid is 25%, and the spacer formed by one dropet 12 has a thickness 0.4 μm. The spacer 153 desirably has a thickness 5 μm. Therefore, by ejecting eleven droplets 12 at the same region, the spacer 153 can be formed. The droplets 12 of the spacer-forming liquid, that is, the curable resin is dried and cured soon after they land. Therefore, they do not spread or move on the BM 174. Moreover, because the droplets 12 dries soon after they land, they do not spread even though the droplets 12 collide with each other. Therefore, it is possible to consecutively eject the droplets 12.

The spacer-forming liquid has a density of 30 cP. The inkjet apparatus 15 can eject further thicker liquid. Concretely, the inkjet apparatus 15 can eject liquid of viscosity 100 cP. On this account, it is possible to use the spacer-forming liquid having further higher density.

Moreover, it is unnecessary to apply heat in order to cure the curable resins. However, the heat may be applied in order to stably cure the resins.

Materials of the spacer 153 of the present invention are not limited to the curable resins, as long as the materials can realize the spacer having desired thickness and strength.

The following explains (i) a process of assembling together the TFT substrate 151 and the color filter substrate 152 including the spacers 153 and (ii) a process of filling the liquid crystal 154.

First, in the process of assembling, a seal resin is printed on the color filter substrate 152. The seal resin is used to adhere to the TFT substrate 151, and is an epoxy resin. Next, the color filter substrate 152 and the TFT substrate 151 are bonded with each other by the seal resin. After that, the heat is applied so as to cure the seal resin.

Next, an array formed by bonding the above substrates is cut into a desired size. Then, the liquid crystal 154 is filled by using a vacuum filling apparatus, and a filling opening is sealed by a resin. After that, ultrasonic cleaning is carried out. As a result, a liquid crystal array is obtained.

Results obtained by further considering the configuration of the inkjet apparatus 15 capable of forming spacers are explained above in reference to FIGS. 14 to 21.

[Embodiment 3]

The following explains another embodiment of the present invention.

Figure 27:
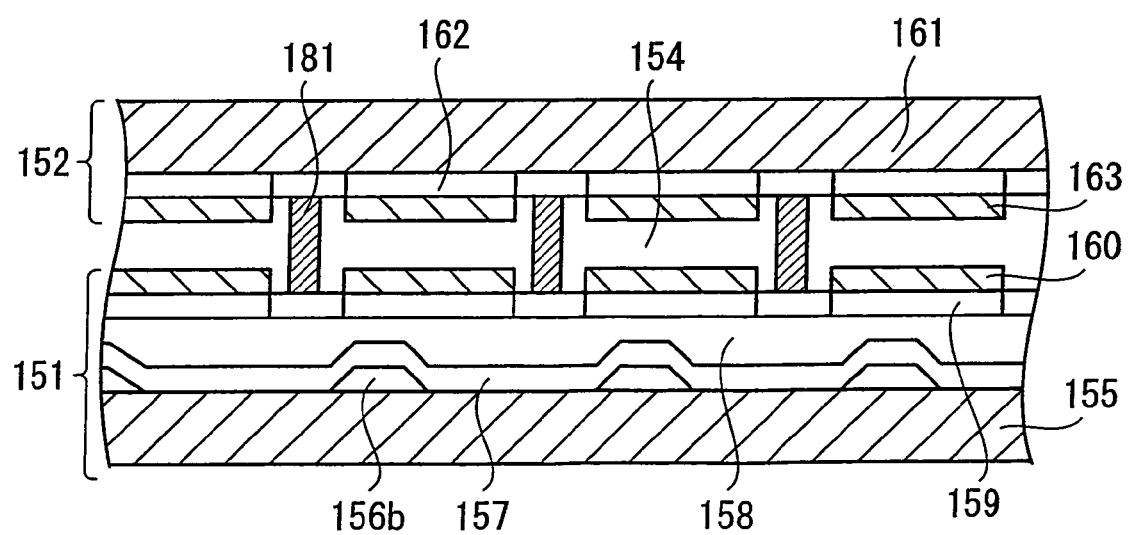
FIG. 27 is a longitudinal sectional view illustrating a liquid crystal array of yet another embodiment in accordance with the present invention.

As illustrated in FIG. 27, the liquid crystal array of the present embodiment includes spacers 181 each in the form of a column, instead of the spacers 153 having a lamination structure. Each of the spacers 181 is formed by releasing, from the nozzle 1, a material continuously in a string-like form, the material being for forming spacers. The other arrangements of the liquid crystal array of the present embodiment are the same as those of the above-described liquid crystal array. That is, the processes of forming the TFT substrate 151, the color filter substrate 152, and the alignment films 160 and 63 of the present embodiment are similar to those of Embodiment 1.

The inkjet apparatus 15 used for forming the spacers 181 is substantially the same as that used in Embodiment 1. In the arrangement of the inkjet apparatus 15 illustrated in FIG. 1, the nozzle 1 has a nozzle diameter 2 μm, and an actuator is attached to the ink chamber 2. This arrangement makes it possible to vary the distance between the nozzle 1 and the record-subjected-side substrate 14 (color filter substrate 152). Moreover, as the spacer-forming liquid, an ethanol solution of polyvinyl phenol is used.

Figure 28:
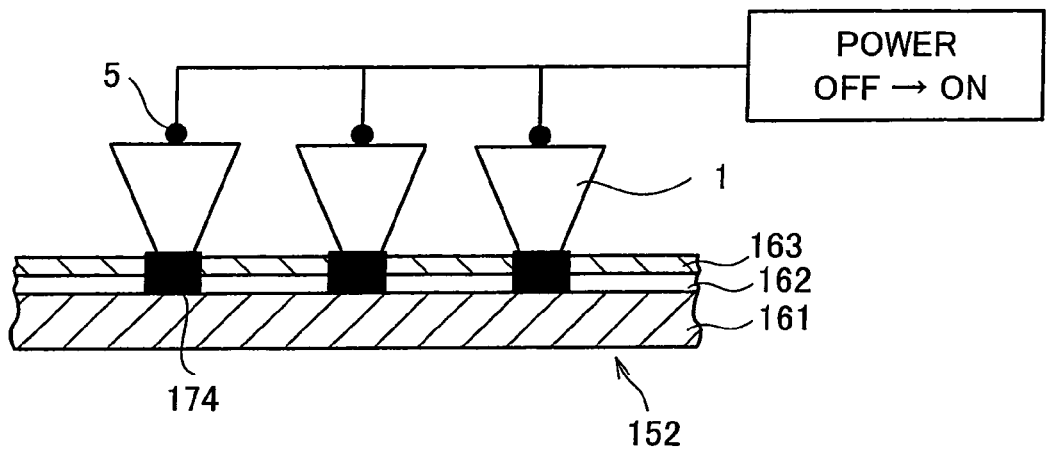
FIGS. 28(a) through 28(c) are longitudinal sectional views illustrating the process of forming the spacer shown in FIG. 27.
Figure 28:
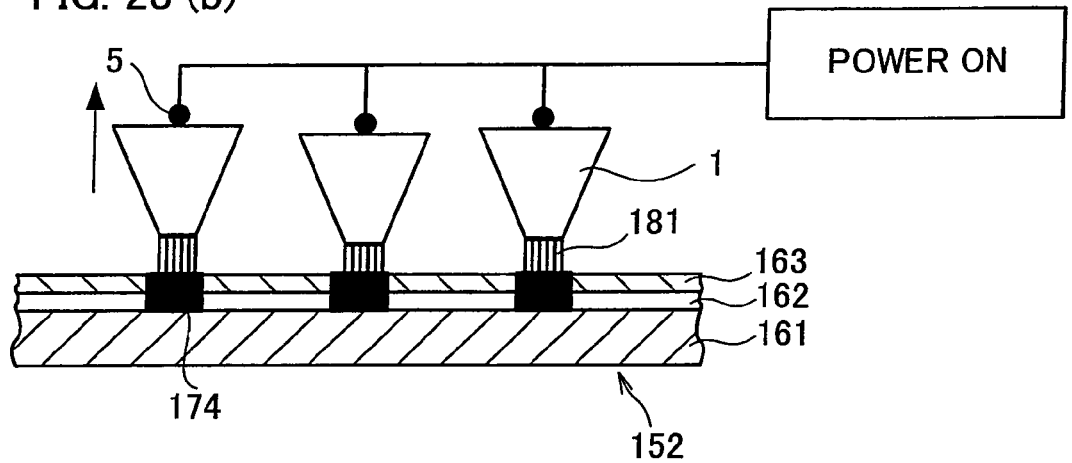
Figure 28:
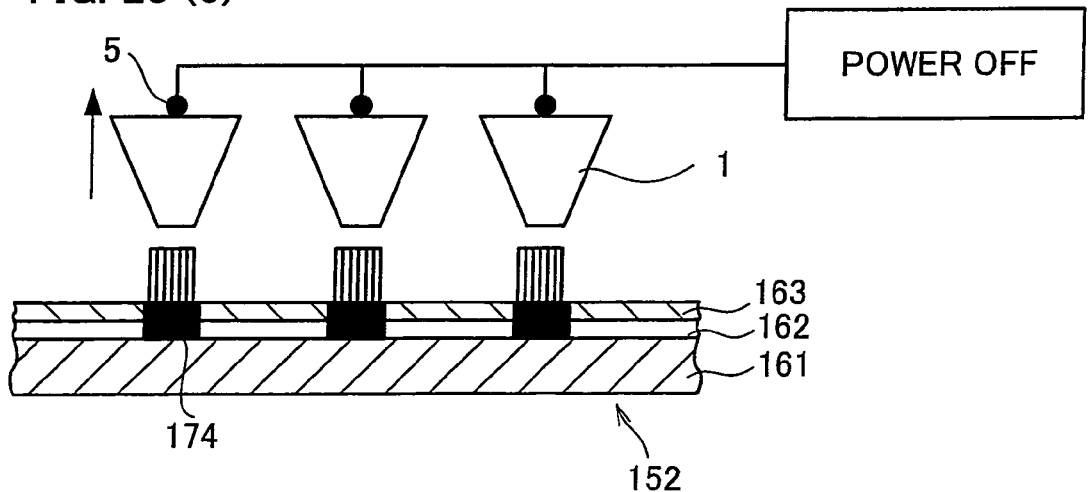

FIGS. 28(a) to 28(c) illustrate a process of forming the spacers of the present embodiment. First, as illustrated in FIG. 28(a), the nozzle 1 is positioned perpendicularly with respect to the color filter substrate 152, and the top portion of the nozzle 1 is in contact with the BM 174 provided on the color filter substrate 152. At this moment, a voltage is not applied to the nozzle electrode 5.

Next, as illustrated in FIG. 28(b), while applying direct-current voltages to the nozzle electrode 5, the actuator acts so that the nozzle 1 moves away from the color filter substrate 152. By applying the direct-current voltages, the solution shrinks in the nozzle 1. Therefore, when the nozzle 1 moves upward, polyvinyl phenol is ejected in the form of a stick. As a result, the spacer 181 in the form of a column is made.

The spacer 181 desirably has a height 5 μm. Therefore, as illustrated in FIG. 28(c), when the column which becomes the spacer 181 reaches that height, a power source is turned OFF, and the nozzle 1 keeps on moving upward. In this way, the column of the spacer 181 is separated from the nozzle 1. As a result, the spacer 181 in the form of a column can be obtained. The spacers 181 are formed for securing the gap between the TFT substrate 151 and the color filter substrate 152.

[Embodiment 4]

The following explains yet another embodiment of the present invention.

Figure 29:
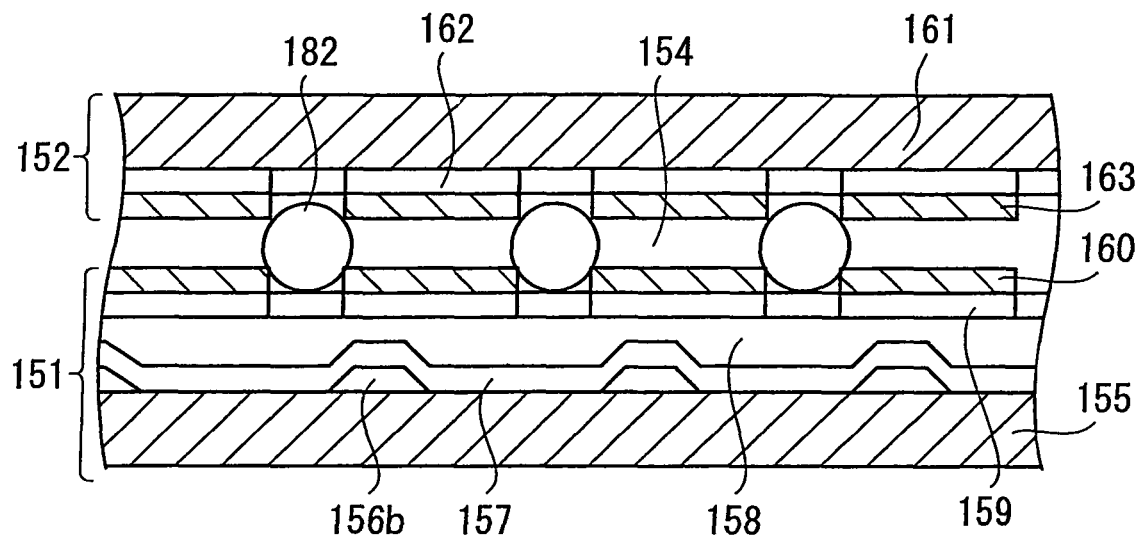
FIG. 29 is a longitudinal sectional view illustrating a liquid crystal array of still another embodiment in accordance with the present invention.

As illustrated in FIG. 29, the liquid crystal array of the present embodiment includes spacers 182 each in the form of a globe, instead of the spacers 153 having a lamination structure. Each of the spacers 182 is formed by ejecting, from the nozzle 1, a globular particle which becomes the spacer 182. The other arrangements of the liquid crystal array of the present embodiment are similar to those of the above-described liquid crystal array. That is, the processes of forming the TFT substrate 151, the color filter substrate 152, and the alignment films 160 and 63 of the present embodiment are similar to those of Embodiment 1.

The inkjet apparatus 15 used for forming the spacers 182 is substantially similar to that used in Embodiment 1. Note that, in the arrangement of the inkjet apparatus 15 illustrated in FIG. 1, the nozzle 1 has a nozzle diameter 8 μm, and the amount of one drop ejected from the nozzle 1 is 0.25 pl.

Figure 30:
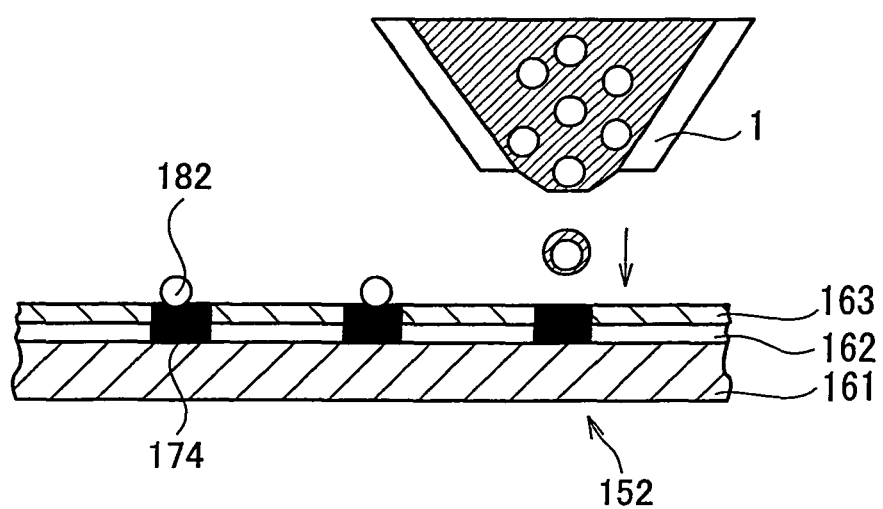
FIG. 30 is a longitudinal sectional view illustrating a process of forming spacers shown in FIG. 29.

FIG. 30 illustrates a process of forming the spacers of the present embodiment. The spacer-forming liquid, in the present embodiment is a mixture in which the globular particles (which become the spacers 182) made of plastic each having a diameter 3 µm are mixed in alcohol. Type of the solution is not particularly limited, and it is preferable that the solution do not dissolve the globular particles (spacers 182) and the alignment film 163 therein.

Next, in order to form the spacers 182, the droplets 12 of the spacer-forming liquid are ejected form the nozzle 1 so as to land on the BMs 174 provided on the color filter substrate 152. In this case, the droplets 12 dries soon after they land. Accordingly, the spacers 182 do not gather around the droplets 12. Therefore, the spacers 182 do not scatter on the color filter substrate 152, and the aperture ratio does not deteriorate locally.

Operations of the inkjet apparatus 15 are changed according to the change in frequency or amplitude of an applied voltage from the process control section 25 to the nozzle electrode 5.

The inkjet apparatus 15 stops ejecting the droplets 12 under the condition that the frequency of the applied voltage becomes a certain value or more or the amplitude of the applied voltage becomes a certain value or less. However, even when the frequency is the certain value or more or the amplitude is the certain value or less, the applied voltage causes an effect of stirring the liquid inside the nozzle 1. On this account, even when the droplets are not ejected, it is possible to suppress the clogging of the nozzle 1 by applying a voltage to the nozzle electrode 5.

[Embodiment 5]

The following explains still another embodiment of the present invention.

The liquid crystal array of the present embodiment includes the spacers 182 which are globular particles. The spacers 182 are scattered on the color filter substrate 152. Therefore, unlike the liquid crystal array illustrated in FIG. 30, positions where the spacers 182 are provided are not limited to the BMs 174. The other arrangements of the liquid crystal array of the present embodiment are similar to those of the above-described liquid crystal array. That is, the processes of forming the TFT substrate 151, the color filter substrate 152, and the alignment films 160 and 63 of the present embodiment are the same as those of Embodiment 1.

The inkjet apparatus 15 used in the present embodiment is substantially similar to that used in Embodiment 1. Note that, the nozzle 1 has a nozzle diameter 8 µm, and the amount of one drop ejected from the nozzle 1 is 0.25 pl.

First, in a process of forming spacers, the spacers 182 each in the form of a globular are mixed in alcohol, and the resulting mixture is sprayed on the color filter substrate 152 by using a spray. Each of the spacers 182 is a plastic ball of diameter 5 µm.

At this moment, a plurality of spacers 182 gather around one droplet landed on the color filter substrate 152, thus forming a spacer aggregate. If nothing is done, the spacer aggregate stays at the above position even after the alcohol of the spacer aggregate is vaporized, and this results in a local decrease in the aperture ratio. In view of this, in the present embodiment, one process is carried out for suitably dispersing the spacers 182 of the spacer aggregate by using the inkjet apparatus 15. The following explains this process in reference to FIGS. 31(*a*) and 31(*b*).

Figure 31:
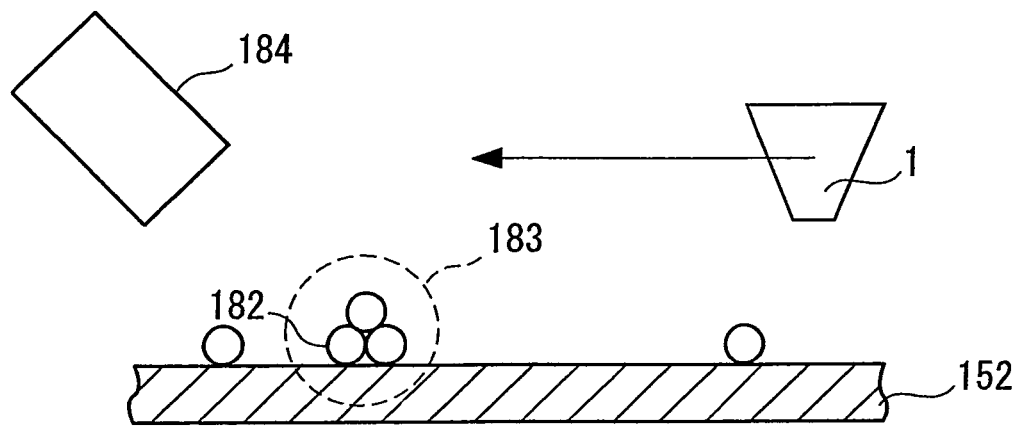
FIGS. 31(a) and 31(b) are explanatory figures of yet still another embodiment in accordance with the present invention, and are illustrating a process of forming spacers in a liquid crystal array.
Figure 31:
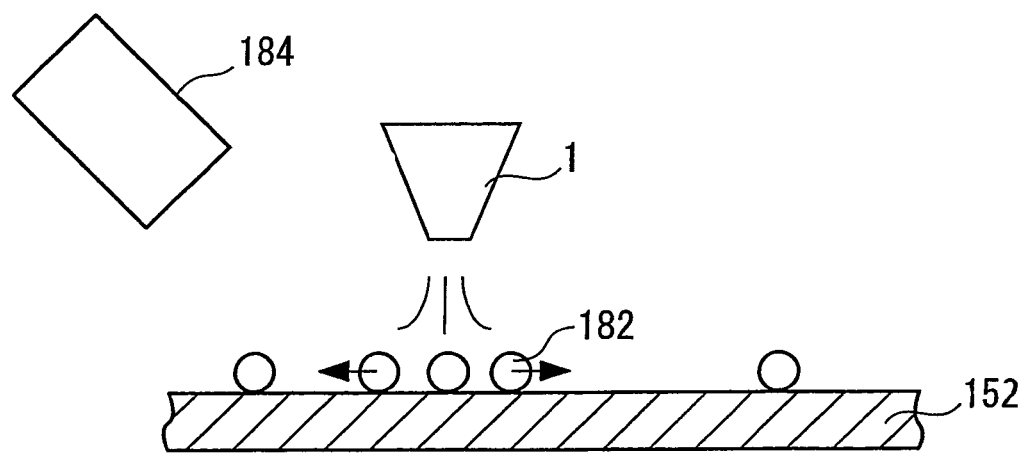

First, as illustrated in FIG. 31(*a*), a region where spacers are sprayed is observed by using a CCD camera (observing means) 84 to see if there is a spacer aggregate 183. Next, a relative position of the nozzle 1 and the color filter substrate 152 is adjusted so that the nozzle 1 positions directly above the center of the spacer aggregate 183 observed by the CCD camera 84.

Then, as illustrated in FIG. 31(*b*), the droplet 12 is ejected with respect to the spacers 182 adjacent to each other. Liquid of the droplet 12 is not especially limited, and it is preferable that the liquid do not dissolve the spacers 182 and the alignment film 163.

When the spacer aggregate 183 is collided with the droplet 12, the spacers 182 are separated from each other. In this way, it is possible to avoid the local decrease in the aperture ratio in the liquid crystal array, which decrease occurs because, for example, the spacers 182 position adjacent to each other.

The droplet 12 is ejected with respect to the spacer aggregate 183. In addition to this, the droplet 12 may be ejected, for example, with respect to one spacer 182 at a position away from the BM 174. In this case, it is possible to move the spacer 182 from the position away from the BM 174 to a position on the BM 174. This prevents a decrease in the aperture ratio.

In the foregoing embodiment, the spacers are formed on the color filter substrate 152, but the present invention is not limited to this. The spacers may be formed on the TFT substrate 151. Moreover, it is preferable that a position for forming the spacers be on the BM 174, but the present invention is not limited to this.

As above, according to a method of manufacturing the color filter substrate of the present invention, the droplets having landed dries quickly, the movement of the droplet having landed is suppressed and the color filter layer can be formed accurately and inexpensively. On this account, in the method of manufacturing the color filter substrate of the present invention, the liquid containing materials for forming the color-filter substrate is ejected as the droplet 12 from the ejection hole of the nozzle by using the inkjet method. As a result, the color filter layer is formed. Moreover, the color filter layer is formed by (i) using the electrostatic attraction type inkjet apparatus 15 whose ejection hole 1*b* has a diameter shorter than that of the droplet 12 and (ii) ejecting the droplet 12 from the nozzle of the inkjet apparatus 15. Note that, the amount of one drop of the droplet 12 is 1 pl or less.

[Embodiment 6]

The following explains a preferred embodiment of the present invention in reference to drawings.

In order to manufacture the color filter substrate of the present embodiment, the electrostatic attraction type inkjet apparatus explained in reference to FIGS. 1 to 8 is used.

Figure 32:
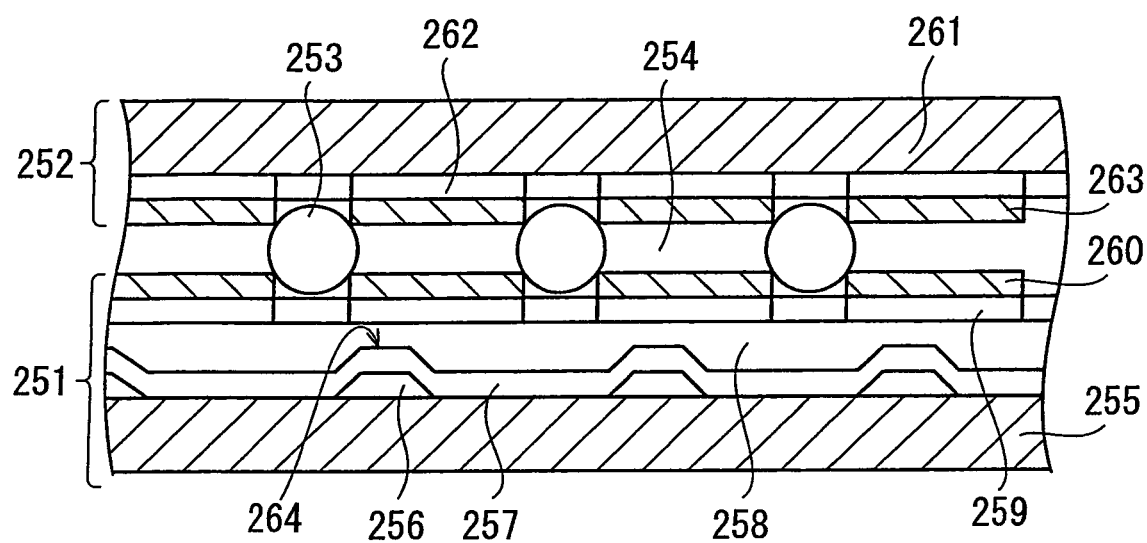
FIG. 32 is a longitudinal sectional view illustrating a liquid crystal array provided with a color filter substrate of further embodiment in accordance with the present invention.

The following explains a method of manufacturing the color filter substrate by using the inkjet apparatus 15 illustrated in FIG. 1. As illustrated in FIG. 32, in the present embodiment, a color filter substrate 252 is provided as a part of the liquid crystal array with a TFT substrate 251.

As illustrated in FIG. 32, the liquid crystal array includes (i) the TFT substrate 251, (ii) the color filter substrate 252, (iii) spacers 253 provided between those substrates, (iv) liquid crystal 254 filled in a gap between the substrates, the gap being made by the spacers 253 and (v) a sealing member (not illustrated) which seals the liquid crystal array.

The TFT substrate 251 is so arranged that a substrate 255, gate electrodes 256, a gate insulating film 257, an interlayer insulating film 258, pixel electrodes 259 and alignment films 260 are sequentially formed in this order. Moreover, the TFT substrate 251 includes TFTs 264. On the alignment films 260, plastic balls are scattered as the spacers 253. Meanwhile, the color filter substrate 252 is so arranged that a substrate 261, color filter layers 262 and alignment films 263 are sequentially formed in this order.

Each of the substrates 255 and 261 may be (i) a substrate made of an inorganic material, such as a quarts substrate and a glass substrate, or (ii) a resin substrate, such as a polyethylene terephthalate substrate, a polyether sulfone substrate and a polyimide substrate. However, the present invention is not limited to these.

In the conventional color filter substrates, the BM is formed for providing clear contrast of the pixels of the color filter layers 262 adjacent to each other. However, in the color filter substrate 252 of the present embodiment, metal wirings, such as gate wirings and source wirings formed on the TFT substrate 251, are used as the BM. Therefore, the BM for an exclusive use is not formed here.

The following explains a liquid for forming color filters, that is, ink ejected from the inkjet apparatus 15 illustrated in FIG. 15.

In the present embodiment, the ink (that is, color ink for pixels) for forming red, green and blue color filter layers 262 is prepared in the following way.

(A) Red ink is prepared as follows: (i) a Red pigment, surfactant, resin and water are mixed, (ii) a resulting mixture is agitated for one hour at room temperature in order to finely disperse the pigments.

(B) Green ink is prepared in the same way as (A), except that green pigment is used instead of the red pigment.

(C) Blue ink is prepared in the same way as (A), except that blue pigment is used instead of the red pigment.

The following explains a layout of a color filter (pixel).

In a liquid crystal display provided with the color filter substrate 252, a layout of the pixels is a stripe layout illustrated in FIG. 33(a) in which red (R) color filter pixels 271, green (G) color filter pixels 272 and blue (B) color filter pixels 273 are arranged in a matrix. Note that, the layout of the pixels may be a mosaic layout illustrated in FIG. 33(b) or a delta layout illustrated in FIG. 33(c).

Respective areas occupied by the R color filter pixels 271, the G color filter pixels 272 and the B color filter pixels 273 in the color filter substrate 252 are not necessarily at a ratio of 1:1:1. Moreover, the areas occupied by respective pixels may be the same with each other or may be different from each other.

Generally, in order to prevent mixing the color filter layers 262 adjacent to each other, it is preferable that dividing walls be provided between the pixels whose colors are different from each other. In the manufacturing method of the present invention, the ink for forming the color filter layers 262 dries soon after the ink lands. Therefore, the droplets do not spread, and materials for color filter layers can be applied and stacked. On this account, the color filter layers 262 of the pixels adjacent to each other do not contact with each other, or do not mix with each other. As a result, it is possible to omit a process of forming the dividing walls.

However, the dividing walls may be formed in order to provide clear contrast of the pixels adjacent to each other. In this case, the dividing walls do not have to prevent mixing the color filter layers 262 adjacent to each other. Therefore, the height of each dividing wall may be lower than that of each color filter layer 262.

Each of the dividing walls may have a single-layer structure or a multi-layer structure. Moreover, the dividing walls may be provided between the pixels or between the color filters 262 whose colors are different from each other. It is preferable that a material of the dividing walls be insoluble or hardly soluble in a solvent in which a material for the color filter is dissolved or dispersed, that is, in a solvent of the liquid for forming the color filter. In view of improving display quality of a display device, it is particularly preferable to use materials for the black matrix (BM) (for example, chromium, resin black, etc.).

The following explains a method of connecting the pixel electrodes 259 corresponding to respective pixels.

Figure 34:
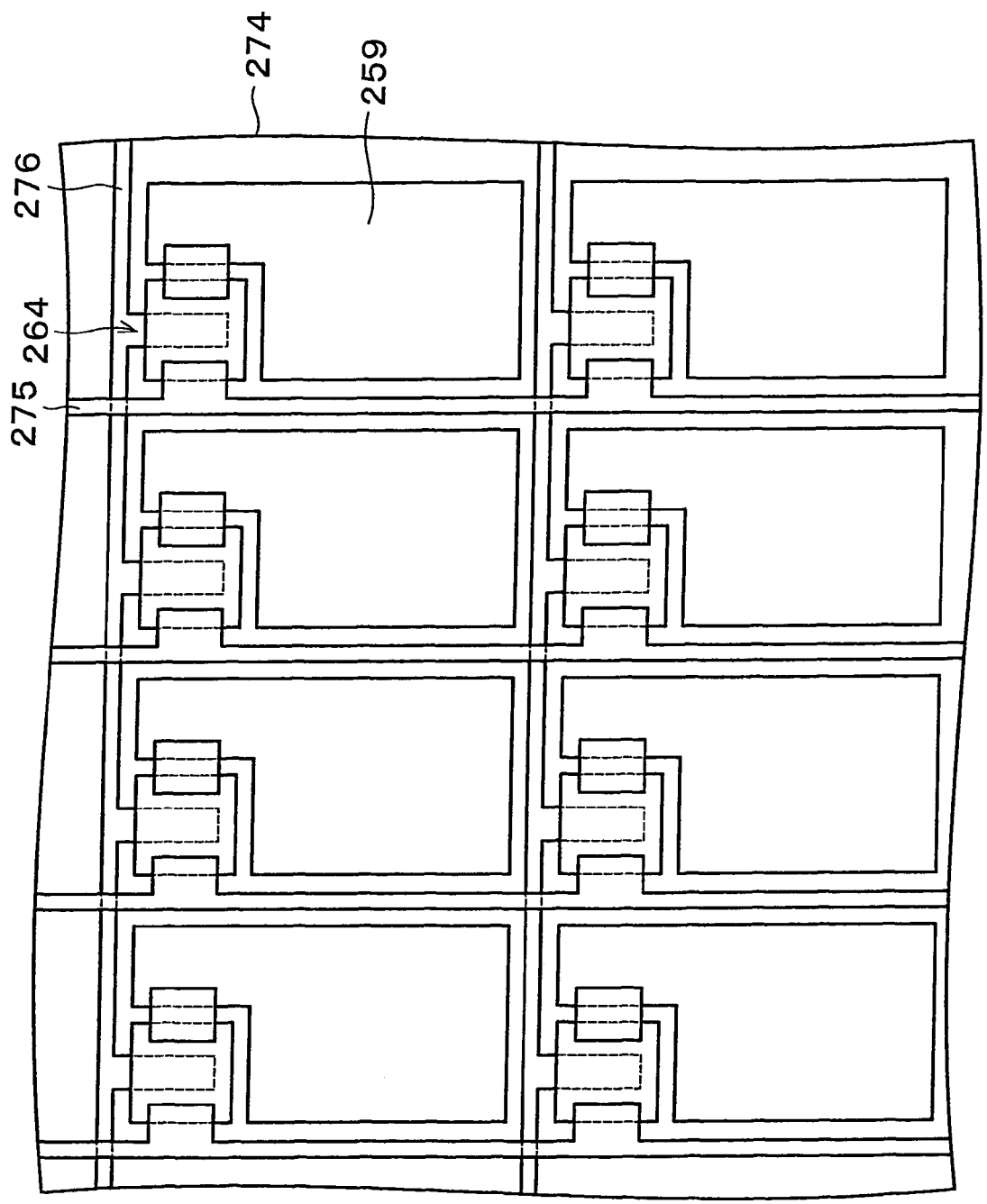
FIG. 34 is a plane view of the yet another embodiment in accordance with the present invention, and is illustrating an example arrangement of electrodes in the liquid crystal array having the color filter substrate.

For example, as illustrated in FIG. 34, in a liquid crystal display 274 provided with the color filter substrate 252, the pixel electrode 259 is connected with a common wiring, that is, a source bus line 275 and a gate bus line 276 via the TFT 264. In the liquid crystal display 274 illustrated in FIG. 34, a plurality of pixels are arranged in a matrix. By giving a plurality of colors to these pixels by the color filter substrate 252, a full color display can be achieved. It is preferable that a plurality of colors be a combination of red, green and blue.

The following explains a method of forming the color filter layers 262 in the color filter substrate 252.

In a process of forming the color filter layers 262, the red ink, the green ink and the blue ink are sequentially applied in an inkjet-patterning manner by using the inkjet apparatus 15 in the following way.

Figure 35:
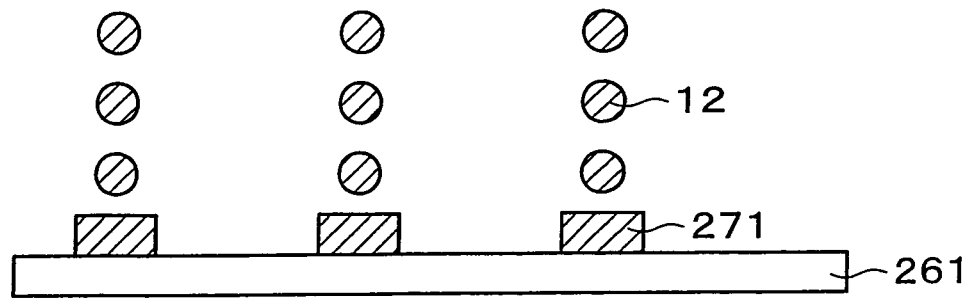
FIG. 35(a) is a longitudinal sectional view illustrating a process of forming the R-color filter pixel in the color filter substrate shown in FIG. 32.
FIG. 35(b) is a longitudinal sectional view illustrating a process of forming a G-color filter pixel.
FIG. 35(c) is a longitudinal sectional view illustrating a process of forming a B-color filter pixel.
Figure 35:
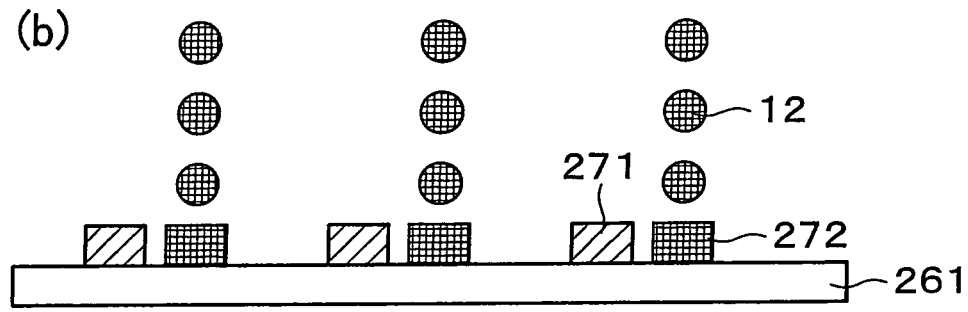
Figure 35:
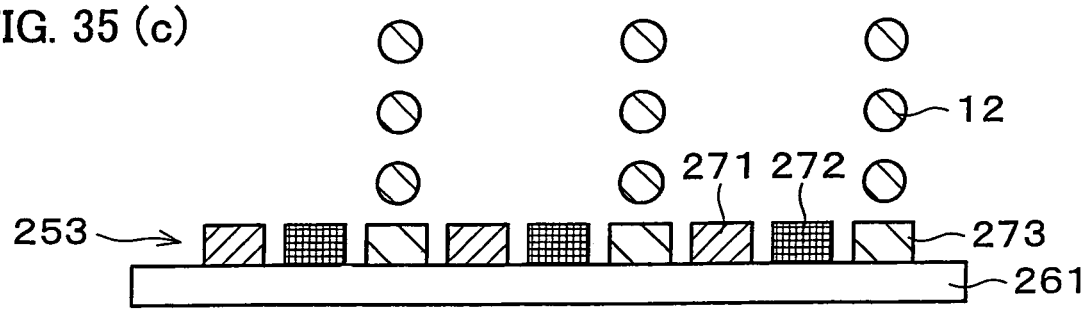
Figure 36:
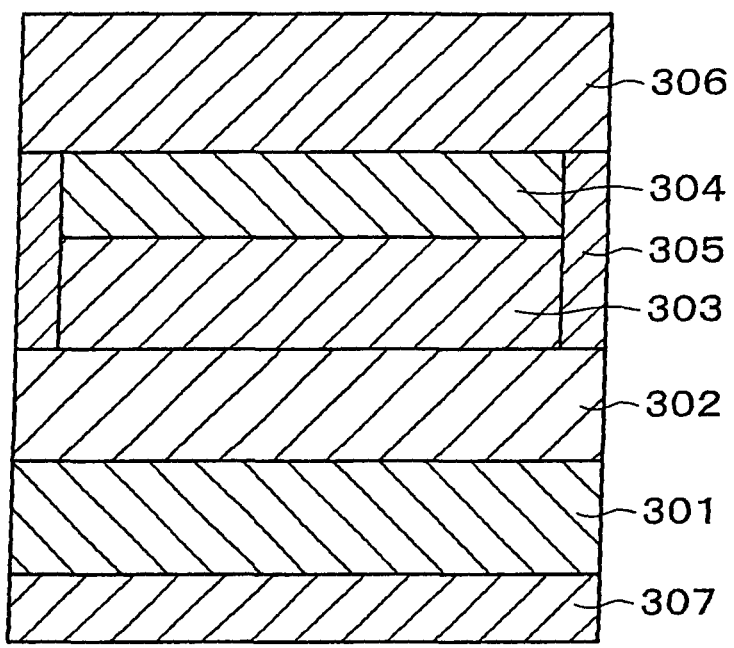
FIG. 36 is a longitudinal sectional view illustrating a schematic configuration of a single pixel of the organic EL element in a conventional organic EL display.
Figure 37:
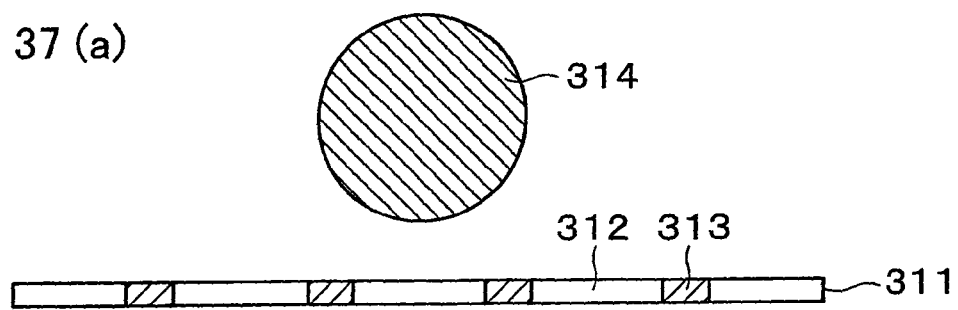
FIGS. 37(a) through FIG. 37(c) are longitudinal sectional views illustrating a formation of the organic EL layer.
Figure 37:
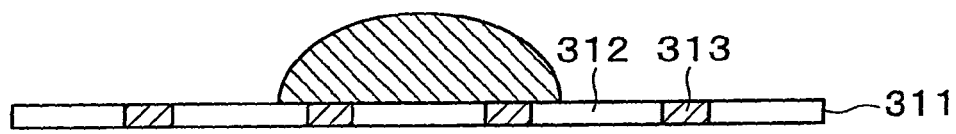
Figure 37:
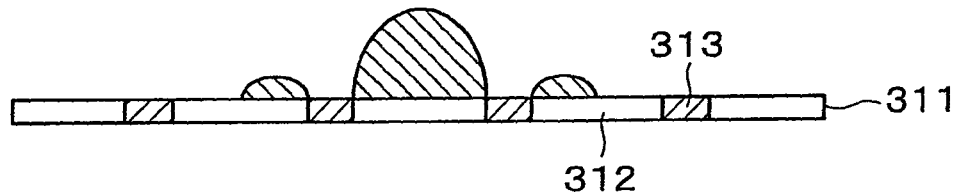
Figure 38:
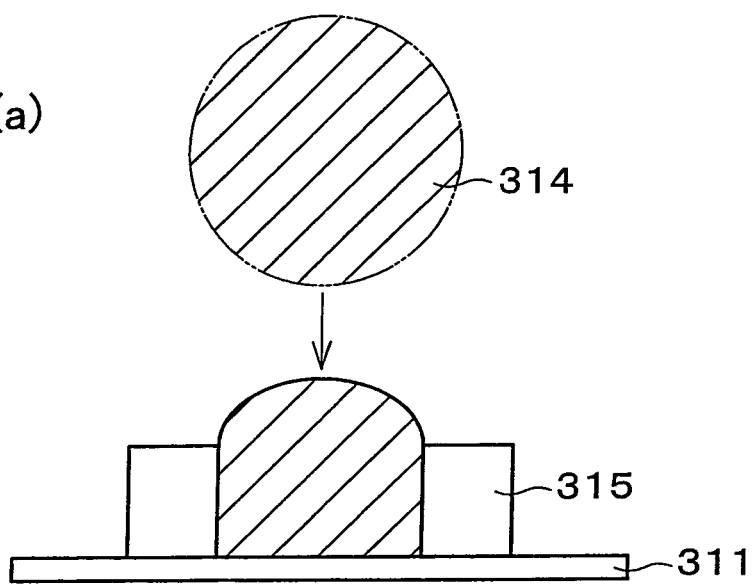
FIG. 38(a) is a longitudinal sectional view illustrating a state of the organic EL layer formation, in which the droplet is landed, and the black matrix is used as a barrier.
FIG. 38(b) is a longitudinal sectional view illustrating the formed organic EL layer having uneven layer thickness.
Figure 38:
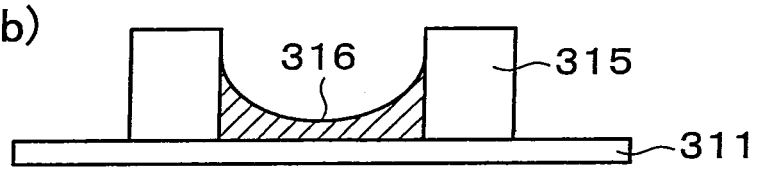
Figure 39:
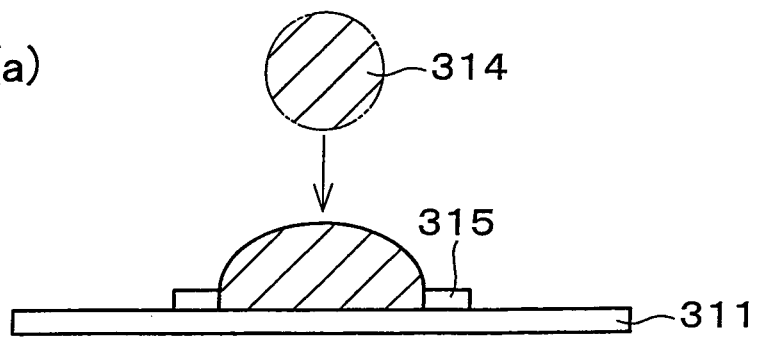
FIG. 39(a) is a longitudinal sectional view illustrating a state of the organic EL layer formation, in which a droplet having a small size is landed so that the droplet does not flow out over the barrier.
FIG. 39(b) is a longitudinal sectional view illustrating a state in which the droplet is landed on a layer of a previous-droplet substance being cured.
Figure 39:
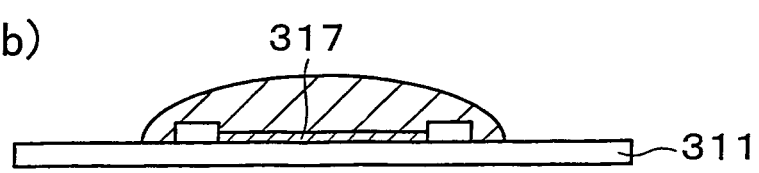

First, in a first process illustrated in FIG. 35(a), the droplets 12 of the red ink in which the R pigments are dispersed are ejected by the inkjet apparatus 15, thus forming the R color filter pixels 271. R is the first color in three colors R, G and B.

In this case, because the droplets 12 dries soon after they land, the area of the surface on which the droplets land do not increase. Therefore, it is unnecessary to form (i) the dividing walls for dividing a region for forming the pixels and (ii) water-attracting/water-repellent regions.

In the case in which the volumetric concentration is η (%), the volume V of the materials for color filters contained in one droplet is expressed by the following equation.

$$V=(4/3)\times\pi\times(D/2)^3\times(\eta/100)$$

The droplet has a diameter D μm, and the diameter of the droplet increases to κ times when the droplet lands.

When the thickness of the color filter formed by one droplet is 1/α of the desired thickness t of the color filter layer, that is, when the number of laminations by ejecting the droplets repeatedly is α, the following equation holds.

$$V/(\pi\times((D/2)\times\kappa)^2)=t/\alpha$$

This equation can be organized as follows.

$$\eta=\beta\times t/(\alpha\times D)$$

Moreover, β=150×κ2. Assuming that the diameter of the droplet increases to 1.5 times when the droplet lands, κ=1.5. Therefore, the above equation becomes as follows.

$$\eta=340\times t/(\alpha\times D)$$

In the case in which the desired thickness of the color filter layer 262 is 1 μm and the diameter of the droplet 12 is substantially 8 μm, the concentration of the ink is determined in the following way.

In order to reduce time for forming the pixels, the number of ejections repeatedly is reduced. The number of laminations is determined according to (i) the area of the surface on which the droplets land, (ii) an area of one pixel, (iii) drive frequency of a head (inkjet apparatus 15) and (iv) the number of nozzles of the head.

In the case in which the number of repeating ejections of the droplets 12 is 100 or less (α≥100), the required volumetric concentration η of the ink is expressed by the following equation.

$$\eta=3.4\times t/D=0.4\%$$

In the case in which the number of repeating ejections is further reduced, that is, the number of repeating ejections is 10 or less (α≤10), the required volumetric concentration η of the ink is expressed by the following equation.

$$\eta = 34 \times t/D = 4\%$$

Moreover, it is preferable that the surface of the color filter layer 262 be as flat as possible. On this account, it is preferable that materials for color filters be stacked a plurality of times while changing respective positions where the droplets land. In the present embodiment, the number of repeating ejections is 2 or more (α≥2). In this case, a center of an upper-landing position of the droplet 12 is targeted in a middle of centers of adjacent landing positions on a lower-side. Therefore, the surface of the color filter layer 262 becomes adequately flat. The required volumetric concentration η of the ink in this case is expressed by the following equation.

$$\eta = 170 \times t/D = 20\%$$

Table 6 shows results obtained by examining influences given according to the number of laminations (α) of the landed droplets 12, with respect to (i) the concentration of the ink, (ii) the viscosity of the ink, (iii) production efficiency of the color filter layers 262 and (iv) surface smoothness of the color filter layers 262.

TABLE 9

Influences given according to the number of laminations

| | Concentration | Viscosity | Production Efficiency | Surface Smoothness |
|---|---|---|---|---|
| α = 1 | 2% | High | ◎ | Δ |
| α = 2 | 20% | High | ◎ | ○ |
| α = 10 | 4% | Middle | ○ | ◎ |
| α = 100 | 0.4% | Low | ○ | ◎ |
| α = 1,000 | 0.04% | Low | Δ | ◎ |

As is clear from the results shown in Table 9, in light of the production efficiency and the surface smoothness, it is preferable that the number of laminations be from 2 to several hundreds, and the volumetric concentration of the ink be determined accordingly. Here, because the production efficiency is emphasized, α is 2. In this case, the volumetric concentration is 1% and the viscosity of the ink is high. It is difficult for the conventional inkjet apparatus to eject such ink, but the present inkjet apparatus 15 can easily eject the ink.

According to the above results, in the case in which the volumetric concentration is 1%, the surface of the color filter layer 262 is adequately smooth and the number of ejections repeatedly is minimum. This volumetric concentration is higher than that of ink for forming color filter layers which ink is used in the conventional inkjet apparatus. In addition, the size of the droplet is small. By using the inkjet apparatus 15, it is possible to eject high viscosity ink, and the flight speed of the droplet 12 is increased by the electric field. Therefore, the droplet 12 dries soon after it lands.

In the case of forming the R color filter pixels 271 in the first process illustrated in FIG. 35(a), the droplets 12 are ejected as the head of the inkjet apparatus 15 having the nozzle 1 or the record-subjected-side substrate 14 (substrate 261) is moved in a feed direction. In this case, a first droplet is ejected, and the following droplet is ejected so as to partially overlap with the first droplet. In this way, the R color filter pixel 271 of the desired thickness can be obtained.

Similarly, in a second process illustrated in FIG. 35(b), the droplets 12 of the green ink in which the G pigments are dispersed are ejected by the inkjet apparatus 15, thus forming the G color filter pixels 272 of the desired thickness. G is the second color in three colors R, G and B.

Similarly, in a third process illustrated in FIG. 35(c), the droplets 12 of the blue ink in which the B pigments are dispersed are ejected by the inkjet apparatus 15, thus forming the B color filter pixels 273 of the desired thickness. B is the third color in three colors R, G and B. The order of forming the R color filter pixels 271, the G color filter pixels 272 and the B color filter pixels 273 is not limited to the above, but can be changed according to need.

In the case in which the red, green and blue color filter layers 262 are different with each other in materials, kinds of solvents and size, optimal volumetric concentrations of those are also different from each other. As the volumetric concentration of the materials for color filter layers increases, the number of repeating ejections decreases and the production efficiency improves, but the viscosity of the ink increases. The inkjet apparatus 15 can eject the ink of higher viscosity than that of the ink used in the present embodiment. Therefore, the volumetric concentration of the ink can be further increased.

After the above processes, the baking is carried out with respect to the substrate 261 on which a three-color pixel pattern of the R color filter pixels 271, the G color filter pixels 272 and the B color filter pixels 273 is formed. Then, on the substrate 261, a transparent protective film (not illustrated) is applied and baked. As a result, the color filter substrate 252 is obtained.

Meanwhile, in the TFT substrate 251 which is bonded with the color filter substrate 252, the source bus line 275 and the gate bus line 276 are overlapped with each other via the interlayer insulating film 258. With this arrangement, the source bus line 275 and the gate bus line 276 act as the BM by which light is excluded from areas where the pixels are not provided in the TFT substrate 251. Therefore, it is unnecessary to provide the BM in the color filter substrate 252, so that a process of forming the BM is naturally omitted. On this account, it is possible to manufacture the color filter substrate 252 inexpensively.

Note that, the inkjet apparatus 15 ejects a plurality of ink droplets with respect to one pixel of the color filter layer 262. Therefore, one nozzle need not correspond to one pixel, but a plurality of nozzles may be used with respect to one pixel. Moreover, when filling the ink in one pixel of the color filter substrate 262, the ink need not be ejected continuously, but may be ejected several times.

Moreover, in the case of forming the color filter layer 262, all the droplets need not be fast-drying minute droplets. In this case, the color filter layer 262 may be so formed that a rough shape of the color filter layer 262 is formed with a first large droplet, and the minute droplets are then ejected by the inkjet apparatus (submicron head) 15 for finely adjusting the thickness of the color filter layer 262 and fixing the unevenness.

In the foregoing embodiment, the inkjet method (inkjet apparatus 15) is used for forming all the three color filter layers 262. However, the spin coating, the offset printing method or the electrodeposition method may be used for forming any one or two colors of the three color filter layers 262.

Moreover, in the foregoing embodiment, the first color is R, and the second color is B. However, the order of colors may be changed. For example, the first color is B, and the second color is R, etc.

Moreover, the foregoing embodiment explained the case of manufacturing the color filter substrate 252 having the stripe layout of the pixels. However, the color filter substrate may have the delta layout of pixels as illustrated in FIG. 33, or other kinds of TFT substrates may be used.

Moreover, according to the inkjet method using the inkjet apparatus (submicron head) 15 of the present embodiment, droplets dries soon after they land. Therefore, the droplets are not mixed between the pixels. On this account, it is unnecessary to provide (i) boundaries between the pixels in the conventional inkjet method or (ii) the BM as walls for preventing flowing the droplets out of the pixels. In addition, because light is excluded by the metals of the wirings from the areas where the pixels are not provided, it is not especially necessary to provide the BM in the color filter substrate 252. Therefore, manufacturing costs of the color filter substrate 252 becomes inexpensive. Note that, in the foregoing embodiment, the BM is not provided, but the BM may be provided if the cost permits.

Unlike the conventional inkjet apparatuses, the present inkjet apparatus 15 can eject high viscosity droplets. Therefore, it is possible to increase the concentration of the materials for color filters, and also possible to decrease the size of the droplets. On this account, unlike the conventional technologies, it is possible to obtain an effect in which the droplets dries soon after they land. With this effect, it is possible to (i) decrease the number of ejections repeatedly, (ii) decrease time of an interval between one droplet and its next droplet when ejecting the droplets and (iii) improve workability.

Further, by using the present inkjet apparatus 15, it is possible to reduce the voltage between the nozzle 1 and the printing medium (counter electrode 13). On this account, it is possible to remove the risk of breaking the TFTs 264, etc.

Moreover, even in the case in which the diameter of the droplet is reduced by using the conventional inkjet apparatus which is not the electrostatic attraction type, it is impossible to increase the volumetric concentration of the ink and obtain the flying speed adequately. As a result, it is not possible to improve the workability of the repeated ejections by instantaneously drying the droplet after the landing.

Note that, results obtained by further considering the arrangement of the inkjet apparatus 15 capable of forming the color filter layers 262 of the color filter substrate 252 are explained above in reference to FIGS. 14 to 21.

As above, in the method of manufacturing the liquid crystal array of the present invention, the inkjet method is used for obtaining the spacer of the desired thickness, without decreasing the aperture ratio. On this account, in the method of manufacturing the liquid crystal array, (i) the aperture section(s) are formed on at least one of a pair of substrates provided opposite to each other, (ii) the spacers are provided between those substrates for giving a gap for filling the liquid crystal, (iii) the droplets of the spacer materials are ejected from the ejecting hole 1b of the nozzle 1 by using the inkjet method and (iv) those droplets are cured, so that the spacers are formed. According to the electrostatic attraction inkjet apparatus 15, the diameter of the ejecting hole 1b of the nozzle 1 is shorter than the diameter of the droplet 12, and the amount of one droplet ejected from the nozzle 1 is 1 pl or less.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

An active matrix organic EL display element produced by a method of the present invention for producing an active matrix organic EL display element is applicable as display apparatuses such as color televisions, personal computers, and the like. Moreover, a liquid crystal array produced by a method of the present invention for producing a liquid crystal array is applicable in display apparatuses such as liquid crystal televisions, personal computers, and the like. Further, a color filter substrate produced by a method of the present invention for producing a color filter substrate is applicable in color liquid crystal display apparatus to be used as color liquid crystal display apparatuses such as color televisions, personal computers, and the like.

The invention claimed is:

1. A method for forming a display element including pixels each having boundaries defining a pixel area disposed in a matrix array, said method comprising the steps of:
    (a) preparing a substrate;
    (b) forming a first electrode having an upper surface on the substrate;
    (c) forming a first structure on the upper surface of the first electrode between adjacent pixels consisting only of a barrier having a predetermined height, the barrier being configured of a single layer forming a wall-like element that provides an area of clear contrast between said pixel areas; and
    (d) forming second structures on the upper surface of the first electrode within the boundaries of said pixel areas, each said second structure consisting of light emitting layers formed by ejecting droplets of light emitting material from a nozzle of an inkjet apparatus only onto one of said pixel areas, the droplets having a viscosity of 20 cPs or more and being 1 pl or less in amount, the nozzle having a nozzle diameter from $\Phi 0.2$ μm to $\Phi 4$ μm, and the light emitting layers being formed while an electric field is generated between an electrode of the nozzle and a counter electrode positioned so as to face the electrode of the nozzle;
    wherein in step (c), the first structure is formed such that the predetermined height of said barrier is less than a height of any of said second structures relative to said first electrode,
    wherein in step (d), the droplets ejected from the inkjet apparatus are ejected plural times while shifting landing positions of the droplets in the respective pixel areas such that in each pixel area the droplets forming the second structure overlap one another so as to form multiple layers and thereby attain light emitting layers having upper surfaces as flat as possible, and
    wherein in step (d) the first structure is the only structure between the adjacent pixels.

2. The method for forming a display element as set forth in claim 1, wherein
    the nozzle has a droplet ejection opening on its end, the opening having a diameter smaller than a diameter of each of the droplets immediately after being ejected, so that a region in which the electric charge is concentrated is substantially equal to a region of a meniscus.

3. The method for forming a display element as set forth in claim 1, wherein:
    the droplets ejected from the inkjet apparatus are targeted in such a manner that a center of a landing position of each of the droplets landed as an upper layer is positioned in a middle of centers of two adjacent landing positions of the droplets landed as a lower layer.

4. The method for forming a display element as set forth in claim 1, wherein
    the barrier functions as a black matrix of the display element.

* * * * *